United States Patent [19]

Furutani et al.

[11] Patent Number: 5,305,261

[45] Date of Patent: Apr. 19, 1994

[54] SEMICONDUCTOR MEMORY DEVICE AND METHOD OF TESTING THE SAME

[75] Inventors: Kiyohiro Furutani; Michihiro Yamada; Shigeru Mori, all of Hyogo, Japan

[73] Assignee: Mitsubishi Denki Kabushiki Kaisha, Tokyo, Japan

[21] Appl. No.: 873,431

[22] Filed: Apr. 23, 1992

[30] Foreign Application Priority Data

Sep. 2, 1991 [JP] Japan .................................. 3-221863

[51] Int. Cl.$^5$ .............................................. G11C 7/00
[52] U.S. Cl. ............................... 365/189.01; 365/200; 365/207
[58] Field of Search ................... 365/189.01, 200, 201, 365/196, 203, 207

[56] References Cited

U.S. PATENT DOCUMENTS 4,972,372  11/1990  Ueno ..................................... 365/201
5,088,063   2/1992  Matsuda et al. ................ 365/189.01
5,184,326   2/1993  Hoffmann et al. .................... 365/201

FOREIGN PATENT DOCUMENTS

4011935A1 10/1990 Fed. Rep. of Germany .

OTHER PUBLICATIONS

Feb. 1989 IEEE Solid-State Circuits Conference, Technical Paper Seiten 244,245.
"A 1.5V Circuit Technology for 64Mb DRAMs", by Y. Nakagome et al, 1990 Symposium on VLSI Circuits, pp. 17-18.
"A 45ns 64Mb DRAM with a Merged Match-line Test Architecture", by Shigeru Mori et al, 1991 IEEE International Solid-State Circuits Conference, pp. 110-111.

Primary Examiner—Eugene R. LaRoche
Assistant Examiner—Tan Nguyen
Attorney, Agent, or Firm—Lowe, Price, LeBlanc & Becker

[57] ABSTRACT

A sense-input/output gate includes MOS transistors which are provided for each bit line pair and have their gates and drains cross-coupled together, separating transistors arranged between the gates and the drains of the MOS transistors, and column selecting gates connecting the drains of the MOS transistors to internal data transmitting lines. The semiconductor memory device further includes a load circuit which precharges the internal data transmitting lines to a predetermined potential in a test mode, and a line test circuit which determines existence and nonexistence of a defective memory cell based on the potentials of the internal data transmitting lines. In the data reading operation, the column selecting gates become conductive while the separating transistors are in OFF state, and the potential of the internal data transmitting line changes by virtue of the discharge through one of the cross-coupled MOS transistors. In this construction, the sense amplifier is used also as the read gate. Therefore, high-speed reading of data is allowed, and tests for many memory cells in up to one row can be simultaneously performed. Accordingly, a test time is reduced in a highly integrated semiconductor memory device.

33 Claims, 33 Drawing Sheets

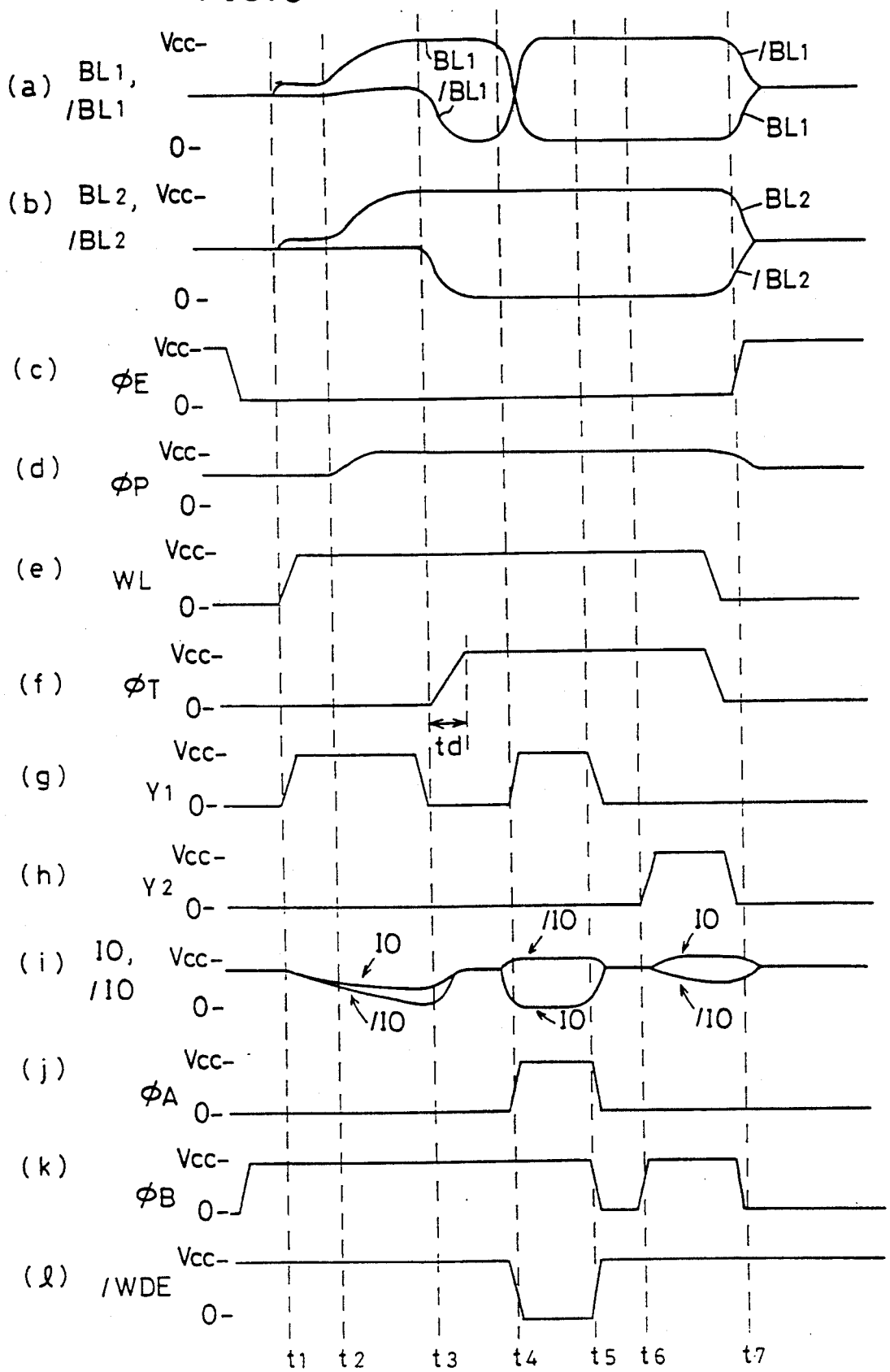

SEMICONDUCTOR MEMORY DEVICE AND METHOD OF TESTING THE SAME

BACKGROUND OF THE INVENTION

1. Field of the Invention

The present invention relates to a semiconductor memory device, and particularly to a construction for increasing an operation speed and a degree of integration and facilitating test thereof.

2. Description of the Prior Art

FIG. 28 is a block diagram schematically showing a whole construction of a conventional semiconductor memory device. The construction of the semiconductor memory device shown in FIG. 8 is disclosed, for example, in a paper entitled "1.5V Circuit Technique for 64Mb DRAM", by Nakagome et al, 1990 Symposium on VLSI Circuits, pp. 17 and 18.

Referring to FIG. 28, the conventional semiconductor memory device includes a memory cell array 196 including memory cells arranged in a matrix of rows and columns, a row decoder 199 for selecting a corresponding row in the memory cell array 196 in accordance with an internal row address signal, and a column decoder 192 which generates a column selecting signal for selecting a corresponding column in memory cell array 196 in response to an internal column address signal. Memory cell array 196 includes dynamic memory cells arranged in a matrix of, e.g., 256 rows and 256 columns.

Conventional semiconductor memory device further includes an input/output gate 193 which is responsive to a column selecting signal supplied from the column decoder 192 to connect a corresponding column in memory cell array 196 to internal data transmitting lines IO and /IO, a sense amplifier circuit 194 which detects and amplifies data of memory cells in one row selected by row decoder 199, a precharging circuit 195 for precharging respective columns in memory cell array 196 to a predetermined potential (e.g., a half of the sum of a supply potential Vcc and a ground potential Vss) in a standby state of the semiconductor memory device, an IO (input/output) line precharging circuit 197 for precharging internal data transmitting line pair IO and /IO to a predetermined potential (e.g., "H" level) in a standby state, and an input/output circuit 198 connected to internal data transmitting lines IO and /IO.

Input/output circuit 198 produces internal write data in accordance with an external write data Din and transmits it to internal data transmitting lines IO and /IO in a data writing operation. In a data reading operation, input/output circuit 198 produces an external read data Dout in accordance with internal read data (transmitted from a selected memory cell) on internal data transmitting lines IO and /IO.

In the construction of the semiconductor memory device shown in FIG. 28, a memory cell, which is located at an intersection of the row and column designated by row decoder 199 and column decoder 192, is selected, and the data is written in or read from the selected memory cell.

FIG. 29 shows a construction of a main portion of the semiconductor memory device shown in FIG. 28. In FIG. 29, there is representatively shown a circuit portion related to one column in memory cell array 196. Referring to FIG. 29, memory cell array 196 includes a pair of bit lines BL and /BL providing a column line, and word lines WL1 to WL256 providing row lines each of which is connected to the memory cells in one row. Each memory cell is located at the intersection of each word line and each bit line pair. Specifically, memory cell MC1,1 is located at the intersection of word line WL1 and bit line BL, memory cell MC1,2 is located at the intersection of word line WL2 and complementary bit line /BL, and memory cell MC1,256 is located at the intersection of the word line WL256 and complementary bit line /BL.

Memory cells MC the (reference character "MC" will be used for generically indicating memory cells hereinafter) include dynamic memory cells each of a one-transistor/one-capacitor type. In the dynamic memory cells of the one-transistor/one-capacitor type, capacitors (210, 211 and 212) store information in the form of electrical charges. The information stored in a capacitor is transmitted to a corresponding bit line (BL or /BL) via a transmission gate (207, 208 or 209) in response to a signal WL, which generically indicates a word line selecting signal on the corresponding word line.

Precharging circuit 195 includes precharging transistors 204 and 205 which are responsive to a precharge instructing signal $\phi E$ to precharge respective bit lines /BL and BL to a predetermined precharge potential VH, and an equalizing transistor 206 which is responsive to precharge instructing signal $\phi E$ to equalize the potentials of bit lines BL and /BL. Precharging transistors 204 and 205 each are formed of n-channel MOS transistors. Transistor 204 is responsive to precharge instructing signal $\phi E$ to transmit a precharge potential VH (normally, Vcc/2; Vcc is an operating supply voltage) to complementary bit line /BL. Transistor 205 is responsive to precharge instructing signal $\phi E$ to transmit precharge potential VH to bit line BL. Equalizing transistor 206 is responsive to precharge instructing signal $\phi E$ to short-circuit the bit line BL and the complementary bit line /BL.

Sense amplifier circuit 194 includes an N-type sense amplifier NSA which is responsive to an N-type sense amplifier drive signal $\phi N$ to discharge the potential of the bit line at a lower potential in bit line pair BL and /BL, and a P-type sense amplifier PSA which is responsive to a P-type sense amplifier drive signal $\phi P$ to charge the potential of the bit line at a higher potential in bit line pair BL and /BL. N-type sense amplifier NSA includes a pair of cross-coupled n-channel MOS transistors 202 and 203. This n-channel MOS transistor 202 has a gate connected to bit line BL, one conduction terminal (drain) connected to complementary bit line /BL and the other conduction terminal (source) for receiving N-type sense amplifier drive signal $\phi N$. The n-channel MOS transistor 203 has a gate connected to complementary bit line /BL, one conduction terminal (drain) connected to bit line BL, and the other conduction terminal (source) coupled to receive the N-type sense amplifier drive signal $\phi N$.

P-type sense amplifier PSA includes a pair of cross-coupled p-channel MOS transistors 213 and 214. This p-channel MOS transistor 213 has a gate connected to bit line BL, one conduction terminal (drain) connected to complementary bit line /BL, and the other conduction terminal coupled to receive the P-type sense amplifier drive signal $\phi P$. The p-channel MOS transistor 214 has a gate connected to complementary bit line /BL, one conduction terminal (drain) connected to bit line BL, and the other conduction terminal coupled to receive the P-type sense amplifier drive signal $\phi P$.

Input/output gate 193 includes column selecting gates 201 and 200 which are responsive to a column selecting signal Y1 supplied from the column decoder (see FIG. 27) to connect bit lines BL and /BL to internal data transmitting lines IO and /IO, respectively. Column selecting gates 200 and 201 are formed of n-channel MOS transistors, respectively. Now, operations will be described with reference to an operation timing diagram of FIG. 30.

First, description will be made of a data reading operation in such a case that a selected memory cell MC1, 1 holds the data of "H".

At time t0, a memory cycle starts when precharge instructing signal $\phi E$ falls to "L". In response to the fall of precharge instructing signal $\phi E$, equalizing circuit 195 is inactivated, and bit lines BL and /BL enters a floating state at precharge potential VH.

At time t1, row decoder 199 decodes a received internal row address, and the potential of the corresponding word line WL1 rises to "H". Responsively, transmission gate 208 of memory cell MC1, 1 becomes conductive, so that data of "H" held in the memory capacitor 211 is transmitted to bit line BL. This increases the potential of bit line BL. Since the memory cell does not exist at the intersection of complementary bit line /BL and word line WL1, the potential of complementary bit line /BL remains at precharge potential VH.

At time t2, N-type sense amplifier drive signal $\phi N$ lowers from an intermediate potential Vcc/2 to "L", and P-type sense amplifier drive signal $\phi P$ rises from intermediate potential Vcc/2 to "H". Thereby, N-type sense amplifier NSA and P-type sense amplifier PSA are activated, and a potential difference between bit line BL and complementary bit line /BL is differentially amplified. Specifically, the potential of bit line BL changes to "H", and the potential of complementary bit line /BL changes to "L".

At time t3, column decoder 192 generates a column selecting signal Y1 in accordance with a result of decoding of an internal column address, and thus column selecting gates 200 and 201 become conductive. Potentials on bit line BL and complementary bit line /BL are transmitted to internal data transmitting lines IO and /IO. Thereby, the potentials of internal data transmitting lines IO and /IO which have been precharged to a predetermined potentials changed corresponding to those of bit lines BL and /BL. Specifically, the potential of internal data transmitting line IO rises to "H", and the potential of complementary internal data transmitting line /IO slightly lowers.

In the above operation, the potential of complementary internal data transmitting line /IO does not lower to the level of "L", because IO line precharging circuit 197 has pull-up means and the gate transistors 200 and 201 has a relatively large resistance, which suppresses the lowering of the potential. The reason of slight change of the potentials of bit lines BL and /BL at time t3 is that bit lines BL and /BL are connected to internal data transmitting lines IO and /IO precharged to the predetermined precharge potential, and receive the influence of the potential change thereof.

The data read to internal data transmitting lines IO and /IO is detected by an output circuit contained in input/output circuit 198 shown in FIG. 28. This output circuit detects that internal data transmitting line IO has the potential higher than that of internal data transmitting line /IO, and produces external output data Dout of "H".

Then, description will be made of an operation for writing the data of "L" in memory cell MC1,1.

The operation before time t4 is similar to that for reading a data. At time t4, input/output circuit 198 responds to write data Din of "L" to set the potential of internal data transmitting line IO at "L" and set the potential of complementary internal data transmitting line /IO at "H". The data on internal data transmitting lines IO and /IO are transmitted through column selecting gates 201 and 200 to bit lines BL and /BL. Input/output circuit 138 includes an input circuit of which driving ability is larger than latching abilities of sense amplifiers PSA and NSA, and thus bit lines BL and /BL have potentials corresponding to the write data. The data of "L" on bit line BL is transmitted through transmission gate 208 in memory cell MC1,1 to memory cell capacitor 211. Thereby, writing of the data of "L" in memory cell MC1,1 is completed.

At time t5, precharge instructing signal $\phi E$ is changed to "H". Precharging circuit 195 is activated, and the potentials of bit lines BL and /BL are set at predetermined precharge potential VH for the next memory cycle. Before precharge instructing signal $\phi E$ rises to "H" at time t5, word line selecting signal WL1 on word line WL1 and column selecting signal Y1 have already lowered to "L" and also sense amplifier drive signals $\phi N$ and $\phi P$ have returned to the intermediate potential.

In the semiconductor memory device shown in FIGS. 28 and 29, timing for generating a column selecting signal Y must be as early as possible in order to reduce a time required for reading the data. It is inhibited to generate column selecting signal Y1 before time t2 at which sense amplifiers NSA and PSA are activated, because a slight potential difference generated between bit lines BL and /BL is further reduced due to the connection by the signal Y1 to internal data transmitting lines IO and /IO, and thus sense amplifiers PSA and NSA cannot perform an accurate amplifying operation.

A similar problem is caused in a case that the time t3 at which column selecting signal Y1 is generated is set closer to the time t2 immediately after the generation of sense amplifier drive signals $\phi N$ and $\phi P$. Specifically, if bit lines BL and /BL are connected to internal data transmitting lines IO and /IO before sense amplifiers NSA and PSA sufficiently amplify the potentials of bit lines BL and /BL, the potential difference to be amplified by sense amplifiers NSA and PSA is reduced. Therefore, the sense amplifiers malfunction, and thus cannot accurately amplify the data, resulting in incorrect reading of the data.

Therefore, in the semiconductor memory device shown in FIGS. 28 and 29, it is necessary to generate column selecting signal Y1 in such a state that sense amplifiers NSA and PSA have been activated and the potentials on bit lines BL and /BL have been settled. Therefore, it is impossible to sufficiently reduce an access time in the data reading operation.

In addition, the configuration shown in FIG. 32 does not allow a line test mode operation in which memory cells on a row are simultaneously tested because of the following reason.

In order to carry out the line test mode operation, data of all the memory cells on a row have to be read out simultaneously. If all the bit lines are connected to the internal data transmission lines IO and /IO in order to accomplish the simultaneous reading of data, all the bit lines are interconnected with each other, and a defective memory cell can not be detected because an erroneous data are turned into a correct data by such interconnection. In order to carry out the line test mode operation, a register for storing a test data and a comparator for comparing the test data and a data read out from an associated selected memory cell are required for each respective pair of bit lines. In operation, the output of all the comparators are transferred to a dedicated test data line to be wired-ANDed. Such construction increases the memory cell array area. If a memory device is not provided with the line test mode of operation, memory cells are tested bit by bit, resulting in a long testing time.

FIG. 31 shows another construction of a conventional semiconductor memory device. The semiconductor memory device shown in FIG. 31 is also disclosed, for example, in the previously mentioned paper of 1990 Symposium on VLSI Circuits by Nakagome et al.

Referring to FIG. 31, the semiconductor memory device includes a memory cell array 318 including memory cells arranged in a matrix, a row decoder 319 for selecting a row in memory cell array 318, a column decoder 313 for selecting a column in memory cell array 318, a precharging circuit 317 for precharging each column line in memory cell array 318 to a predetermined potential, and a sense amplifier circuit 316 for detecting and amplifying data of the memory cells in memory cell array 318 selected by row decoder 319, as in the memory device shown in FIG. 28.

The semiconductor memory device shown in FIG. 31 further includes a read gate 315 which transmits a data of a memory cell in the memory cell array 318 selected by the row decoder 319 and column decoder 313 in a data reading operation onto read data transmitting lines O and /O, and a write gate 314 for transmitting a write data to a selected memory cell in memory cell array 318 in the data writing operation. Write gate 314 and read gate 315 are responsive to a column selecting signal from column decoder 313 to connect a corresponding column in memory cell array 318 to internal data transmitting lines I and /I, and O and /O.

For the internal read data transmitting lines O and /O, there are provided an output line precharging circuit 322 for precharging internal read data transmitting lines O and /O to a predetermined potential, and an output circuit 321 for producing an external read data Dout from an internal read data on the internal read data transmitting lines O and /O. For the internal write data transmitting lines I and /I, there is provided an input circuit 320 for transmitting an internal write data to the internal write data transmitting lines I and /I in response to an external write data Din.

The semiconductor memory device shown in FIG. 31 has separated IO structure, in which internal data transmitting lines are separated into the read data transmitting lines O and /O for transmitting read data and the write data transmitting lines I and /I for transmitting write data, and a data reading is carried out before the activation of sense amplifier circuit 316 for reducing an access time in the data reading operation.

FIG. 32 shows a circuit portion related to one column in the semiconductor memory device shown in FIG. 31. Referring to FIG. 32, sense amplifier circuit 316, precharging circuit 317 and memory cell array 318 have the same constructions as sense amplifier circuit 194, precharging circuit 195 and memory cell array 196 shown in FIG. 29, respectively. Only differences therebetween are reference numerals allotted to the respective components and elements, and the constructions of these circuits is not be described in detail.

Read gate 315 includes discharging transistors 224 and 225 which are responsive to the potentials on bit lines /BL1 and BL1 to discharge the potentials of read data transmitting lines O and /O, respectively, and read column selecting gates 222 and 223 which are responsive to a column selecting signal Y1 from column decoder 313 to connect the discharging transistors 224 and 225 to the read data transmitting lines /O and O, respectively. Discharge transistors 224 and 225 include n-channel MOS transistors having gates connected to bit lines /BL1 and BL1, respectively. Each of discharging transistors 224 and 225 has two conduction terminals, one (source) of which is connected to the ground potential.

Read column selecting gates 222 and 223 have gates which receive column selecting signal Y1 for connecting the other conduction terminals (drains) of discharging transistors 224 and 225 to read data transmitting lines /O and O, respectively.

Write gate 314 includes n-channel MOS transistors 220 and 221 which turn on and off in response to a write instructing signal W, and write column selecting gates 218 and 219 which are responsive to column selecting signal Y1 from column decoder 313 to connect the transistors 220 and 221 to the write data transmitting lines /I and I, respectively. Write column selecting gates 218 and 219 are responsive to column selecting signal Y1 to connect the one-conduction terminals of respective transistors 220 and 221 to the read data transmitting line /I and I.

Thus, write gate 314 connects a selected column to write data transmitting lines /I and I only in the data writing operation.

IO line precharging circuit 322 includes pull-up means and precharges the read data transmitting lines O and /O to a predetermined potential ("H" level). Precharging circuit 322 also includes a pull-up stage for pulling up both read data transmitting lines O and /O to "H". Precharging circuit 322 and discharging transistors 244 and 255 form a current-detection type sense circuit for detecting a current. Operations thereof will be described below with reference to an operating waveform diagram of FIG. 33.

In FIG. 33, the following is assumed. Memory cell MC1,1 is selected for writing and reading of data. Memory cell MC1,1 has held data of "H". In the data writing operation, data of "L" is written in memory cell MC1,1.

At time t0, precharge instructing signal φE lowers to "L", and a memory cycle starts. Bit lines BL1 and /BL1 are held in a floating state with precharge potential VH of the intermediate potential. Read data transmitting lines O and /O have been precharged to "H" level.

At time t1, the potential of word line WL1 rises to "H" based on the result of decoding of row decoder 319. Transmission gate 232 of memory cell MC1,1 becomes conductive, and the data of "H" held in memory cell capacitor 235 is transmitted to bit line BL1, so that the potential of bit line BL1 slightly increases. Complementary bit line /BL1 maintains the precharge potential VH.

As the selecting signal WL1 rises, column selecting signal Y1 rises to "H" substantially simultaneously or with a slight delay. A row address signal and a column address signal have been simultaneously applied to the semiconductor memory device in a non-multiplex manner. Row address signal and column address signal, however, may be applied in a time-division multiplexing manner. It is required only to generate column selecting signal Y1 before the activation of sense amplifier circuit 316.

In response to column selecting signal Y1, read column selecting gates 222 and 223 contained in read gate 315 become conductive.

Since the potential of bit line BL1 is higher than that of complementary bit line /BL1, the conductivity of transistor 225 is higher than that of transistor 224, so that the potential of read data transmitting line O is reduced to be lower than the potential of complementary read data transmitting line /O. In this operation, transistor 224 also reduces slightly the potential of complementary read data transmitting line /O.

Output circuit 321 detects the potential difference of read data transmitting lines O and /O to produce a corresponding external output data Dout. Specifically, the output circuit 321 supplies data Dout of "H" when it detects that the potential of internal data transmitting line O is lower than the potential of internal data transmitting line /O.

Then, at time t2, N-type sense amplifier drive signal φN and P-type sense amplifier drive signal φP are changed from the intermediate potential to "L" and "H", respectively, so that N-type sense amplifier NSA and P-type sense amplifier PSA are activated. Thereby, the potential difference between bit line BL and complementary bit line /BL is amplified. In the data reading operation, sense amplifiers NSA and PSA perform the amplifying operation on bit lines BL and /BL, whereby a restoring operation is conducted for restoring the read out data in the selected memory cell MC1,1. This operation completes data reading cycle.

Then, data writing operation will be described. Operations till the activation of sense amplifiers PSA and NSA are identical with those in the data reading process. Input circuit 320 sets the write signal W at "H" at time t3. Before time t3, input circuit 320 also sets the potentials of write data transmitting lines I and /I at levels corresponding to the write data. In this operation, write data transmitting line I is set at "L", and complementary internal write data transmitting line /I is set at "H". In FIG. 33, it is shown that input circuit 320 has set the potential of internal write data transmitting lines I and /I to the levels corresponding to the write data before time t2 at which sense amplifiers PSA and NSA are activated. The timing for generating internal write data by input circuit 320 may be between time t2 and time t3.

At time t3, upon generation of write signal W, transistors 220 and 221 become conductive. Column selecting signal Y1 has already risen to "H". In response to the write data, the potentials of bit lines BL and /BL change to "L" and "H", respectively. The change of signal potentials of bit lines BL and /BL is also transmitted through the read gates formed of transistors 222, 223, 224 and 225 to the read data transmitting lines O and /O, so that the potentials of read data transmitting lines O and /O also change.

The data of "L" on bit line BL is written in memory cell capacitor 235 through transmission gate transistor 232 in memory cell MC1,1.

Then, word line selecting signal WL1 and column selecting signal Y1 are set at an inactive state of "L", and, at time t4, precharge instructing signal φE is set at "H", whereby the data writing cycle is completed. The potentials of bit lines BL and /BL1 return to the intermediate potential VH, and a standby state is set for the next data writing or reading operation.

In the construction shown in FIGS. 31 and 32, the data reading is performed before the time at which sense amplifiers PSA and NSA are driven. In other words, when word line selecting signal WL1 rises to "H", column selecting signal Y1 is set at "H" prior to the activation of sense amplifiers PSA and NSA. Thereby, the data can be read to internal data transmitting lines O and /O before time t2 at the activation of the sense amplifier, so that the time required for reading a data out of a memory cell, i.e., the access time can be reduced.

As described above, in the construction of the semiconductor memory device shown in FIGS. 31 and 32, read data transmitting lines and write data transmitting lines are independently arranged, which enables the data reading at a high speed. In the construction of the semiconductor memory device shown in FIG. 29, the input/output gate are formed of only two transistors, i.e., transistors 200 and 201. In the semiconductor memory device of the separated IO type shown in FIGS. 31 and 32, however, the write gate requires four transistors, i.e., transistors 218, 219, 220 and 221, and the read gate requires four transistors, i.e., transistors 222, 223, 224 and 225. This semiconductor memory device of the separated IO type, therefore, requires totally eight transistors for the read gate and write gate, and thus requires additionally six transistors as compared with the semiconductor memory device in FIG. 29, which disadvantageously increases the chip area.

Further, after the manufacturing, the semiconductor memory devices are subjected to a test for determining whether or not each memory cell can perform a correct operation for storing data. A merged match line test and data line configuration is employed in the construction shown in FIGS. 31 and 32 in order to carry out the line test mode operation. The merged match line test and data line configuration is disclosed in, e.g., "45ns 64Mb DRAM with Merged Match Line Test And Data Line System" by Mori et al., 1991 IEEE, ISSCC, Digest of Technical Papers, pp. 110 and 111.

In this merged match line test and data line configuration, all the column selecting signals are raised to "H" in the test mode. Thereby, all the data of the memory cells connected to a selected one row is simultaneously read onto the read data transmitting lines O and /O. The data on read data transmitting lines 0 and /O is supplied to a test circuit in the test mode. The test circuit detects the potentials of read data transmitting lines O and /O to determine whether or not memory cells in this one row contains a defective memory cell(s). If it does not contain any defective memory cell, the same data has been written in all the memory cells, so that the potentials of read data transmitting lines O and /O change to "H" and "L", respectively. If it contains at least one defective memory cell, both the potentials of read data transmitting lines O and /O change to "L", and the existence of the defective memory cell can be detected.

This simultaneous testing of the memory cells in one row can reduce the test time. In this case, although the test time can be reduced, components in the read gates and the write gates increase in number, resulting in increase of the chip area.

SUMMARY OF THE INVENTION

It is an object of the invention to provide a semiconductor memory device, overcoming the above-noted disadvantages of the conventional semiconductor memory devices, in which an operation speed is increased and an occupied chip area is reduced.

It is another object of the invention to provide a semiconductor memory device, in which a test time can be reduced without increasing an occupied chip area.

It is still another object of the invention to provide a semiconductor memory device, which allows high-speed reading of data and also allows reduction of an occupied chip area and a test time.

A semiconductor memory device according to the invention provides a semiconductor memory device of a type of a common internal data input/output line (IO line), in which a read gate, a sense amplifier and a test gate are combinedly used for enabling reduction of a number of elements, reduction of an occupied chip area, a high-speed access and reduction of a test time.

Specifically, the semiconductor memory device according to a first aspect comprises an internal data transmitting line for transmitting both of internal write data and internal read data, a memory cell array including a plurality of memory cells arranged in a matrix, column selecting circuitry which is responsive to an applied address signal to generate a column selecting signal for selecting a corresponding column in the memory cell array, column connecting circuitry which is responsive to the column selecting signal for connecting the corresponding column line to the internal data transmitting line, and amplifying circuit which is provided for each column line to detect and amplify a potential on the corresponding column line.

The amplifying circuit includes a detection node for detecting the potential on the corresponding column line, and a latch node for amplifying and latching the detected potential. The column connecting circuitry connects the latch node on a selected column line to the internal data transmitting line.

The semiconductor memory device of the first aspect further includes separating means which is arranged between the latch node and the detection node of the amplifying circuit to separate the latch node and the detection node from each other, and control circuitry for controlling conduction/nonconduction of the separating circuit such that the latch node and the detection node are connected after the selection of a row and a column in the memory cell array.

The semiconductor memory device of a second aspect further includes column connecting means which is responsive to a test mode instructing signal to connect all the columns related to the internal data transmitting line of the memory cell array to the internal data transmitting line. The column connecting circuitry connects the latch node of the amplifying circuit to the internal data transmitting line.

The semiconductor memory device of the second aspect further includes precharging circuitry for precharging the internal data transmitting line to a predetermined potential corresponding to a test data, and determining circuitry which is responsive to the test mode instructing signal and the potential on the internal data transmitting line to determine whether or not the connected columns contain a defective memory cell.

In a testing method according to the present invention, internal data lines are precharged to the potential level corresponding to expected data to be read out in a read out gate and cross couple sense amplifier merged type semiconductor memory device, and then all the read out gates are activated to be connected to the internal data transmission lines while the cross couple type sense amplifiers are allowed to carry out sensing operation with the amplifying operation inhibited.

In the semiconductor memory device of the first aspect, the amplifying circuit can function as a read gate due to the separating circuit, which is arranged between the latch node and the detection node of the amplifying circuit. This achieves the construction of shared usage of the read gate and the sense amplifier in the semiconductor memory device having the separated IO construction in which data input lines (I lines) and data output lines (O lines) are separated. Consequently, the high-speed access is allowed without increasing the chip area.

In the semiconductor memory device of the second aspect and in the testing method of the invention, all the columns related to the internal data transmitting line are connected to the internal data transmitting line in the test mode. The latch node and detection node of the amplifying circuit are separated by separating circuit. The determining circuitry determines the change between the potentials of the internal data transmitting line before and after the connection of the columns, and thereby determines the existence and nonexistence of a defective memory cell. In this manner, the line test mode, in which the memory cells in a row can be simultaneously tested, can be achieved by the simple circuitry, and thus the test time can be reduced without increasing an occupied chip area.

The foregoing and other objects, features, aspects and advantages of the present invention will become more apparent from the following detailed description of the present invention when taken in conjunction with the accompanying drawings.

BRIEF DESCRIPTION OF THE DRAWINGS

FIG. 8 is a signal waveform diagram showing another operation manner of the semiconductor memory device shown in FIG. 1;

DESCRIPTION OF THE PREFERRED EMBODIMENTS

Figure 1:
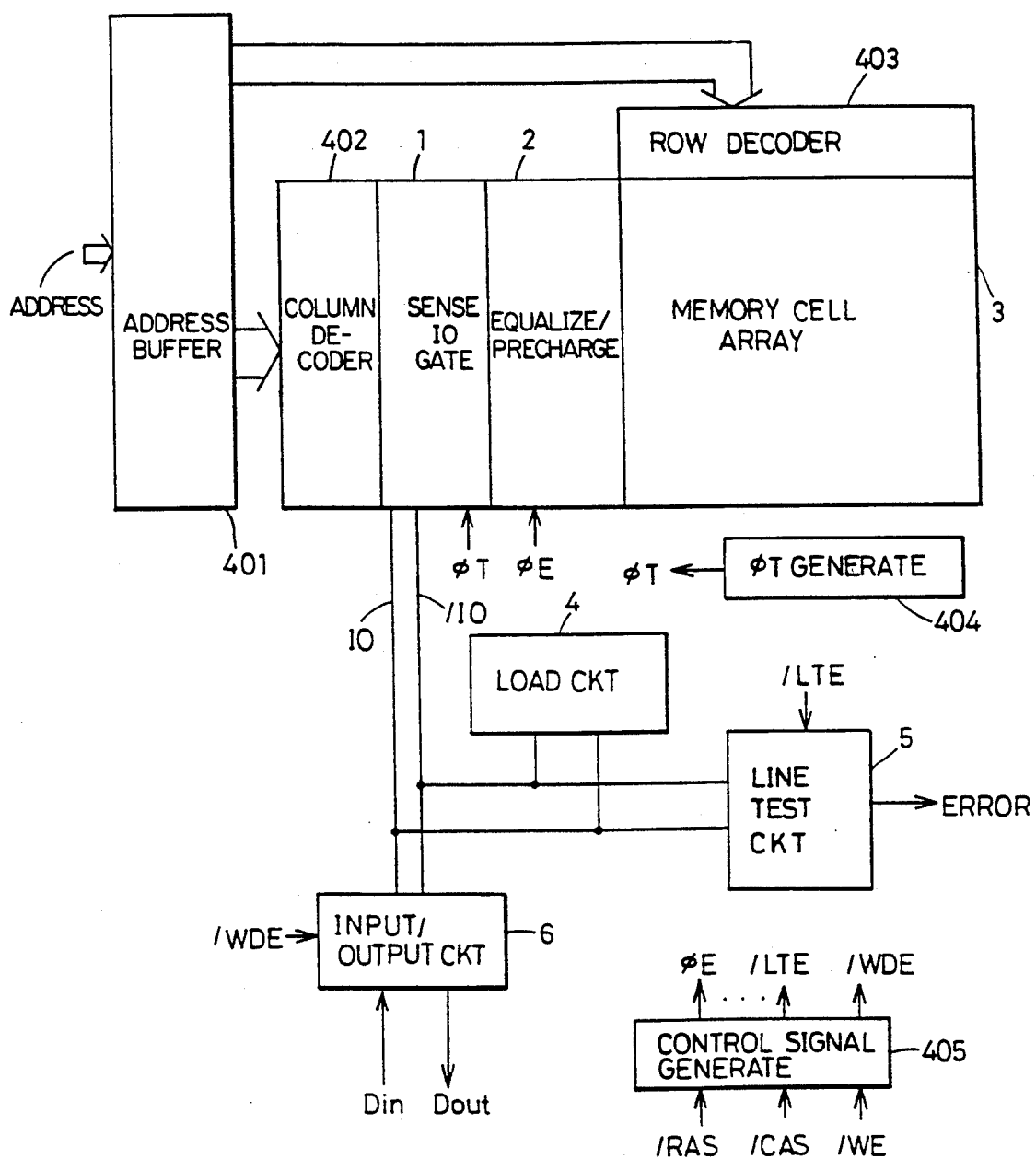
FIG. 1 is a block diagram schematically showing a whole construction of a semiconductor memory device according to an embodiment of the invention.

Referring to FIG. 1, a semiconductor memory device includes a memory cell array 3 which includes a plurality of memory cells arranged in a matrix of rows and columns, an equalizing/precharging (PE) circuit 2 for equalizing and precharging respective columns (bit line pairs) of the memory cell array 3 to a predetermined potential, a row decoder 403 which decodes an internal row address supplied from an address buffer 401 to select a corresponding row in memory cell array 3, and a column decoder 402 which decodes an internal column address supplied from the address buffer 401 to generate a column selecting signal for selecting a corresponding column in memory cell array 3. In the illustrated example, address buffer 401 simultaneously receives row and column addresses in a non-multiplexed manner, and an internal row address and an internal column address are generated substantially simultaneously. Another construction may be employed that row and column addresses are supplied to the address buffer 401 in a time-division multiplexing manner.

The semiconductor memory device further includes a sense·input/output gate 1 which is located between the equalizing/precharging circuit 2 and the column decoder 402. Sense·input/output gate 1 includes, in a commonly used form, sense amplifiers which detect and amplify signals of the respective columns (bit line pairs) of memory cell array 3, input/output gates for connecting a column selected by column decoder 402 to internal data transmitting lines IO and /IO, and testing gates which connect a plurality of columns (columns connected to one row, at the most) to internal data transmitting lines IO and /IO in a line test mode. The construction of sense·input/output gate 1 will be described in greater detail later.

The semiconductor memory device shown in FIG. 1 further includes a load circuit 4 for precharging internal data transmitting lines IO and /IO to a predetermined potential, a line test circuit 5 which detects the change of the precharge potentials on internal data transmitting lines IO and /IO to test the memory cells in one row at the most, and an input/output circuit 6 coupled to internal data transmitting lines IO and /IO.

Load circuit 4 includes a pull-up stage, and precharges the internal data transmitting lines IO and /IO to a predetermined high potential ("H" level). Line test circuit 5 is responsive to a test mode instructing signal /LTE to determine whether or not columns connected to internal data transmitting lines IO and /IO contain a defective memory cell(s) in accordance with the signal potentials on the internal data transmitting lines IO and /IO, and generate a signal ERROR indicating a result of the determination.

Input/output circuit 6 produces an external data Dout from the data read onto internal data transmitting lines IO and /IO in a data writing operation. In the data writing operation, it responds to a write instructing signal /WDE to produce an internal write data from an external write data Din. The internal write data thus produced is transmitted to internal data transmitting lines IO and /IO.

The semiconductor memory device further includes peripheral circuits, i.e., a control signal generating circuit 405 which generates various internal control signals in response to externally applied control signals, i.e., a row address strobe signal /RAS, a column address strobe signal /CAS and a write enable signal /WE, and a φT generating circuit 404 which generates a control signal φT for controlling an operation of sense-input-/output gate 1. As typical examples of internal control signals generated by control signal generating circuit 405, there are an equalizing signal φE for instructing the equalizing and precharging of the potentials of the respective columns in memory cell array 3, a test mode instructing signal /LTE instructing the line test mode, and the write instructing signal /WDE applied to input-/output circuit 6.

In the construction shown in FIG. 1, test mode instructing signal /LTE is generated at the timing determined by combination of states of external control signals /RAS and /CAS and /WE (for example, write enable, CAS before RAS; WCbR). Test mode instructing signal /LTE itself may be applied externally.

Further, in the construction shown in FIG. 1, input-/output circuit 6 is shown to receive and supply external write data Din and external read data Dout through different terminals. The terminal for receiving an external write data and the terminal for outputting an external read data may share a common terminal. In such a common pin configuration input/output circuit 6 further receives an internal control signal /ODE for controlling the output operation. The output enable control signal /ODE is generated by control signal generating circuit 405 in response to an externally applied output enable signal /OE. Although this construction may be employed, it is assumed that inputting and outputting of the data are performed through different pin terminals in the following description.

φT generating circuit 404 generates the control signal φT in response to control signal /RAS and a signal CATD detecting a point of time at which a column address changes. Then, specific constructions of the circuit blocks shown in FIG. 1 will be described below.

Figure 2:
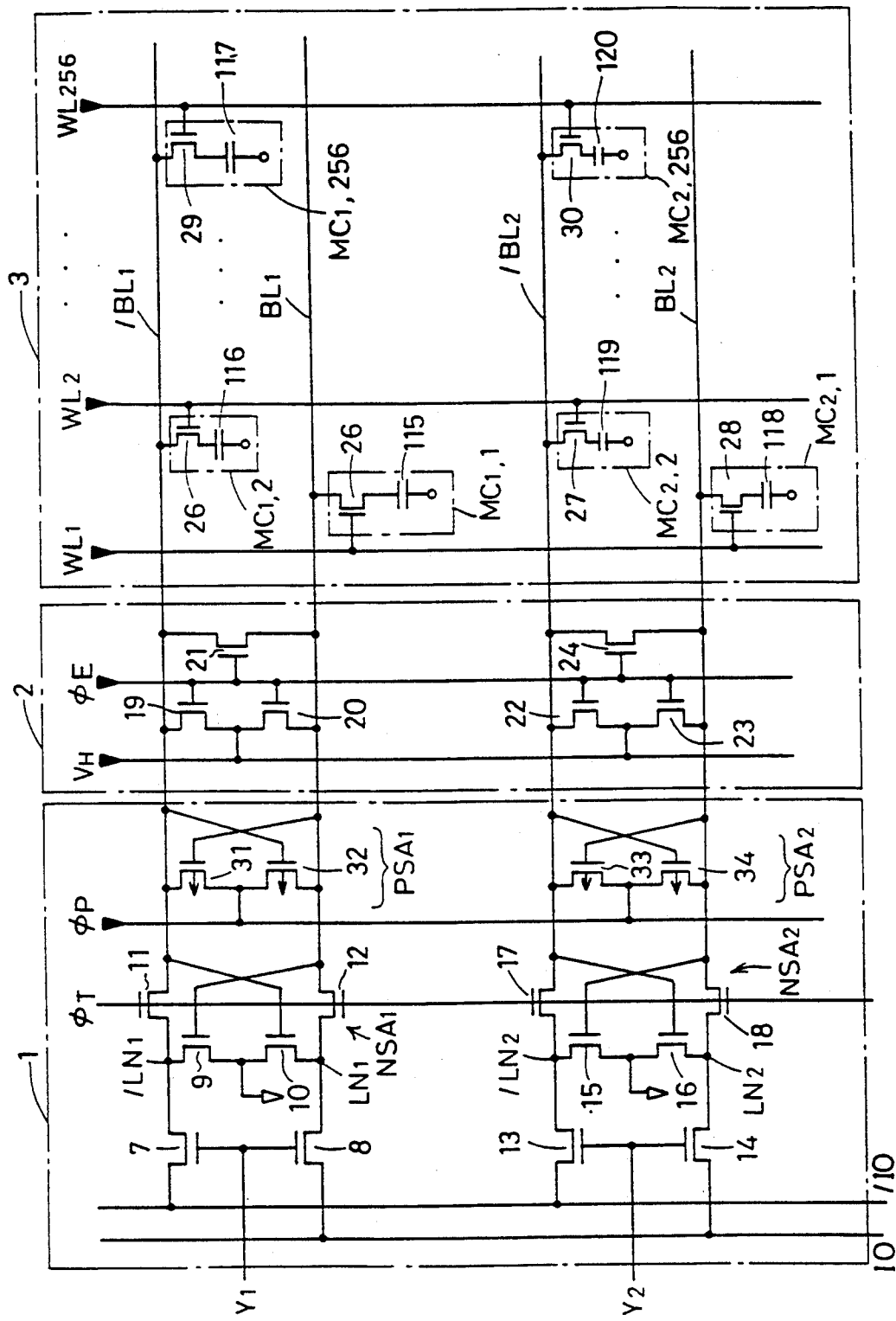
FIG. 2 shows an example of a construction of a memory cell array and a sense-input/output gate of the semiconductor memory device shown in FIG. 1.

FIG. 2 shows a specific construction of circuitry related to two columns in the memory cell array of the semiconductor memory device shown in FIG. 1. Memory cell array 3 includes memory cells arranged in the matrix of 256 rows and 256 columns.

Referring to FIG. 2, two column lines representatively shown therein include bit line pair BL1 and /BL1, and bit line pair BL2 and /BL2. Each of word lines WL1-WL256 is connected to memory cells in one row. Each memory cell is located at each of intersections of column lines and word lines. Specifically, memory cells MC1,1 and MC2,1 are located at the intersections of the word line WL1 and bit the lines BL1 and BL2. Memory cells MC1,2, and MC2,2 are located at the intersections of the word line WL2 and the complementary bit lines /BL1 and /BL2. Memory cells MC1,256 and MC2,256 are located at the intersections of the word line WL256 and the complementary bit lines /BL1 and /BL2. A memory cell MC ("MC" generically indicates the memory cells) comprises a dynamic memory cell, and includes a memory cell capacitor (115, 116, 117, 118, 119 and 120) for storing information and a transmission gate transistor (25, 26, 27, 28, 29 and 30) for connecting a related memory cell capacitor to a corresponding bit line (BL or /BL).

Precharging/equalizing circuit 2 is responsive to the equalizing signal (precharge instructing signal) φE to precharge respective bit line pairs BL1, /BL1 and BL2, /BL2 to a predetermined precharge potential (generally, a half of supply potential Vcc) and equalize the potentials of the bit line pairs. For bit line pair BL1 and /BL1, there are provided precharging transistors 19 and 20 as well as an equalizing transistor 21. For bit line pair BL2 and /BL2, there are provided precharging transistors 22 and 23 as well as an equalizing transistor 24. The construction and operation of these equalizing transistor and precharging transistor are similar to those of the conventional semiconductor memory device.

Sense-input/output gate 1 includes P-type sense amplifiers PSA1 and PSA2 which are responsive to a P-type sense amplifier drive signal φP to differentially amplify the potentials of respective bit line pairs BL1, /BL1 and BL2, /BL2, and amplifier circuits NSA1 and NSA2 combinedly used as read gates and sense amplifiers.

P-type sense amplifier PSA1 which is provided for bit line pair BL1 and /BL1 includes a pair of cross-coupled p-channel MOS transistors 31 and 32. P-type sense amplifier PSA2 which is provided for bit line pair BL2 and /BL2 includes a pair of cross-coupled p-channel MOS transistors 33 and 34. P-type sense amplifiers PSA1 and PSA2 are activated in response to P-type sense amplifier drive signal φP to raise the bit line potential, which is higher than the other in the corresponding bit line pair, to "H" level.

Amplifier circuit NSA1 which is provided for bit line pair BL1 and /BL1 includes a pair of cross-coupled n-channel MOS transistors 9 and 10, and a sense amplifier operation control, or separating (isolating) means, comprising isolating elements in the form of n-channel MOS transistors 11 and 12. MOS transistor 9 has a gate connected to bit line BL1, as well as one conduction terminal (drain) connected to a latch node /LN1 and the other conduction terminal (source) connected to ground potential Vss. MOS transistor 10 has a gate connected to complementary bit line /BL1, as well as one conduction terminal connected to a latch node LN1 and the other conduction terminal connected to ground potential Vss.

The separating or isolating means, i.e., separating transistor 11 is disposed between complementary bit line /BL1 and latch node /LN1. Separating transistor 12 is disposed between bit line BL1 and latch node LN1.

Amplifier circuit NSA2 which is provided for bit line pair BL2 and /BL2 includes a pair of cross-coupled n-channel MOS transistors 15 and a sense amplifier operation control, or 16 and separating means, including isolating elements in the form of transistors 17 and 18. Transistor 15 has a gate connected to bit line BL2, and one of its conduction terminals is connected to a latch node /LN2. MOS transistor 16 has a gate connected to complementary bit line /BL2, and one of its conduction terminals is connected to a latch node LN2. The other conduction terminals of the transistors 15 and 16 is connected to ground potential Vss. Separating transistor 17 is disposed between complementary bit line /BL2 and latch node /LN2. Separating transistor 18 is disposed between bit line BL2 and latch node LN2.

When control signal φT is "H", separating transistors 11, 12, 17 and 18 become conductive. Thereby, amplifier circuits NSA1 and NSA2 operate similarly to conventional N-type sense amplifiers to lower the potential of the bit line having a lower potential in a corresponding bit line pair BL and /BL. When isolation control signal $\phi T$ is "L", separating transistors 11, 12, 17 and 18 are nonconductive. In this case, amplifier circuits NSA1 and NSA2 function similarly to the read gates in a conventional semiconductor memory device of a separated IO type. Thus, separating transistors 11, 12, 17 and 18 cause the amplifier circuits to operate as the N-type sense amplifiers or the read gates by separating or connecting latch nodes LN of amplifier circuits NSA1 and NSA2 from or to the potential detection nodes (i.e., connections between the gates of MOS transistors (9, 10 and 15, 16) and the bit lines (/BL, BL1 and /BL2, BL2)).

Sense-input/output-gate 1 further includes column selecting gates 7 and 8 which are responsive to a column selecting signal Y1 to connect bit line pair BL1 and /BL1 to internal data transmitting lines IO and /IO, and column selecting gates 13 and 14 which are responsive to a column selecting signal Y2 to connect bit line pair BL2 and /BL2 to internal data transmitting lines IO and /IO. Column selecting gates 7, 8, 13 and 14 connect the latch nodes LN and /LN of amplifier circuits NSA1 and NSA2 to internal data transmitting line pair IO and /IO.

In amplifier circuits NSA1 and NSA2, the connections between the gates of the transistors and the bit lines are referred to as sensing or detection nodes for the sake of convenience, because these gates are used to sense the potentials on the corresponding bit lines. The connection between the one conduction terminal of each MOS transistor in the circuit NSA and the related bit line is referred to as the output or latch node for the sake of convenience, because the potential applied to the gate (detection node) is amplified and transmitted to that node so that the amplified data is latched thereat when the separating transistor is conductive.

Figure 3:
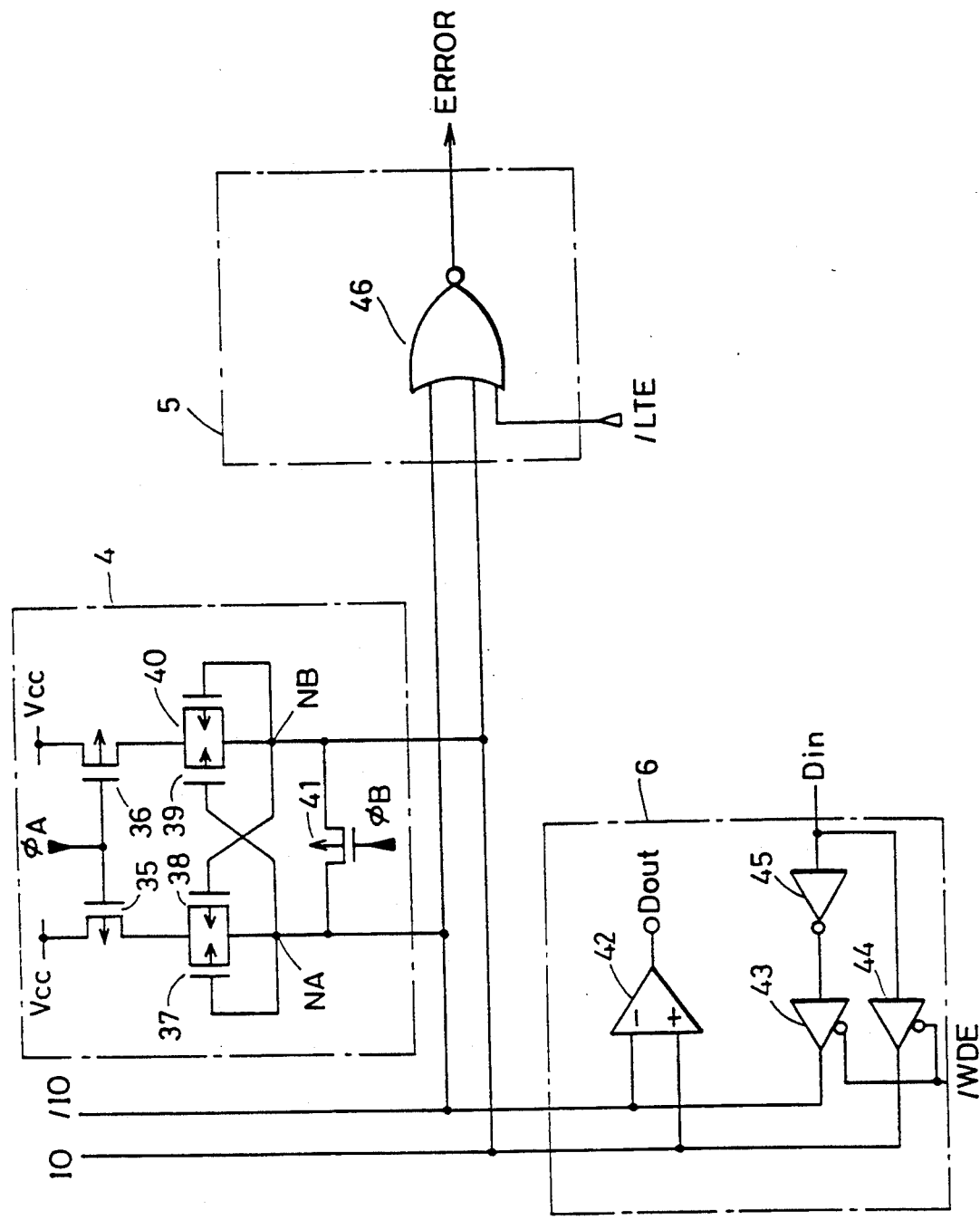
FIG. 3 shows an example of a construction of a load circuit, a test circuit and an input/output circuit of the semiconductor memory device shown in FIG. 1.

FIG. 3 shows specific constructions of the load circuit, the line test circuit and the input/output circuit. Load circuit 4 includes p-channel MOS transistors 35 and 36 which are responsive to a control signal $\phi A$ to transmit power supply potential Vcc, p-channel MOS transistors 37 and 40 which lower the signal potentials transmitted from transistors 35 and 36 by their respective threshold voltage Vth and transmit the same to internal data transmitting lines /IO and IO, p-channel MOS transistors 38 and 39 for detecting the potentials on internal data transmitting lines IO and /IO, and p-channel MOS transistor 41 for equalizing the potentials of internal data transmitting lines IO and /IO, in response to a control signal $\phi B$.

Transistors 37 and 38 are connected in parallel, and transistors 39 and 40 are connected in parallel. A gate of transistor 38 is connected to internal data transmitting line IO, and a gate of transistor 39 is connected to complementary internal data transmitting line /IO. Transistors 37 and 40 are diode-connected, so that they function as a load resistor and also determine the potentials of internal data transmitting lines IO and /IO. An operation of load circuit 4 will be described below.

Control signal $\phi A$ is set at "L" when a data writing operation is not performed. In the data writing operation, this load circuit 4 does not operate due to the signal $\phi A$ at "H", and the signal potentials of internal data transmitting lines IO and /IO are set at potentials corresponding to the write data.

Control signal $\phi B$ is set at "L" only in a standby state or in a resetting operation of the internal data transmitting lines to equalize the potentials of internal data transmitting lines IO and /IO.

Under a condition that a data is not read out to internal data transmitting linea IO and /IO, internal data transmitting lines IO and /IO are set at the potential Vcc $-$Vth by means of transistors 37 and 40. In the following description, it is assumed that control signal $\phi A$ is set at a level allowing the transistors 35 and 36 passing the supply potential Vcc applied thereto without any loss.

Description will be made with respect to such a case that a data of a memory cell was read to internal data transmitting lines IO and /IO, and the potential of a node NA has lowered slightly below the potential of a node NB. In transistors 39 and 40, the current flows through transistor 39 to internal data transmitting line IO. In transistor pair 37 and 38, transistor 38 has the gate potential higher than the gate potential of transistor 37, so that transistor 38 is turned off. In this state, transistor 37 functions as a load resistor, and thus allows the passage of only a small current flow. Due to the discharging transistors included in the amplifier circuits shown in FIG. 2, the potential of internal data transmitting line /IO lowers below the potential of internal transmitting line IO. When the potentials of bit line pair BL and /BL are amplified to the full voltage levels "H" and "L" by the sense operation, respectively, the potential of this node NB increases to the initial level of "H" (in this case, Vcc$-$Vth) again (because there is no discharging path).

The pull-up stage formed of p-channel MOS transistors in the load circuit 4 and the discharging transistors included in the amplifier circuits NSA constitute a symmetrical current mirror amplifier if the transistors 37 and 40 function as a diode. Transistors 37 and 40 determine the potential levels of nodes NA and NB, and provide comparison reference voltages for the potential levels of nodes NA and NB. In operation, transistors 37 and 39 receive the potential at node NA to provide the same current flow Transistors 38 and 40 receive the potential at node NB to provide the same current flow. In other words, transistors 37 and 39 constitute a current mirror circuit, and transistors 38 and 40 constitute another current mirror circuit.

Test circuit 5 includes a 3-input NOR gate circuit 46 which receives the test mode instructing signal /LTE and the signal potentials on internal data transmitting lines IO and /IO. NOR gate circuit 46 included in test circuit 5 raises the signal ERROR for indicating the existence of a defective memory cell when all the three inputs applied thereto are "L".

Input/output circuit 6 includes a differential amplifier 42, which receives at its positive input the signal potential on internal data transmitting line IO and receives at its negative input the data on internal data transmitting line /IO. Differential amplifier 42 outputs an external data Dout. Input/output circuit 6 further includes tri-state buffers 43 and 44 which are activated in response to the write instructing signal /WDE, and an inverter 45 which inverts an externally applied data Din.

An output of the inverter 45 is supplied to the tri-state buffer 43. Tri-state buffer 44 directly receives an external data Din. An output of tri-state buffer 43 is transmitted to internal data transmitting line /IO, and an output of tri-state buffer 44 is transmitted to internal data transmitting line IO. Then, an operation will be described below with reference to a waveform diagram of FIG. 4.

In the following description, assumption is made as follows. Memory cell MC1,1 has stored the data of "H". Memory cell MC2,1 also has stored the data of "H". The data is read from memory cell MC1,1. The data of "L" is written in memory cell MC2,1.

At time t0, equalizing (precharge instruction) signal $\phi E$ lowers to "L" and IO equalizing signal $\phi B$ rises to "H", starting a memory cycle. Internal data transmitting lines IO and /IO are released from equalized state, but are precharged to "H" (strictly, the level of Vcc−Vth) by the pull-up stage formed of the p-channel MOS transistors in load circuit 4. Bit lines BL1, /BL1, BL2 and /BL2 of memory cell array 3 are held in a floating state with the intermediate potential, i.e., precharge potential VH.

At time t1, row decoder 403 generates a row selecting signal WL1, so that the potential of word line WL1 rises to "H". Here, the same reference numerals or characters are allotted to the signals and the signal lines for transmitting the same. Nearly simultaneously with the above operation, column decoder 402 generate a column selecting signal Y1. Control signal $\phi T$ is in the state of "L".

As the potential of word line WL1 rises, the data of "H" held by memory cells MC1,1 and MC2,1 is transmitted to bit lines BL1 and BL2. Thereby, the potentials of bit lines BL1 and BL2 slightly increase.

The control signal $\phi T$ is in the state of "L", and the detection nodes and the latch nodes of amplifier circuits NSA1 and NSA2 are separated from each other. Latch nodes LN1 and /LN1 are connected to internal data transmitting lines IO and /IO through column selecting gates 8 and 7. A minute potential difference generated between bit lines BL1 and /BL1 is detected by transistors 9 and 10. More specifically, the conductivity of transistor 9 becomes higher than the conductivity of transistor 10, and the potential of internal data transmitting line /IO is more decreased due to the discharge through the latch node /LN1 than the decrease of the potential of internal data transmitting line IO caused by the discharge through latch node LN1.

The potential difference generated between internal data transmitting lines IO and /IO is detected by the differential amplifier 42 included in input/output circuit 6. Differential amplifier 42 receives at its positive input the signal on internal data transmitting line IO. In this case, therefore, differential amplifier 42 supplies the signal of "H" as external read data Dout.

At time t2, P-type sense amplifier drive signal $\phi P$ rises from the intermediate potential to "H". Thereby, P-channel sense amplifiers PSA1 and PSA2 are activated, and thus the potentials of bit lines BL1 and BL2 rise.

At time t3, separation control signal $\phi T$ rises to "H". Thereby, separating transistors 11, 12, 17 and 18 become conductive, and amplifier circuits NSA1 and NSA2 function as the cross-coupled N-type sense amplifiers, so that the potentials of the respective latch nodes LN1, LN1 and LN2, /LN2 are connected to their detection nodes, and thus the potentials of bit lines /BL1 and /BL2 decrease.

Figure 4:
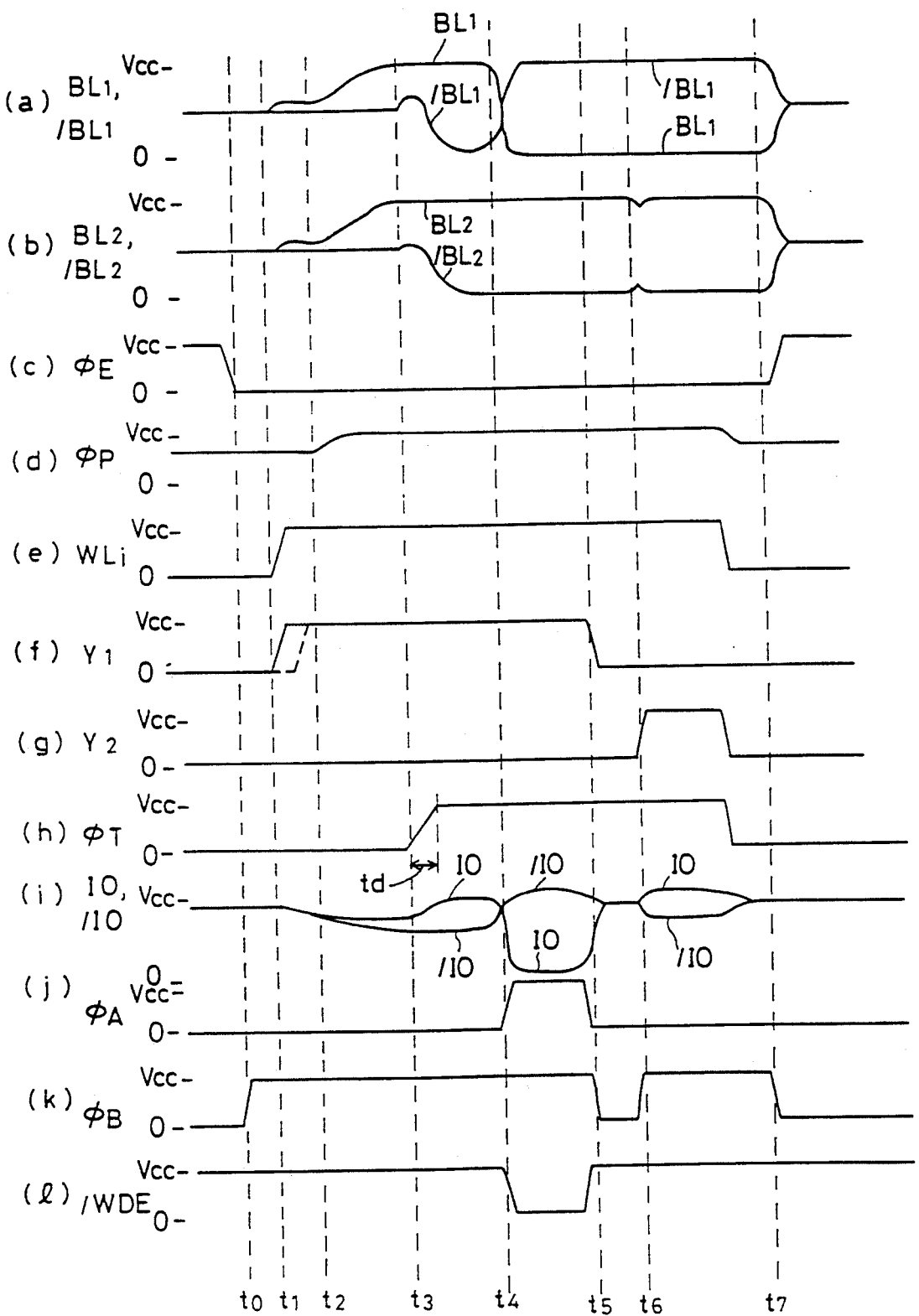
FIG. 4 is a signal waveform diagram showing an operation of the semiconductor memory device according to an embodiment of the invention.

In FIG. 4, when control signal $\phi T$ rises to "H" at time t3, the potential of bit line /BL1 once increases, because bit line /BL1 is connected to internal data transmitting line /IO through transistors 7 and 11.

At time t3, N-type sense amplifier is activated, and thus transistor 10 stops the discharging operation, so that the potential of internal data transmitting line IO is increased by the current flow from load circuit 4. The potential of internal data transmitting line /IO is stably maintained at a level determined by the balancing of the discharge operation of discharging transistor 9 and the current supply from load circuit 4.

Due to the amplifying operations of P-type sense amplifiers PSA1 and PSA2 as well as amplifier circuits NSA1 and NSA2 functioning as the N-type sense amplifiers, the data of "H", which was initially held, is rewritten in memory cell capacitors 115 and 118 of respective memory cells MC1,1 and MC2,1

At time t4, internal write instructing signal /WDE is lowered to "L". Thereby, tri-state buffers 43 and 44 are activated. Internal write data Din is "L". Therefore, the potential of internal write data transmission line IO goes to "L", and the potential of complementary internal data transmitting line /IO goes to "H".

As internal write instructing signal /WDE is generated at time t4, IO line precharge instructing signal $\phi A$ rises to "H", and thus the pull-up operation for the potentials of internal data transmitting lines IO and /IO is inhibited. Thereby, the potentials of internal data transmitting lines IO and /IO are set at values corresponding to write data Din. The signal potentials of internal data transmitting lines IO and /IO are transmitted through transistors 7, 8, 11 and 12 to bit lines BL1 and /BL1. The potential of bit line BL1 goes to "L", and the potential of complementary bit line /BL1 goes to "H", so that the data of "L" is written in memory cell MC1,1.

Then, the reading operation of memory cell MC2,1 will be described below. FIG. 4 shows a case in which memory cells MC1,1 and MC2,1 are continuously accessed in one memory cycle. This can be found in high-speed access modes such as a general page mode and a static column mode.

At time t5, control signal $\phi A$ lowers to "L", and IO line equalizing signal $\phi B$ lowers to "L" to reset internal data transmitting lines IO and /IO. Thereby, the potentials of internal data transmitting lines IO and /IO are precharged to the predetermined potential levels and are equalized. In this state, column selecting signal Y1 has been lowered to "L", and column selecting operation is not conducted. All bit line pairs are separated from internal data transmitting lines IO and /IO.

At time t6, IO line equalizing signal $\phi B$ goes to "H", and equalizing operation for internal data transmitting lines IO and /IO is completed. Also at time t6, column decoder 402 generates column selecting signal Y2, and bit lines BL2 and /BL2 are connected to internal data transmitting lines IO and /IO. This connection slightly changes the potentials of bit lines BL2 and /BL2. Control signal $\phi T$ is in the state of "H", so that the potentials of bit lines BL2 and /BL2 are transmitted to internal data transmitting lines IO and /IO. The potential of bit line BL2 is higher than that of bit line /BL2. Therefore, the potential of internal data transmitting line IO is higher than that of internal data transmitting line /IO. Differential amplifier 42 receives at its positive input the signal on internal data transmitting line IO and also receives at its negative input the signal potential of complementary internal data transmitting line /IO. Thereby, differential amplifier 42 supplies output data Dout of "H".

Word line drive signal WL1 and column selecting signal Y2 as well as control signal $\phi T$ lower to "L", and then, at time t7, precharge instructing signal $\phi E$ rises to "H", and IO line equalizing signal $\phi B$ lowers to "L".

Thereby, the potential of bit line pair is equalized and the potential of internal data transmitting line is equalized for the next operation of reading/writing of the data.

Then, circuit constructions for generating the various control signals will be described below in order. In the following description, the row address strobe signal /RAS is utilized as the memory cycle defining signal. However, if row address and column address are applied in the non-multiplex manner, a chip select signal /CS may be utilized instead of row address strobe signal /RAS.

Figure 5A:
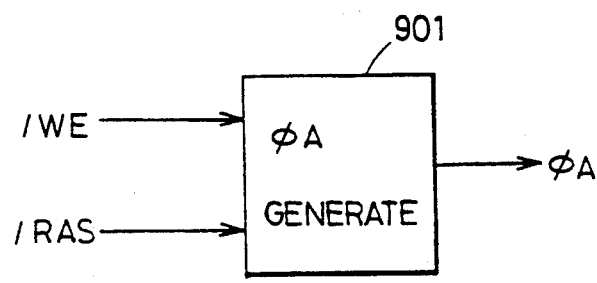
FIGS. 5A and 5B show a circuit for generating a precharging operation control signal in a load circuit shown in FIG. 1 and an operation of the same, respectively.
Figure 5B:
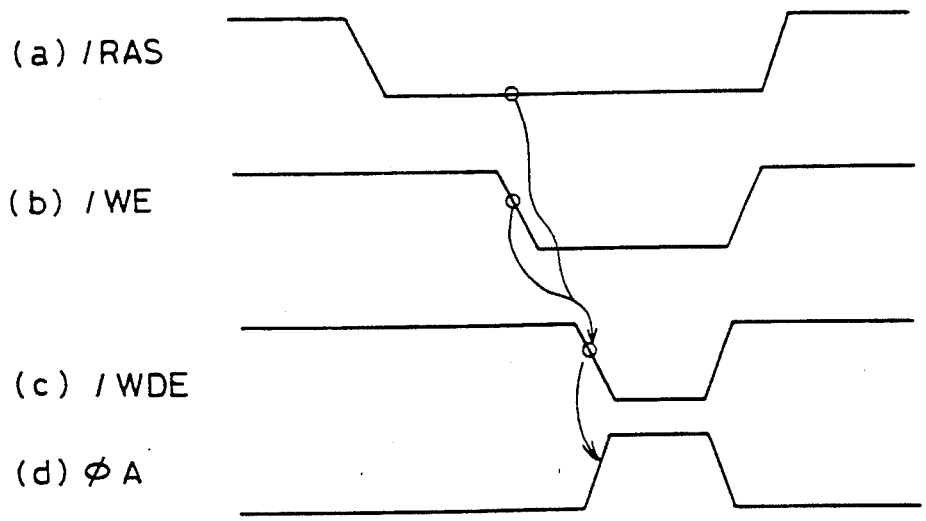

FIG. 5A shows a circuit for generating control signal φA which pulls up internal data transmitting lines to the predetermined potential. Referring to FIG. 5A, a φA generating circuit 901 is responsive to write enable signal /WE and row address strobe signal /RAS to generate the control signal φA. This φA generating circuit 901 is included in control signal generating circuit 405 shown in FIG. 1. An operation of φA generating circuit 901 will be described below with reference to a waveform diagram of FIG. 5B.

φA generating circuit 901 is activated when row address strobe signal /RAS goes to "L", and responds to write enable signal /WE to generate the control signal φA. Control signal φA is an inverted signal of internal write instructing signal /WDE.

Figure 6A:
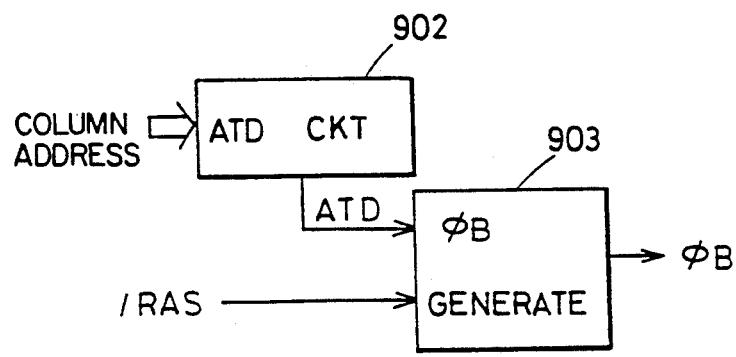
FIGS. 6A and 6B show a circuit construction for generating an equalizing operation control signal in a load circuit shown in FIG. 1 and an operation of the same, respectively.
Figure 6B:
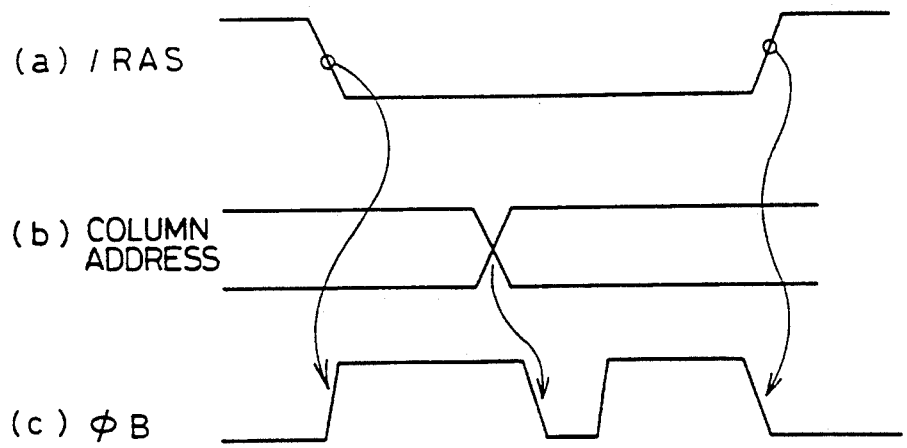

FIG. 6A shows a construction of a circuit for generating IO line equalizing signal φB. Referring to FIG. 6A, the circuit for generating IO line equalizing signal φB includes a column address transition detecting circuit (ATD circuit) 902 for detecting a time of point at which a column address changes, and a φB generating circuit 903 which are responsive to the row address strobe signal /RAS and the column address change detecting signal ATD supplied from ATD circuit 902 to generate IO line equalizing signal φB. Then, an operation of the circuit for generating IO line equalizing signal φB shown in FIG. 6A will be described with reference to a waveform diagram of FIG. 6B.

The φB generating circuit 903 is responsive to the lowering of row address strobe signal /RAS to raise IO line equalizing signal φB to "H". ATD circuit 902 detects the point of time of change of column address signal to generate column address transition detecting signal ATD. The φB generating circuit 903 is responsive to column address transition detecting signal ATD to lower the IO line equalizing signal φB of "H" to "L". After elapse of a predetermined time of period from the application of column address transition detecting signal ATD (i.e., after the elapse of a period from the decoding of column address to the generation of column selecting signal), φB generating circuit 903 raises IO line equalizing signal φB to "H" again. As row address strobe signal /RAS rises to "H", φB generating circuit 903 lowers IO line equalizing signal φB to "L".

Since it is required only to complete the equalizing operation of the IO lines before the generation of the corresponding column selecting signal, such a construction may be employed that, in a waveform diagram shown in FIG. 4, IO line equalizing signal φB rises to "H" at time t1. ATD circuit 920 may be constructed to detect the change of a column address signal supplied from the address buffer, and also may be constructed to detect a point of time of change of an externally applied column address signal.

Figure 7A:
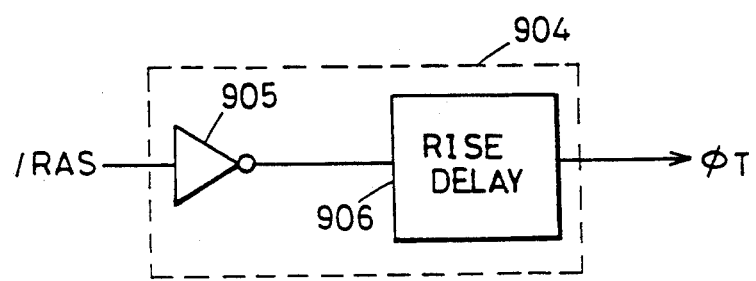
FIGS. 7A-B show a circuit construction for generating a separation control signal shown in FIG. 2 and a generation timing of the same.
Figure 7B:
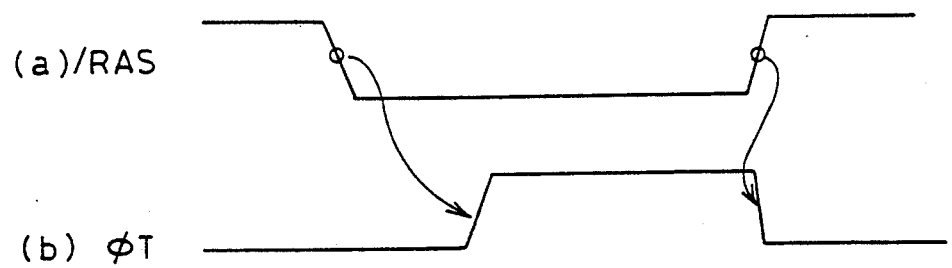

FIG. 7A shows a circuit construction for generating separation control signal φT. Referring to FIG. 7A, a φT generating circuit 904 includes an inverter circuit 905 for inverting row address strobe signal /RAS, and a rise delay circuit 906 for delaying only the rise of an output signal of inverter circuit 905. Rise delay circuit 906 generates separation control signal φT. Now, an operation of the circuit for generating a separation control signal φT shown in FIG. 7A will be described with reference to a waveform diagram of FIG. 7B.

When row address strobe signal /RAS lowers to "L", the output of inverter circuit 905 rises to "H". Rise delay circuit 906 delays the rise of the output signal from inverter circuit 905 and outputs the same. Therefore, after the elapse of a predetermined time from the lowering of row address strobe signal /RAS to "L", separation control signal φT rises to "H". When row address strobe signal /RAS rises to "H", the output of inverter circuit 905 lowers to "L". Responsively, the output signal from rise delay circuit 906, i.e., separation control signal φT also lowers to "L".

In accordance with the timings in the waveform diagram shown in FIG. 4, the semiconductor memory device shown in FIG. 1 operates accurately. However, as the degree of integration of the semiconductor memory device increases, the capacitances of memory cell capacitors decrease. In this case, the potential differences, which are generated in respective bit line pairs BL1, /BL1 and BL2, /BL2 in a period from time t1 to time t2 in the waveform diagram shown in FIG. 4, decrease. P-type sense amplifiers PSA1 and PSA2 start the sensing operation at time t2. Since the potential differences to be sensed are small, a period of time required for the amplification by P-type sense amplifiers PSA1 and PSA2 increases.

At time t3, separation control signal φT is set at "H", and the potential of the bit line having a lower potential in each bit line pair is discharged by the N-type sense amplifier. In this operation, if separation control signal φT is very quickly raised to "H", amplifier circuit NSA1 functioning as the N-type sense amplifier operates at an increased operation speed, but provides a reduced sensitivity. In this case, N-type sense amplifier (amplifier circuit) NSA1 operates in a condition that the potential difference between the bit lines has not been sufficiently increased because a long period of time was spent for the sensing operation of P-type sense amplifier PSA1, so that the N-type sense amplifier may possibly malfunction.

In order to avoid the above problem, a time period td of rising of separation control signal φT at time t3 is made to be increased in a case that the degree of integration is large and the capacitance of the memory capacitors is small. In this operation, the potential differences in each of bit line pairs BL1, /BL1 and BL2, /BL2 are slowly amplified. This improves the sensitivity in the sensing operation of the N-type sense amplifier, and thus the malfunction of the N-type sense amplifier is prevented. The arrangement in which the time td of rising of separation control signal φT is increased, can be accomplished by reducing the size of the drive transistor (output transistor) included in rise delay circuit 906 shown in FIG. 7A. Thus, the reduction of the size of the drive transistor reduces the current supply ability of this drive transistor, resulting in a slow rising of separation control signal φT.

At time t3 in the waveform diagram of FIG. 4, separation control signal φT rises to "H", and bit lines BL1 and /BL1 are connected to internal data transmitting lines IO and /IO. The potential of internal data transmitting line /IO is higher than the potential of bit line /BL1 and thereby the potential of bit line /BL1 increases.

As described above, the increase of integration degree of the semiconductor memory device brings about the reduction of the potentials in respective bit line pairs, and thus brings about the increase of the sensing time of P-type sense amplifiers PSA (PSA1 and PSA2). Therefore, with the degree of integration further increased, when bit lines BL1 and /BL1 are connected to internal data transmitting lines IO and /IO at time t3, respectively, the small potential difference in the bit line pair further decrease, so that N-type sense amplifier (formed of transistors 9 and 10) may malfunction.

In order to prevent the loss of the potential difference between the bit lines, which is caused by the connection of the bit line pair and the internal data transmitting line pair, column selecting signal Y1 is once lowered to "L", as shown in FIG. 8, before time t3 at which separation control signal $\phi$T rises to "H".

When separation control signal $\phi$T is raised to "H" at time t3 to operate the amplifier circuit NSA1 as the N-type sense amplifier, bit lines BL1 and /BL1 have been isolated from internal data transmitting lines IO and /IO, so that the increase of the potential of bit line /BL1 is prevented. Therefore, the potential difference between bit lines BL1 and /BL1 to be amplified is not lost, and thus the N-type sense amplifier can stably perform the sensing operation.

In order to write the data of "L" in memory cell MC1,1 following the above operation, column selecting signal Y1 is set at "H" to make column selecting gates 7 and 8 conductive at time t4. Thereby, the potentials corresponding to the internal write data transmitted to internal data transmitting lines IO and /IO are transmitted to bit lines BL1 and /BL1.

In the operation timing diagram shown in FIG. 8, the timings of the remaining signals are the same as in FIG. 4. Rising time td of separation control signal $\phi$T may be increased similarly so as to improve the sensitivity.

As described above, the construction for temporarily lowering the column selecting signal Y1 to "L" may be accomplished by a construction in which a delay signal of a column address transition detecting signal ATD or a column address strobe signal /CAS temporarily inactivates the column decoder.

Now, a test operation of the semiconductor memory device shown in FIG. 1 will be described with reference to a waveform diagram shown in FIG. 9. In the following description, it is assumed that the data of "H" has been written in all the memory cells in memory cell array 3, and the memory cells in one row are simultaneously tested in the test operation.

At time t1, internal write instructing signal /WDE is lowered to "L" to activate the write buffers 43 and 44. In this operation, externally applied write data Din is set at "H". Therefore, the potential of internal data transmitting line IO goes to "H" and the potential of internal data transmitting line /IO goes to "L".

Figure 9:
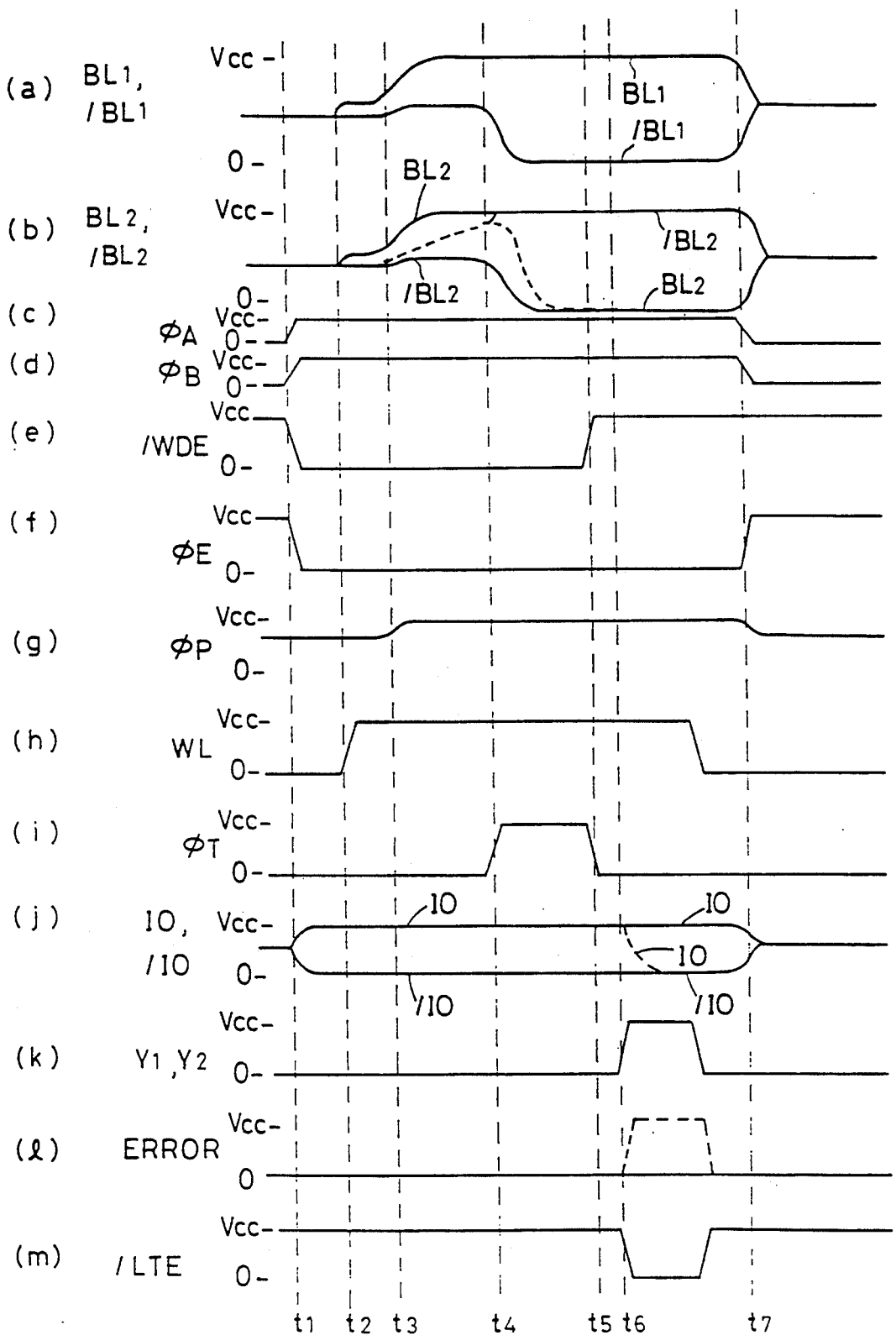
FIG. 9 is a signal waveform diagram showing a test operation of a semiconductor memory device according to the invention.

Referring to FIG. 9, precharge instructing signal $\phi$E of memory cell array 3 lowers to "L" at time t1 and both control signals $\phi$A and $\phi$B to be applied to load circuit 4 rise to "H". The timing for inactivating the control signals $\phi$A, $\phi$B and $\phi$E may be earlier than time t1.

At time t2, row decoder 403 performs the decoding operation to raise the potential of word line WL (one word line in memory cell array 3) to "H". The data "H" held by the memory cells connected to word line WL thus selected is transmitted to each bit line pair. FIG. 9 shows the change of the potentials of only two pairs of bit lines BL1, /BL1, and BL2, /BL2. The potentials of bit lines BL1 and BL2 increase.

At time t3, P-type sense amplifier drive signal $\phi$P rises to "H" to activate P-type sense amplifiers PSAs (PSA1, PSA2 . . . ). The potentials of bit lines BL1 and BL2 connected to the memory cells increase to the level of supply voltage Vcc. In this operation, complementary bit lines /BL1 and /BL2 are in the floating state, so that the potentials thereof slightly increase by means of capacitive coupling in accordance with the increase of the potentials of bit lines BL1 and BL2.

When P-type sense amplifier PSA completes the sensing operation at time t4, separation control signal $\phi$T is raised to "H" to activate amplifier circuits NSA (NSA1 and NSA2) as the N-type sense amplifiers. Thereby, the potentials of bit lines /BL1 and /BL2 lower to the ground potential level of "L". If the memory cells connected to the word line WL thus selected have correctly stored data "H", the potentials of bit lines BL1–BL256 become "H", and the potentials of complementary bit lines /BL1–/BL256 become "L".

At time t5, internal write instructing signal /WDE is raised to "H". This sets tri-state buffers 43 and 44 at the output high impedance state. Also, separation control signal $\phi$T is lowered to "L". This separates the respective bit lines BL (BL1–BL256) and /BL (/BL1–/BL256) from latch nodes LN and /LN.

At time t6, all the column selecting signals Y1–Y256 supplied from the column decoder are set at "H". Thereby, latch nodes LN and /LN of the respective bit line pairs are connected to internal data transmitting lines IO and /IO in the floating state. The potential of bit lines BL is "H", and the potential of complementary bit lines /BL is "L". In amplifier circuit NSA, transistors (10 and 16) of which gates are connected to complementary bit line /BL are not conductive. Therefore, internal data transmitting line IO holds the potential of "H".

Meanwhile, transistors (9, 15) of which gates are connected to the bit line BL become conductive, so that the potential of internal data transmitting line /IO maintains "L".

Therefore, the output of NOR gate circuit 46 included in test circuit 5 becomes "L", even if test instructing signal /LTE becomes "L" at time t6. Thus, it can be found that the data of "H" is read from memory cells MC1,j–MC256, j (j=an integer between 1–256). In this case, signal ERROR is "L".

Then, consideration will be made with respect to a case that the selected word line is word line WL1 and memory cell MC2,1 is a defective memory cell. In this case, the data of "L" is read from memory cell MC2,1.

It is assumed that, when P-type sense amplifier PSA operates at time t3, the potentials of both bit lines BL2 and /BL2 increase due to the data read error of memory cell MC2,1. It is also assumed that, when the N-type sense amplifier operates at time t4, the potential of bit line BL2 goes to "L", and the potential of complementary bit line /BL2 goes to "H" (as indicated by dashed line in FIG. 9).

When all column selecting signals Y1–Y256 go to "H" at time t6, latch nodes LN and /LN of bit line pair are connected to internal data transmitting lines IO and /IO, respectively. In this operation, transistor 16 having a gate connected to complementary bit line/BL2 becomes conductive. Therefore, the potential of internal data transmitting line IO, which was precharged to "H" and set in the floating state at time t1, is discharged through this transistor 16 to be lowered to "L". With respect to the other bit lines (e.g., bit lines BL1 and /BL1), transistor 9 is conductive, so that the potential of complementary internal data transmitting line /IO is "L".

Therefore, when test instructing signal /LTE lowers to "L" at time t6, output signal ERROR of NOR gate circuit 46 rises to "H" (a waveform depicted by the dashed line in FIG. 9). This enables the detection of the fact that the data cannot be read correctly from a certain memory cell(s) MC among the memory cells MC (e.g., MC1,1–MC256,1) in the selected one row.

It can be easily understood that even if data is not read correctly from two or more memory cells connected to the selected one row, both the potentials of internal data transmitting lines IO and /IO lower to "L" at time t6, so that the signal ERROR rises to "H".

It can be tested whether or not the data of "L", which has been written in memory cells in one row, can be read correctly. For this purpose, the potential of internal data transmitting line IO is precharged to "L", and the potential of complementary internal data transmitting line /IO is precharged to "H" at t1. The "L" data storage can be tested by the operations which are similar to those in the waveform diagram shown in FIG. 9, except for the above precharging.

In either case, if data cannot be read correctly from at least one memory cell among the memory cells connected to a selected one row, both the potentials of internal data transmitting lines IO and /IO go to "L" at time t6. In this case, output signal ERROR from NOR gate circuit 46 included in the test circuit goes to "H", and thus the reading of the incorrect data is detected.

In order to use amplifier circuit NSA as the read gate in the test mode, it is required only to modify the construction of the separation control signal generating circuit (see FIG. 7) such that separation control signal φT lowers to "L" before the generation of column selecting signal Y in the test mode.

In the test mode, the timings at which column selecting signals Y (Y1, Y2 . . . ) rise to "H" are different from those for the ordinary reading and writing of data. This can be facilely accomplished by the construction in which column decoder is inactivated in the test mode, and all the outputs of the column decoder are raised to "H" at a predetermined timing (determined by the delay signal of column address strobe signal /CAS) or by test instructing signal /LTE.

In the construction shown in FIG. 1, test instructing signal /LTE is generated based on the combination of the states of the externally applied clock signals /RAS and /WE and /CAS. Alternatively, a control signal may be used only for the test mode operation which is applied through another pin terminal.

The construction described above can perform only the test in which all the memory cells in one row are subjected to writing and reading of the same data of "L" or "H". A test, in which different data which are logically inverted with each other are written in the adjacent memory cells and will be read from the respective memory cells, has an advantage that the malfunction due to leak of charges between the adjacent memory cells or other reasons can be detected. Now, a construction for writing logically different kinds of data in the adjacent memory cells will be described hereinafter.

Figure 10:
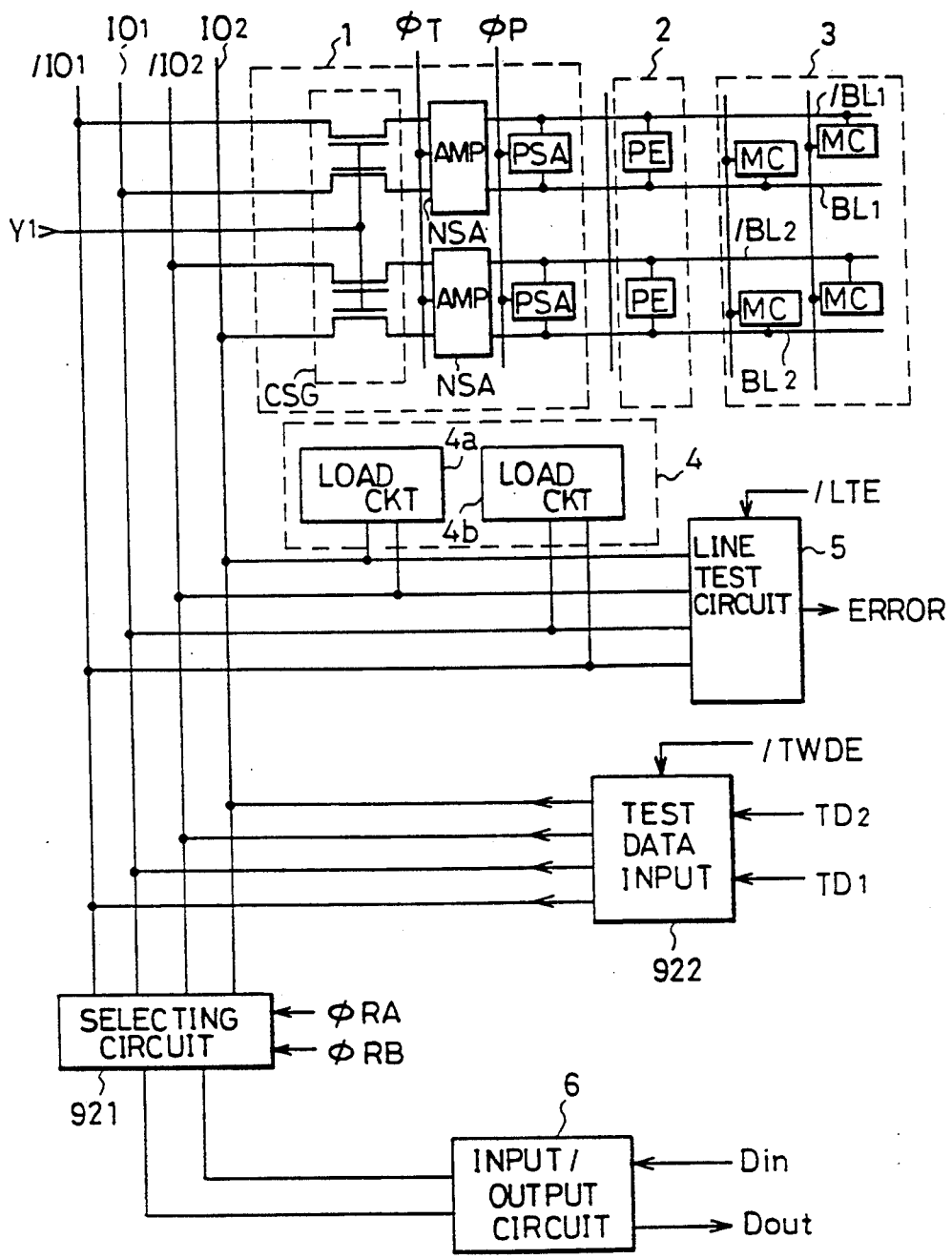
FIG. 10 is a block diagram schematically showing a whole construction of a semiconductor memory device according to another embodiment of the invention.

FIG. 10 shows a whole construction of a semiconductor memory device according to another embodiment of the invention. Referring to FIG. 10, memory cell array 3 and precharging/equalizing circuit 2 have the constructions similar to those of the semiconductor memory device shown in FIG. 1. In FIG. 10, the precharging/equalizing circuits provided for the respective bit line pairs are indicated by reference characters "PE", and memory cells are indicated by "MC".

Sense input/output gate 1 has the construction similar to that of the semiconductor memory device shown in FIG. 1, except that an identical column selecting signal (Y1) is applied to adjacent two pairs of bit lines (BL1, /BL1 and BL2, /BL2).

Semiconductor memory device further includes two pairs of internal data transmitting lines IO1 and /IO1, and IO2 and /IO2. Bit lines BL1, /BL1 and BL2, /BL2 are simultaneously connected to two internal data transmitting line pairs IO1, /IO1 and IO2, /IO2, respectively. Specifically, the data for the odd number columns (bit lines BL1, /BL1, . . . ) is transmitted to internal data transmitting line pair IO1 and /IO1. The data for the even number bit lines (BL2, /BL2, . . . ) is transmitted to internal data transmitting lines IO2 and /IO2.

The semiconductor memory device further includes load circuits 4a and 4b for precharging two pairs of internal data transmitting lines IO1, /IO1 and IO2, /IO2 to the predetermined potentials, a line test circuit 5 which is responsive to the signal potentials on internal data transmitting lines IO1, /IO1 and IO2, /IO2 to detect whether or not the data of the selected memory cells are correctly read, a selecting circuit 921 which is responsive to column selecting signals φRA and φRB to select internal data transmitting lines IO1 and /IO1 or internal data transmitting lines IO2 and /IO2, and a test data input circuit 922 which produces internal test data from test data TD1 and TD2 and precharges internal data transmitting lines IO1, /IO1 and IO2, /IO2 to the potentials corresponding to test data in the test mode. Selecting circuit 921 is connected to input/output circuit 6.

Figure 11:
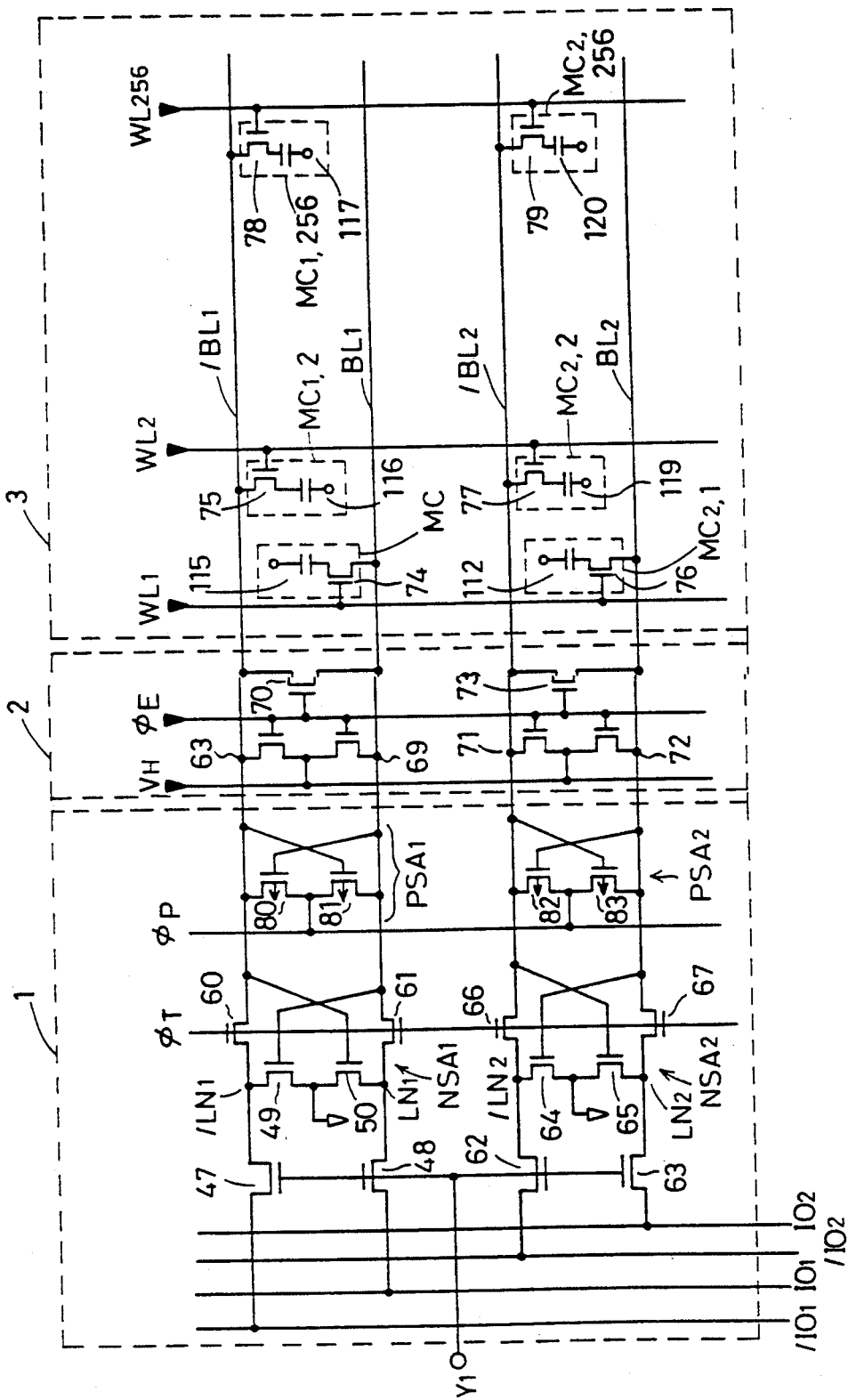
FIG. 11 shows an example of a construction of a memory cell array and a sense input/output gate of the semiconductor memory device shown in FIG. 10.

FIG. 11 specifically shows a circuit construction of a part related to two columns (two pairs of bit lines) in memory cell array 3 in the semiconductor memory device shown in FIG. 10. The circuit construction shown in FIG. 11 is similar to the construction shown in FIG. 2, except for the reference numerals and characters. Therefore, this construction will not be described in detail. In FIG. 11, the column selecting signal Y1 is applied to column selecting gates 47 and 48 as well as 62 and 63. Thereby, the latch nodes LN1, /LN1 and LN2, /LN2 are simultaneously connected to internal data transmitting lines IO1, /IO1 and IO2, /IO2, respectively.

Figure 12:
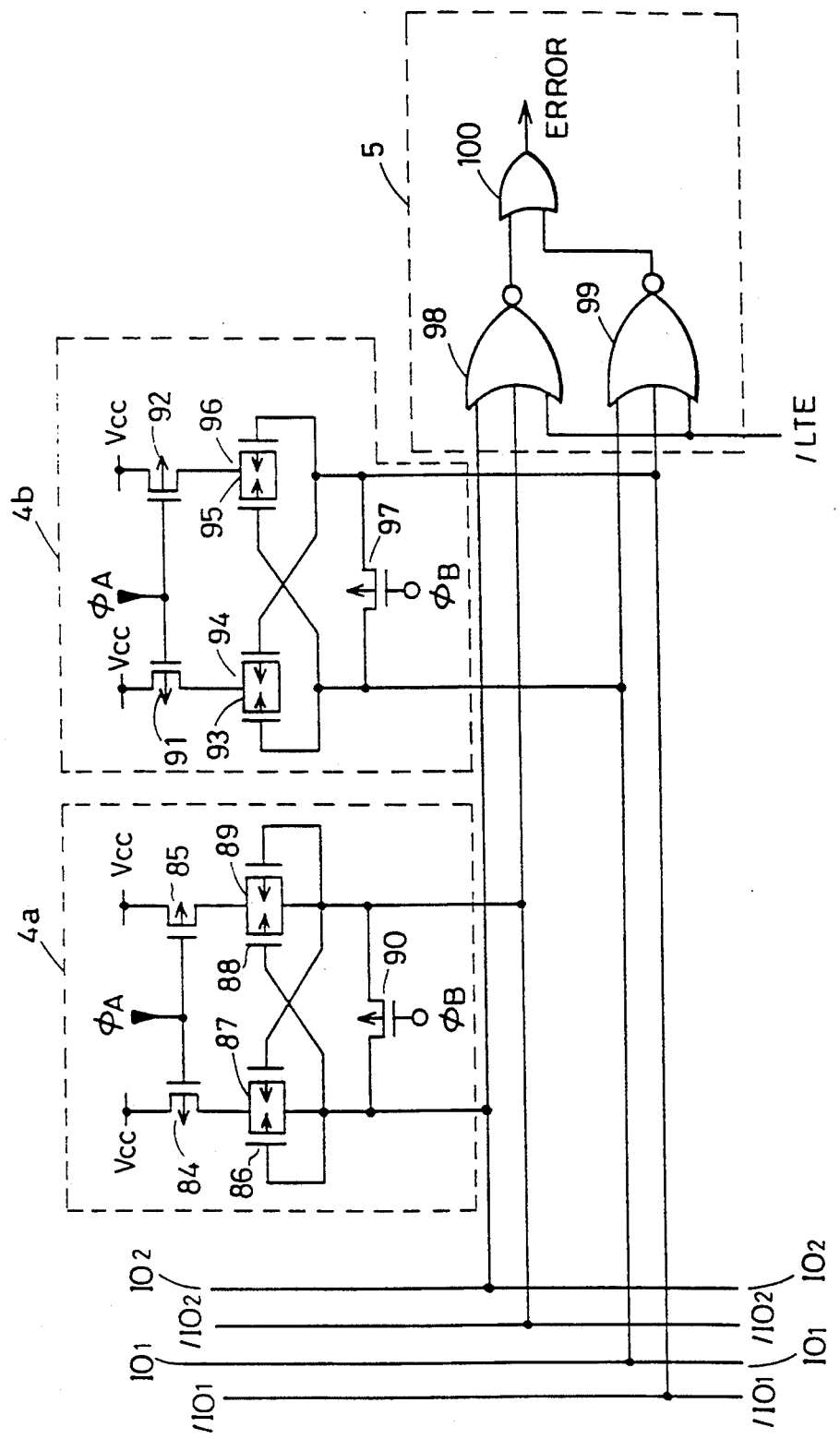
FIG. 12 shows an example of a construction of a load circuit and a test circuit of the semiconductor memory device shown in FIG. 10.

FIG. 12 specifically shows a construction of the load circuit and the test circuit shown in FIG. 10. Both load circuits 4a and 4b have the constructions identical with that of load circuit 4 shown in FIG. 3, except for the different reference numerals and characters allotted to the transistors, and the construction will not be described in detail. Load circuit 4a precharges internal data transmitting lines IO2 and /IO2 to a predetermined "H" level. Load circuit 4b precharges internal data transmitting lines IO1 and /IO1 to the predetermined "H" level.

Test circuit 5 includes an NOR gate 98 which receives test instructing signal /LTE and the signal potentials on internal data transmitting lines IO2 and /IO2, an NOR gate 99 which receives test instructing signal /LTE and the signal potentials on internal data transmitting lines IO1 and /IO1, and an OR gate 100 which receives the outputs of NOR gates 98 and 99. OR gate 100 supplies the signal ERROR. In the test circuit 5 thus constructed, the signal ERROR rises to "H" when both the signal potentials of internal data transmitting lines IO1 and /IO1 or internal data transmitting lines IO2 and /IO2 become "L".

Figure 13:
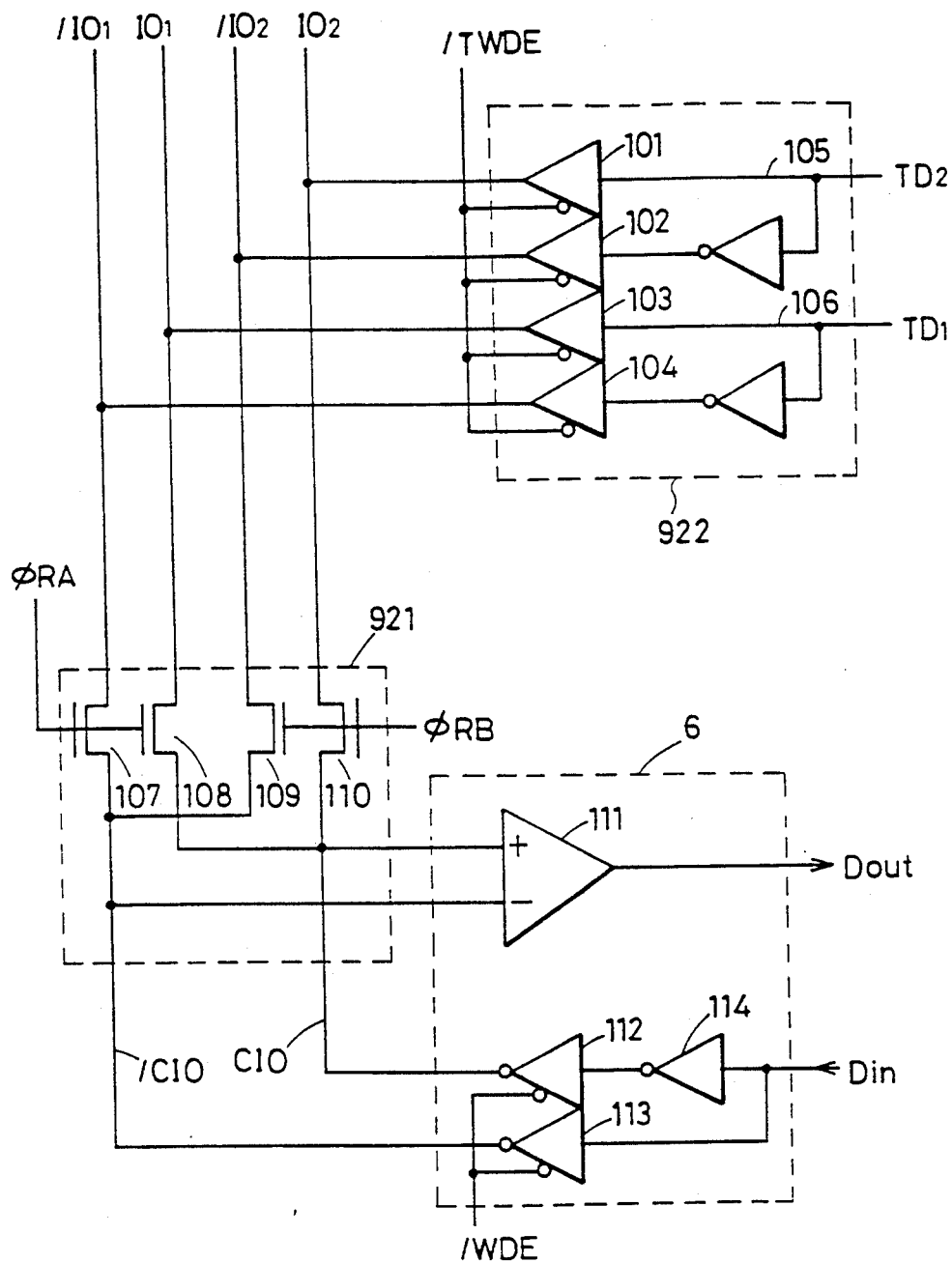
FIG. 13 shows a construction of a test data input circuit, a selecting circuit and input/output circuit of the semiconductor memory device shown in FIG. 10.

FIG. 13 shows specific constructions of the selecting circuit 921, the test data input circuit 922 and the input-/output circuit 6. In FIG. 13, test data input circuit 922 includes tri-state buffers 101, 102, 103 and 104 which are activated in response to the test data write instructing signal /TWDE, and inverter circuits 106 and 105 which invert test data TD1 and TD2, respectively. Tri-state buffer 102 inverts the output of inverter circuit 105 to transmit the same to internal data transmitting line /IO2. Tri-state buffer 101 transmits test data TD2 to internal data transmitting line IO2. Tri-state buffer 104 transmits the output of inverter circuit 106 to internal data transmitting line /IO1. Tri-state buffer 104 transmits test data TD1 to internal data transmitting line IO1.

Selecting circuit 921 includes IO selecting gates 107 and 108 which are responsive to control signal $\phi$RA to select internal data transmitting lines IO1 and /IO1, and IO selecting gates 109 and 110 which are responsive to selection control signal $\phi$RB to select internal data transmitting lines IO2 and /IO2. IO selecting gates 107 and 108 connect internal data transmitting lines IO1 and /IO1 to common data transmitting lines CIO and /CIO, respectively. IO selecting gates 110 and 109 connect internal data transmitting lines IO2 and /IO2 to common internal data transmitting lines CIO and /CIO, respectively.

Input/output circuit 6 includes a differential amplifier 111, which receives at its positive input the signal potential on the common internal data transmitting line CIO and receives at its negative input the signal potential on the common internal data transmitting line /CIO, an inverter circuit 114 for inverting an external data Din, a tri-state inverter 112, which inverts the output of inverter circuit 114 to transmit the same to the common data transmitting line CIO, and a tri-state inverter 113, which inverts external data Din to transmit the same to common internal data transmitting line /CIO. Tri-state inverters 112 and 113 enter the output high impedance state when the write instructing signal /WDE is "H". Then, an operation will be described.

Now, a test operation will be described in connection with a state in which the data of "H" has been written in memory cells (MC1,1, . . . ) of the odd number columns (BL1, /BL1, . . . ) and the data of "L" has been written in memory cells (MC2,1, MC4,1, . . . ) of the even number columns (BL2, /BL2, . . . ). The timings of the control signals in this test operation are similar to the operation timings shown in FIG. 9, except that write instructing signal /WDE is regarded as test data write instructing signal /TWDE. During the test operation, both the IO line selection control signals $\phi$RA and $\phi$RB are "L". Thereby, all transistors 107, 108, 109 and 110 in selecting circuit 921 become nonconductive.

At time t1, test data write instructing signal /TWDE is lowered to "L" to enable the tri-state buffers 101, 102, 103 and 104. External test data TD1 and TD2 are currently "H" and "L", respectively. Thereby, internal data transmitting lines IO1 and /IO2 are set at the potential of "H", and the internal data transmitting lines /IO1 and IO2 are set at the potential of "L".

At time t3, P sense amplifier drive signal $\phi$P is raised to "H", and then, at time t4, separation control signal $\phi$T is set at "H". Thereby, before time t6, the potentials of bit lines BL2n-1 in the odd columns are stably set at "H", and the potentials of complementary bit lines /BL2n-1 in the odd columns are stably set at "L". In the even columns, the potentials of bit lines BL2n go to "L", and the potentials of complementary bit lines BL2n go to "H".

At time t5, separation control signal $\phi$T is set at "L", and then, at time t6, all column selecting signals Yi are set at "H". Thereby, column selecting gate transistors 47, 48, 62 and 63 shown in FIG. 11 become conductive. The latch nodes of the bit line pairs in the odd columns are connected to internal data transmitting lines IO1 and /IO1, and the latch nodes of the bit line pairs in the even columns are connected to internal data transmitting lines IO2 and /IO2. Internal data transmitting line IO1 precharged to "H" maintains the potential of "H", because of the nonconductive state of transistor 50, of which gate is connected to complementary bit line /BL2n-1 in the odd columns. Internal data transmitting line /IO2 precharged to "H" maintains the precharged potential of "H", because of the nonconductive state of transistor 64, of which gate is connected to bit line BL2n in the even columns. Meanwhile, both internal data transmitting lines /IO1 and IO2 precharged to "L" maintain the precharge potential of "L" because of the conductive state of transistors 49 and 65.

Therefore, the outputs of NOR gate circuits 98 and 99 included in line test circuit 5 are "L" even if test instructing signal /LTE lowers to "L". Thereby, the output signal ERROR of OR gate circuit 100 goes to "L", indicating that the memory cells in one row operate correctly.

Figure 14:
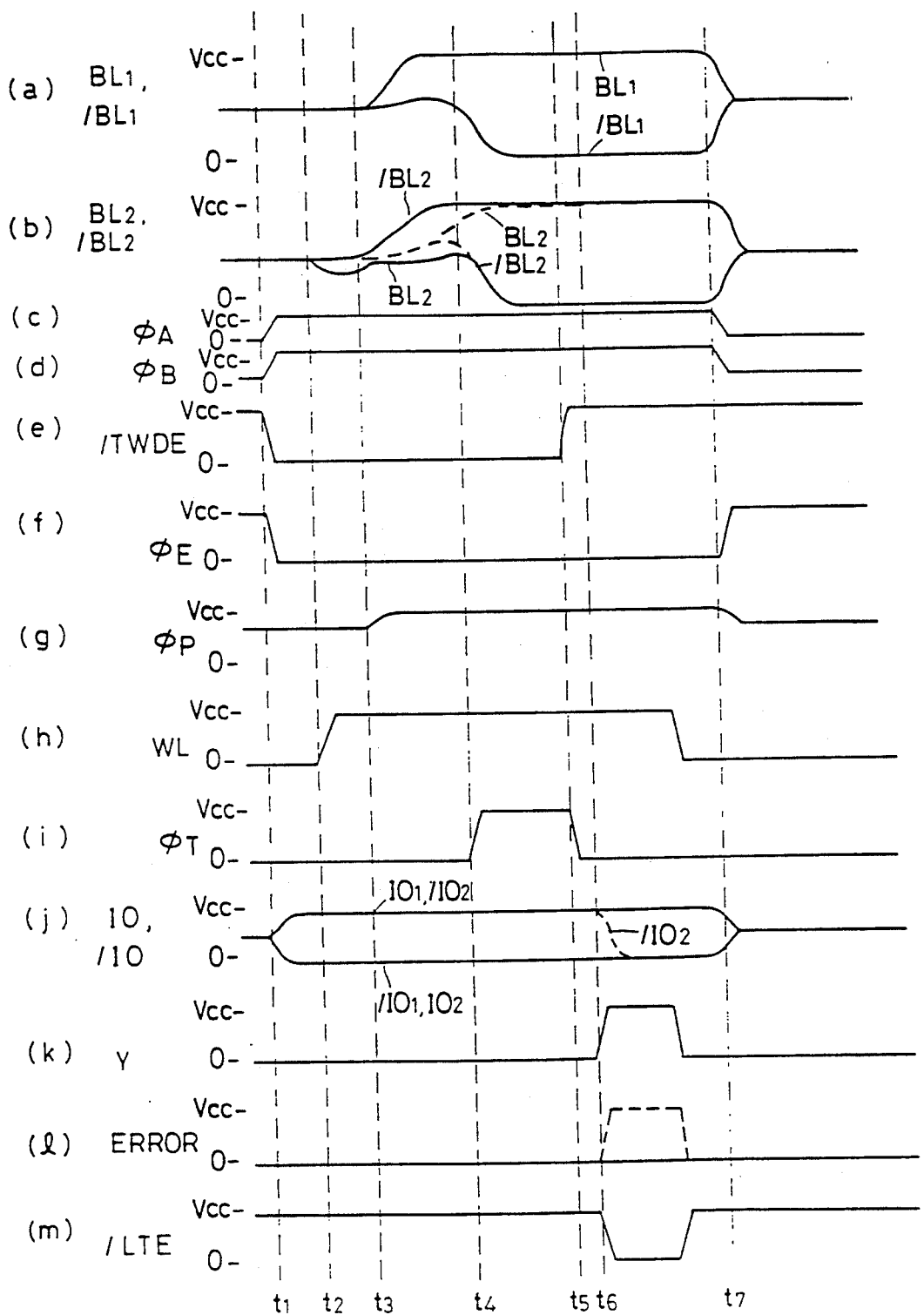
FIG. 14 is a signal waveform diagram showing an operation of the semiconductor memory device of another embodiment of the invention.

It is now assumed that when the data is read from memory cell MC2,1 which ought to store the data of "L", the potentials of bit line BL2 and complementary bit line /BL2 go to "H" and "L", respectively, as indicated by dashed line in FIG. 14. When all column selecting signals Yi go to "H" at time t6, transistors 62 and 63 become conductive, and latch nodes LN2 and /LN2 are connected to internal data transmitting lines IO2 and /IO2, respectively. In this operation, transistor 64 becomes conductive, and the potential of internal data transmitting line /IO2 which has been precharged to "H" is discharged to "L", so that both the potentials of internal data transmitting lines IO2 and /IO2 go to "L". Consequently, when test instructing signal /LTE lowers to "L", the output of NOR gate circuit 98 goes to "H", and output signal ERROR of OR gate 100 go to "H". Thereby, the malfunction occurred in a memory cell in one row is detected.

In the test operation described above, the data of "H" and the data of "L" are written in and read from the memory cells in the odd columns and the even columns, respectively. Of course, it can be easily understood that the test operation can be performed in a manner that the data of "L" and the data of "H" are written in and read from the memory cells in the odd columns and the even columns, respectively.

Further, it can be easily understood that the test can be performed in a manner that the same data of "H" or "L" is written in and simultaneously read from all the memory cells in one row.

There are provided two internal data transmitting line pairs IO1, /IO1 and IO2, /IO2. It also can be easily understood that, if there are provided more internal data transmitting line pairs, the test can be conducted in the memory cells in one row with the data having a pattern of, e.g., "00110011".

Further, following operations can be easily understood. Two internal data transmitting line pairs are provided. The data of a pattern of "1010 . . . " is written in the memory cells in the even rows, and the data of a pattern of "0101 . . . " is written in the memory cells in the odd rows. The test is conducted by reading the data of these patterns, whereby the test can be conducted, using the test pattern of a checker board. In this case, the writing of the respective data can be achieved by setting write data TD1 and TD2 at a desired pattern in the test data writing operation.

In the ordinary operations for writing and reading of data, selecting circuit 921 is driven, and test data input circuit 922 is inactivated. In this case, the data writing operation is carried out in accordance with the write enable signal /WDE, and data read reading operation is carried out by differential amplifier 111.

Figure 15A:
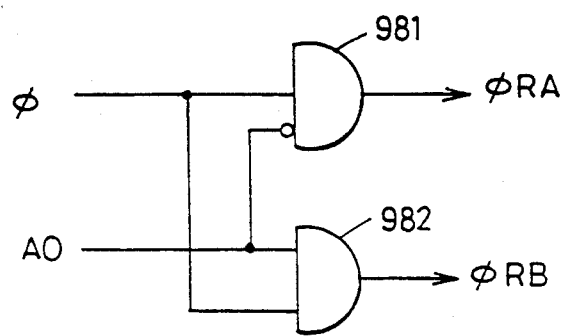
FIGS. 15A and 15B show a circuit construction for generating a selection control signal for a selecting circuit shown in FIG. 10 and an operation of the same, respectively.

FIG. 15A shows a circuit construction for generating the IO line selection control signals to selecting circuit 921. Selection control signal generator includes gate circuits 981 and 982, each of which receives a control signal $\phi$ and the least significant bit A0 of a column address. Gate circuit 981 receives at its true input control signal $\phi$ and at its false input the bit A0 of the column address. Gate circuit 982 receives at both of its true inputs the signal $\phi$ and the column address bit A0. Gate circuit 981 generates selection control signal $\phi RA$ for selecting internal data transmitting lines IO1 and /IO1. Gate circuit 982 generates selection control signal $\phi RB$ for selecting internal data transmitting lines IO2 and /IO2. Control signal $\phi$ is formed by an inverted signal of row address strobe signal /RAS or column address strobe signal /CAS. However, control signal $\phi$ may be a signal which is generated for a predetermined period in response to column address transition detecting signal ATD used to detect the transition of a column address signal.

Figure 15B:
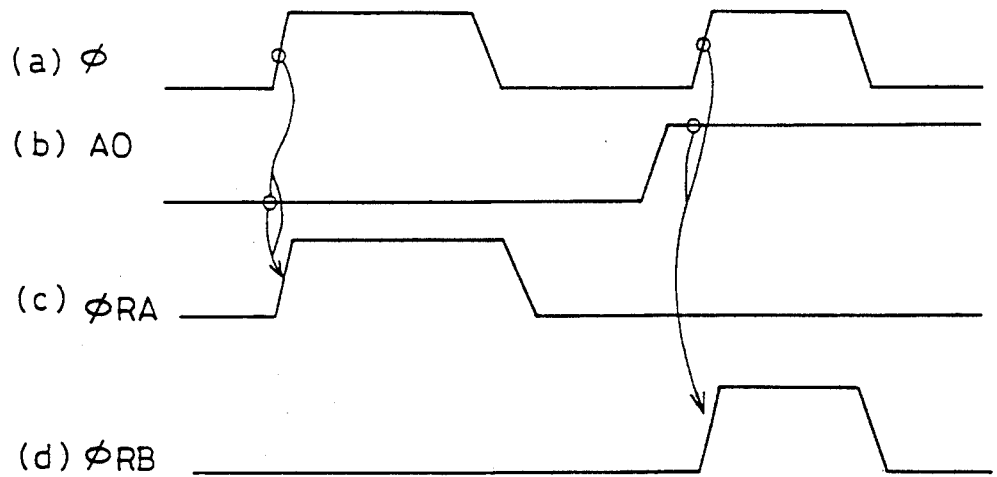

FIG. 15B is a waveform diagram showing an operation of the circuit shown in FIG. 15(A). As shown in FIG. 15B, upon rising of control signal $\phi$ to "H", one of selection control signals $\phi RA$ and $\phi RB$ is selected dependent on the value of the bit A0 of a column address. When the column address bit A0 is "0" ("L"), control signal $\phi RA$ is generated. When the bit A0 is "1" ("H"), selection control signal $\phi RB$ is generated. Thereby, a memory cell of one bit can be reliably accessed even if two internal data transmitting line pairs are provided.

Figure 16:
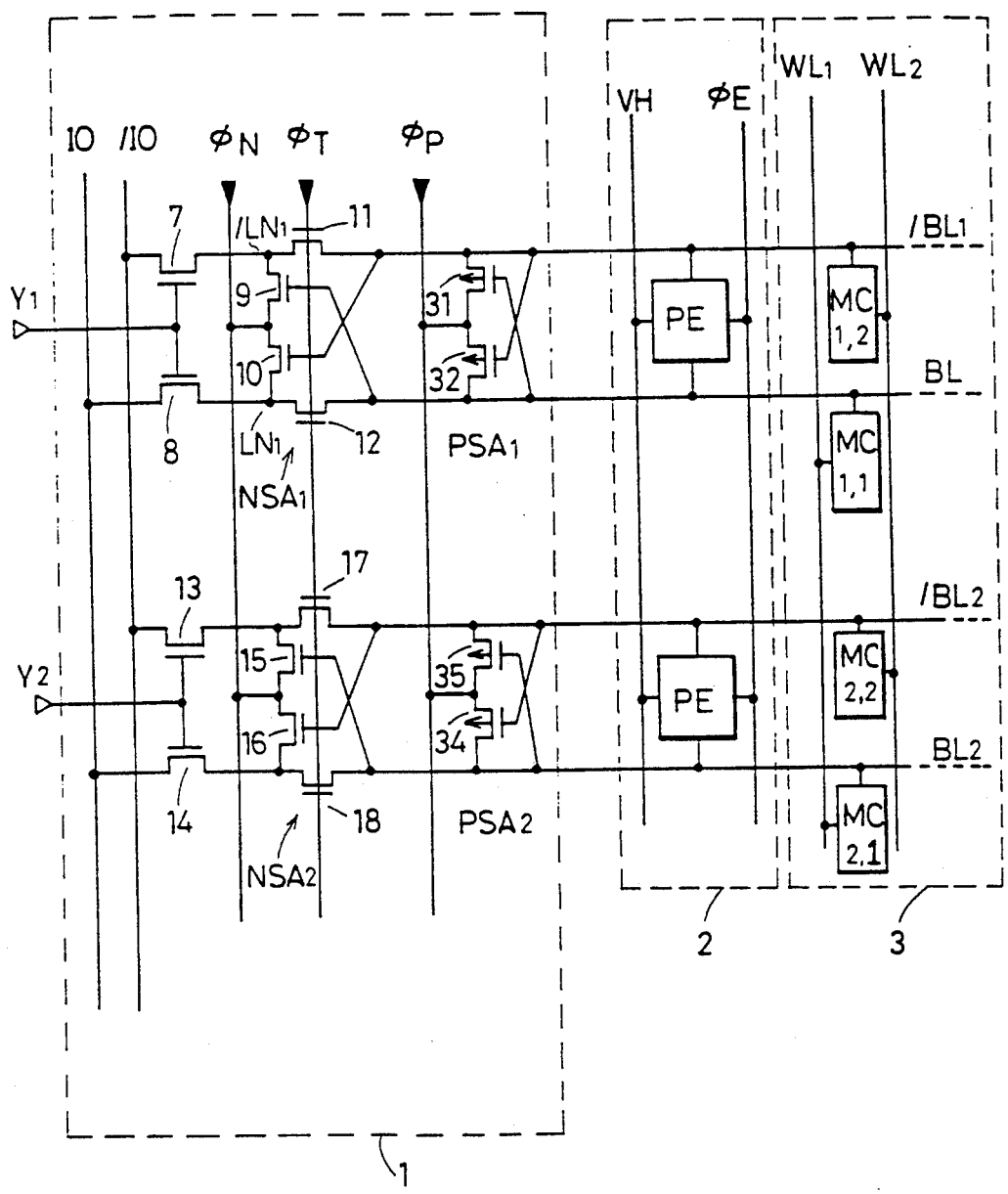
FIG. 16 shows a construction of a main part of a semiconductor memory device according to still another embodiment of the invention.

FIG. 16 shows a construction of a main part of the semiconductor memory device according to still another embodiment of the invention.

In the semiconductor memory device shown in FIG. 16, a control signal $\phi N$, instead of the ground potential, is applied to the source terminals of the transistors forming amplifier circuits NSA (NSA1, NSA2, . . . ) 16, which is different from the construction shown in FIG. 2. Signal $\phi N$ is used as the N-type sense amplifier drive signal. Then, the operation of the semiconductor memory device shown in FIG. 16 will be described with reference to a waveform diagram of FIG. 17.

At time t1, precharging/equalizing signal (precharge instructing signal) $\phi E$ lowers to "L", and bit line pairs BL1, /BL1 and BL2, /BL2 are set in the floating state at the intermediate potential. Control signal $\phi N$ is set at the ground potential level of "L".

At time t2, word line WL1 is selected to increase its potential, and nearly simultaneously, column selecting signal Y1 rises to "H". The rising of the potential of word line WL1 causes slight increase of the potentials of bit lines BL1 and BL2. It is assumed that both memory cells MC1,1 and MC2,1 have stored the data of "H".

When column selecting signal Y1 rises to "H" at time t2, column selecting gates 7 and 8 become conductive, so that latch nodes LN1 and /LN1 are connected to internal data transmitting lines IO and /IO. Thereby, the potential of internal data transmitting line IO becomes higher than that of internal data transmitting line /IO. The potential difference of internal data transmitting lines IO and /IO is detected by the output differential amplifier (see FIG. 3) and the data is read.

At time t3, column selecting signal Y1 is lowered to "L" to set column selecting gates 7 and 8 at the nonconductive state.

At time t4, signal $\phi N$ rises to Vcc level of "H". Control signal $\phi N$ is connected to the sources of transistors 9 and 10. Thereby, the source potentials of transistors 9 and 10 become higher than gate potentials thereof, so that amplifier circuits NSA1 and NSA2 are set at a waiting state or an inactive state.

At time t5, control signal $\phi T$ is raised to "H" to connect the latch nodes LN1 and /LN1 of amplifier circuit NSA to bit lines BL1 and /BL1, so that N-type sense amplifiers are connected to the associated bit line pairs.

At time t6, P sense amplifier drive signal $\phi P$ rises to "H", and control signal $\phi N$ lowers to "L". Thereby, P-type and N-type sense amplifiers operate in each bit line pair to amplify the potential difference in each bit line pair.

In order to write the data of "L" in memory cell MC1,1, column selecting signal Y1 is raised to "H" at time t7 again to connect internal data transmitting lines IO and /IO to bit line pair BL1 and /BL1. Thereby, the potentials of bit lines BL1 and /BL1 are set at "L" and "H", respectively.

Then, in order to read the data from memory cell MC2,1, column selecting signal Y1 is lowered to "L", and internal data transmitting line pair IO and /IO is precharged to the predetermined precharge potential. Then, at time t8, column selecting signal Y2 is set at "H". Thereby, bit lines BL2 and /BL2 are connected to internal data transmitting lines IO and /IO, so that the pull-up stage included in the load circuit sets the potential of internal data transmitting line IO at "H" and also sets the potential of internal data transmitting line /IO at "L". The operations for writing the data in memory cell MC1,1 and reading the data from memory cell MC2,1 are similar to the operations previously described with reference to FIG. 8.

At time t9, precharge instructing signal $\phi E$ rises to wait for the writing and reading operation of a next memory cell.

Figure 17:
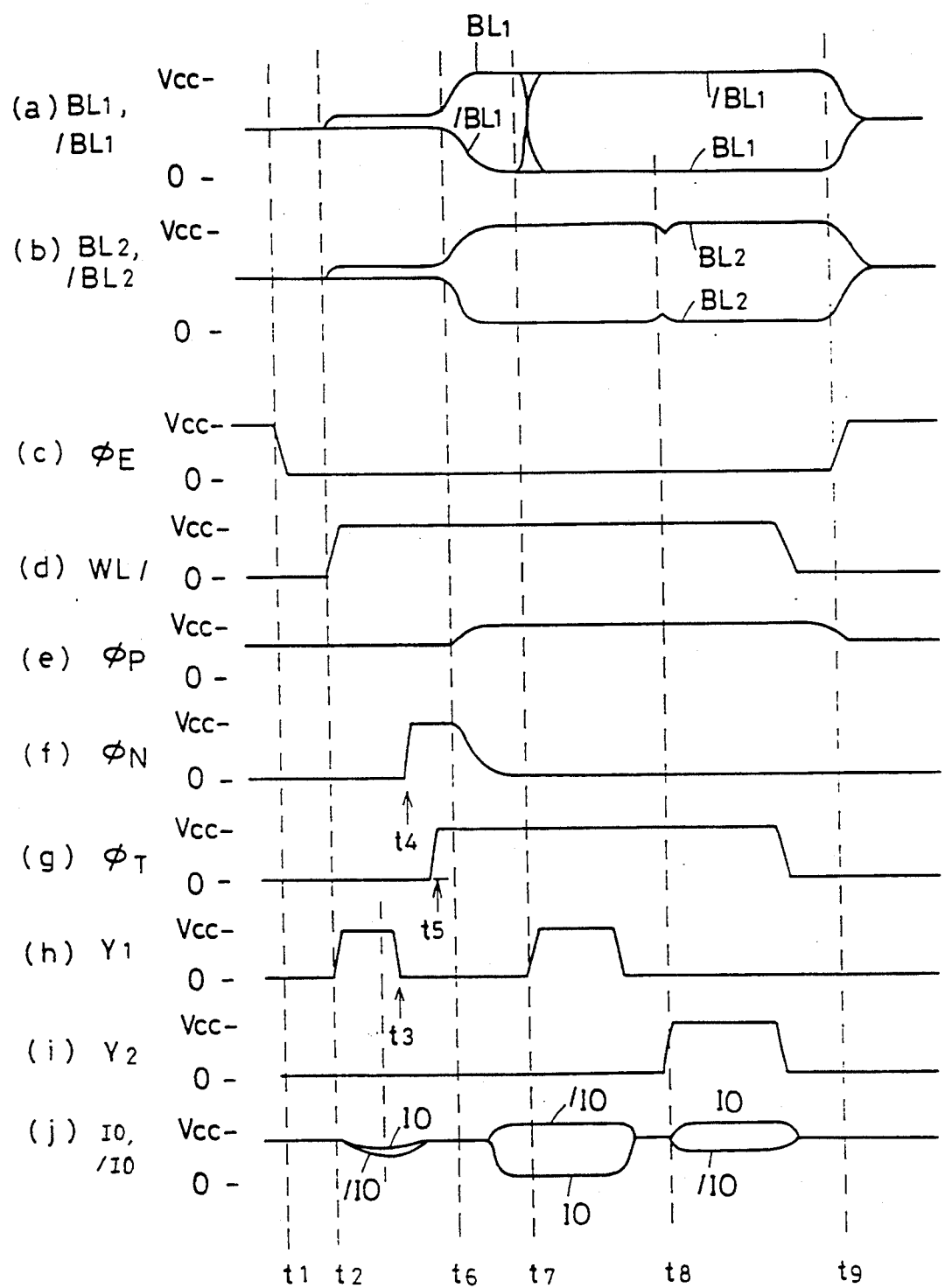
FIG. 17 is a signal waveform diagram showing an operation of the semiconductor memory device shown in FIG. 16.

Slow change of control signal $\phi N$ from "H" level to "L" level at time t6 shown in FIG. 17, improves the sensitivity of the N-type sense amplifiers, so that detection and amplification of a memory cell data can be surely conducted even if a very slight potential difference is generated due to an increased degree of integration. If the detection node and the latch node of the amplifier circuit were quickly connected at the point of time at which control signal $\phi T$ rises to "H", sense amplifier might not reliably detect the slight potential difference. In this case, even if control signal φT quickly rises, control signal φN has risen to "H" and then slowly lowers to "L", whereby the potential difference in a bit line pair can be reliably detected and amplified, even if the potential difference is very small.

In each embodiment described before, internal data transmitting line IO is connected to bit line BL and complementary internal data transmitting line /IO is connected to bit line /BL. Conversely, such a construction may be employed that internal data transmitting line IO is connected to complementary bit line /BL and complementary internal data transmitting line /IO is connected to bit line BL, so that data actually stored in the memory cells and external data Din and Dout are logically inverted. Further, such a construction may be employed that the data input terminal and the data output terminal are commonly used.

Highly integrated semiconductor memory devices of large storage capacities generally employ shared sense amplifier construction in which adjacent memory cell array blocks commonly use or share the sense amplifiers for reducing occupied chip area.

Figure 18:
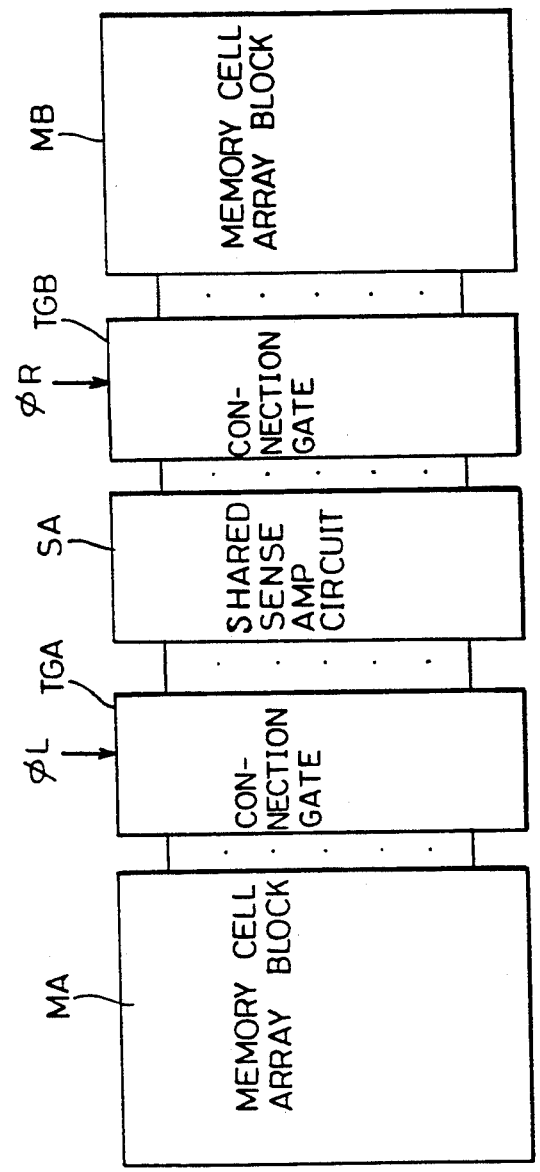
FIG. 18 shows a whole construction of a semiconductor memory device of a shared sense amplifier configuration.

FIG. 18 shows a construction of a semiconductor memory device of a conventional shared sense amplifier construction. Referring to FIG. 18, the semiconductor memory device of the conventional shared sense type includes memory cell array blocks MA and MB, a shared sense amplifier circuit SA arranged between memory cell array blocks MA and MB, a connection gate TG which is responsive to a block selecting signal φL to connect each column in memory cell array block MA to shared sense amplifier circuit SA, and a connection gate TGB which is responsive to block selecting signal φR to connect each column in memory cell array block MB to shared sense amplifier circuit SA. In operation, block selecting signals φL and φR operate to connect only one of memory cell array blocks to shared sense amplifier circuit SA for detecting and amplifying the potential of each column in a selected block. The configuration for common use of the sense amplifier and the input/output test gate of the invention may be applied to this conventional shared sense construction.

Figure 19:
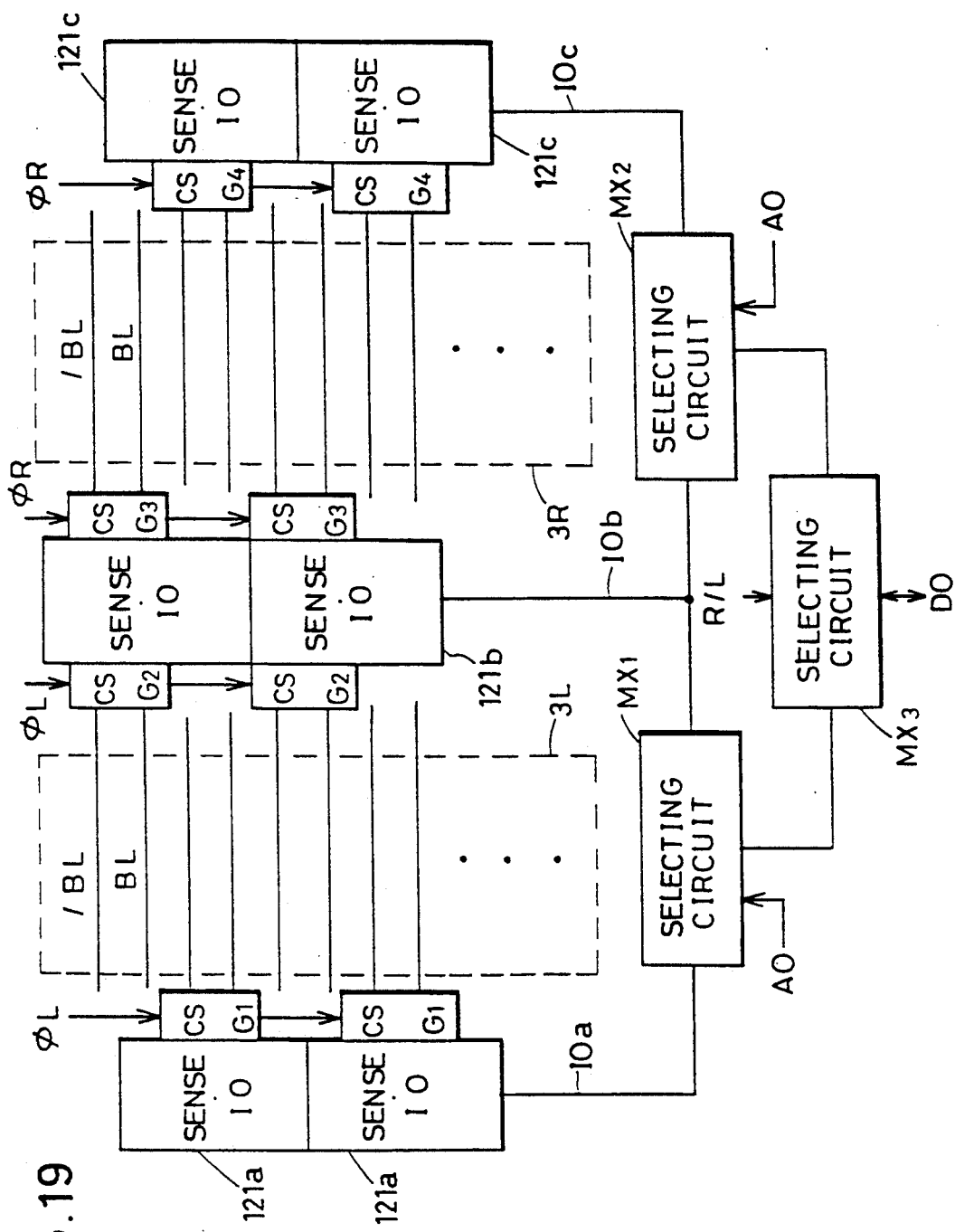
FIG. 19 shows a whole construction of a semiconductor memory device according to yet another embodiment of the invention.

FIG. 19 shows a whole construction of the semiconductor memory device according to yet another embodiment of the invention. In FIG. 19, the semiconductor memory device includes memory cell array blocks 3L and 3R, a sense IO gate 121a for connecting the even columns in memory cell array block 3L to internal data transmitting line IOa, column selecting gates CSG1 which are responsive to block selecting signal φL to connect the even columns in memory array block 3L to each respective sense IO gate 121a, a sense IO gate 121b which is provided for the odd columns in memory array blocks 3L and 3R, column selecting gates CSG2 which are responsive to block selecting signal φL to connect the odd columns in memory array block 3L to sense IO gate 121b, column selecting gates CSG3 which are responsive to block selecting signal φR to connect the odd columns in memory array block 3R to sense IO gate 121b, a sense IO gates 121c which is provided for the even columns in memory array block 3R, and column selecting gates CSG4 which are responsive to block selecting signal φR to connect the even columns in memory array block 3R to sense IO gate 121c.

The semiconductor memory device shown in FIG. 19 includes the sense IO gates located alternately in each memory array block. This construction is generally referred to as an alternately arranged shared sense amplifier construction. In this construction, one sense IO gate can be provided for two bit line pairs, so that the condition on the pitch of the sense IO gates can be relaxed, and thus a sufficient area can be utilized for the sense IO gates even in a highly integrated semiconductor memory device.

The semiconductor memory device shown in FIG. 19 further includes a selecting circuit MX1 for selecting one of sense IO gates 121a and 121b in response to the least significant column address bit A0, a selecting circuit MX2 which is responsive to the least significant column address bit A0 to select one of sense IO gates 121b and 121c, and a selecting circuit MX3 which is responsive to a block selecting bit (the most significant row address bit may be employed) R/L to select one of the blocks (selecting circuits MX1 and MX2). Input and output of the data are performed through selecting circuit MX3.

Figure 20:
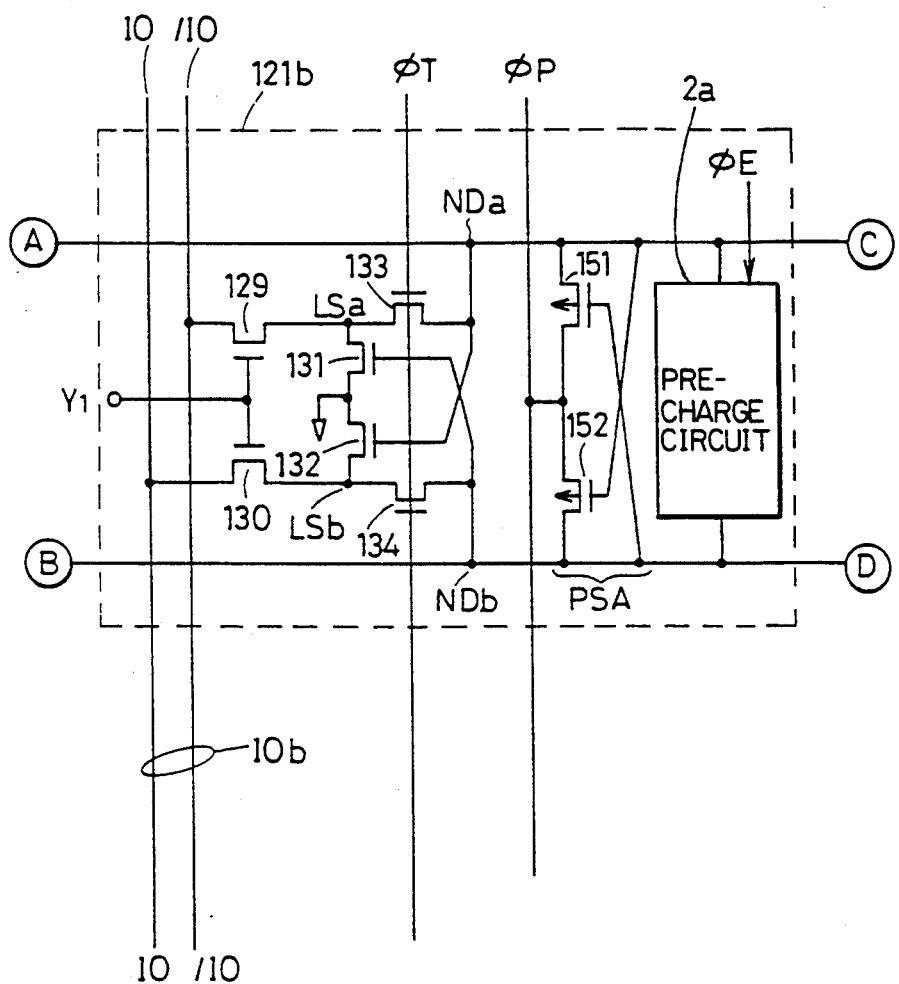
FIG. 20 shows a construction of sense·IO gate commonly used by adjacent memory arrays in the semiconductor memory device shown in FIG. 19.

FIG. 20 shows a specific construction of sense IO gate 121b shown in FIG. 19. Referring to FIG. 20, sense IO gate 121b includes a P-type sense amplifier PSA formed of a pair of cross-coupled p-channel MOS transistors 151 and 152, and a precharging circuit 2a for precharging and equalizing the potentials of nodes NDa and NDb to a predetermined potential (VH). Precharging circuit 2a has the same construction as precharging/equalizing circuit (PE) included in precharging/equalizing circuit described previously (see, e.g., FIG. 11).

Sense IO gate 121b further includes separating means formed of n-channel MOS transistors 133 and 134 for connecting nodes NDa and NDb respectively to latch nodes LSa and LSb in response to control signal φT, n-channel MOS transistors 131 and 132 which detect the potentials of nodes NDa and NDb and latches the detected potentials at nodes LSa and LSb, and column selecting gates of n-channel MOS transistors 129 and 130 which are responsive to a column selecting signal Yi to connect latch nodes LSa and LSb to internal data transmitting lines IOb (/IO and IO). One conduction terminal of each of transistors 131 and 132 is connected to ground potential Vss.

Figure 21:
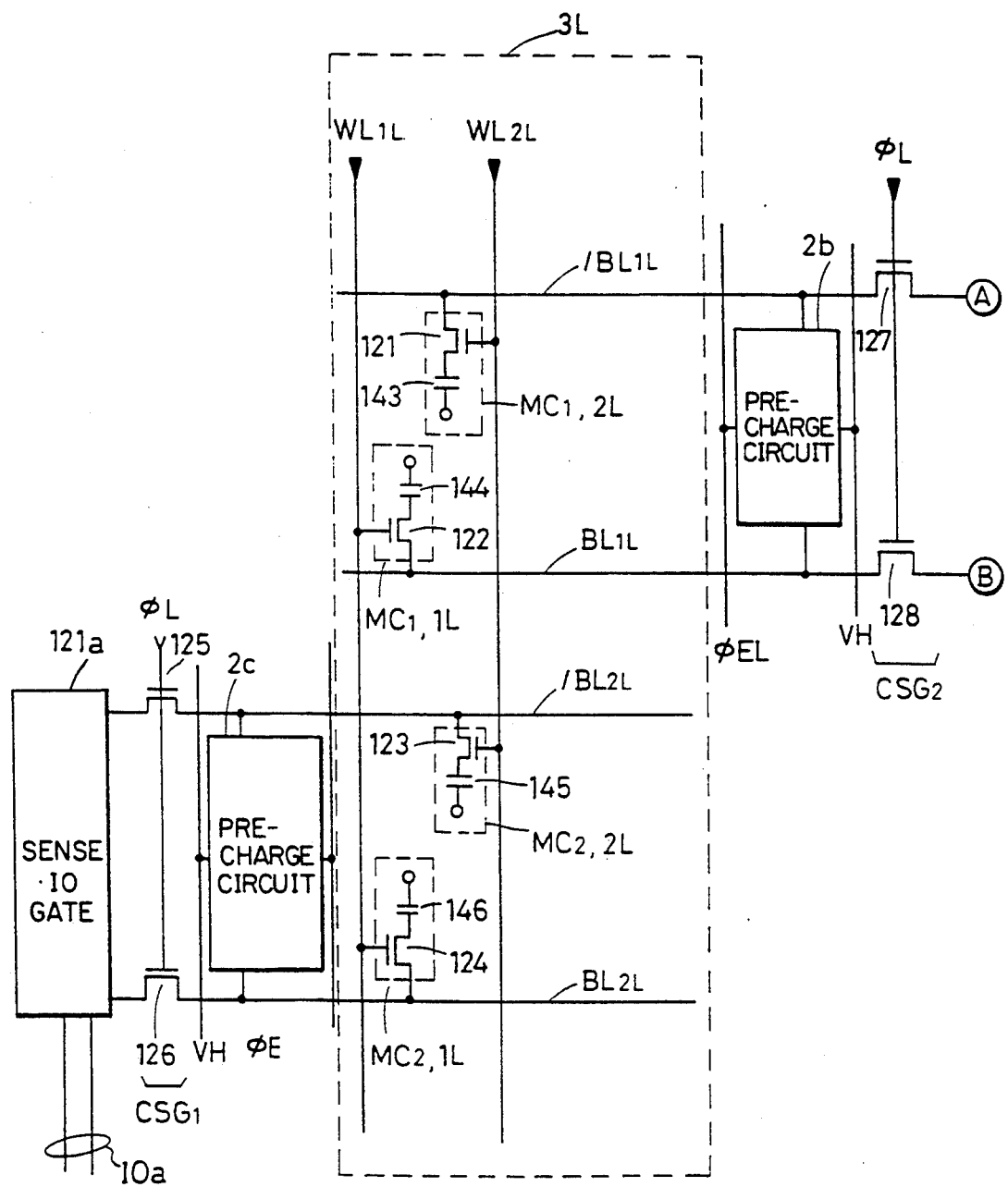
FIG. 21 shows a specific construction of the left memory cell array part shown in FIG. 19.

FIG. 21 shows a construction of array block 3L and sense IO gate 121a of semiconductor memory device shown in FIG. 19. Memory array block 3L representatively includes bit line pairs BL1L, /BL1L and BL2L, /BL2L as well as word lines WL1L and WL2L. Memory cells are arranged corresponding to the points at which word lines WL1L and WL2L intersect bit line pair BL1L and /BL1L and bit line pair BL2L and /BL2L. Memory cells MC1,1L and MC2,1L are arranged corresponding to the intersection of word line WL1L and bit line BL1L and to the intersection of word line WL1L and bit line BL2L, respectively. Memory cells MC1,2L and MC2,2L are arranged corresponding to the intersection of word line WL2L and complementary bit line /BL2L and to the intersection of word line WL2L and complementary bit line /BL2L, respectively.

Each transistor memory cell MC includes one transmission gate and one capacitor. For bit line pair BL1L and BL1L, there is provided a precharging circuit 2b which precharges and equalizes the potentials of bit lines BL1L and /BL1L to predetermined potential (VH). For bit line pair BL2L and /BL2L, there is provided a precharging circuit 2c. Precharging circuits 2b and 2c are responsive to a precharge instructing signal φEL to precharge a corresponding bit line pair to predetermined potential VH. When memory cell array 3L is not selected, precharge instructing signal φEL is normally in a state of "H", so that memory cell array block 3L is maintained at the precharged state.

Sense IO gate 121a is provided for bit lines BL2L and /BL2L of even columns. Selecting gate CSG1 is arranged between sense IO gate 121a and bit line pair BL2L and /BL2L. selecting gate CSG1 includes n-channel MOS transistors 125 and 126 which become conductive in response to block selecting signal φL. Block selecting gate CSG1 operates to connect bit line pair BL2L and /BL2L to the detection nodes NDb and NDa of sense IO gate 121a, respectively.

For bit line pair BL1L and /BL1L, there is provided column block selecting gate CSG2. Column block selecting gate CSG2 includes n-channel MOS transistors 127 and 128 which become conductive in response to block selecting signal φL. When column block selecting gate CSG2 becomes conductive, it connects bit lines BL1L and /BL1L to nodes NDb and NDa of sense IO gate 121b.

Precharge instructing signal φEL is formed from block selecting signal φL and precharge instructing signal φE. When block selecting signal φL is "L", precharge instructing signal φEL is maintained at "H", and precharging circuits 2c and 2b perform precharging/equalizing operation. When block selecting signal φL goes to "H", precharge instructing signal φEL allows passage of precharge instructing signal φE as received. Thereby, precharging circuits 2b and 2c complete precharging operation.

Figure 22:
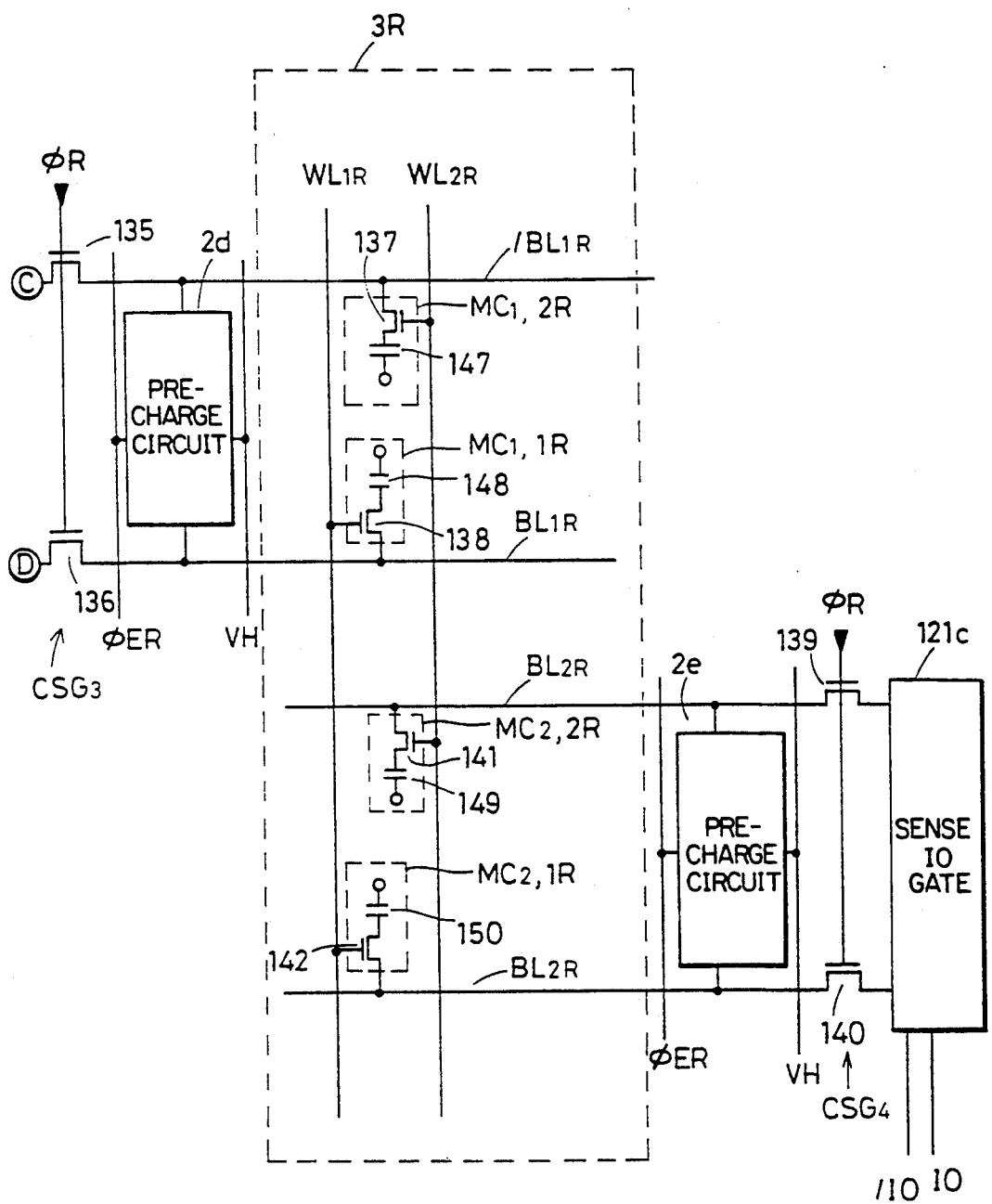
FIG. 22 shows a specific construction of the right memory cell array part shown in FIG. 19.

FIG. 22 shows a circuit portion of memory array block 3R. In FIG. 22, the portion for two columns is representatively shown. In FIG. 22, memory array block 3R includes bit line pairs BL1R, /BL1R and BL2R, /BL2R as well as word lines WL1R and WL2R. Memory cells MC1,1R and MC2,1R are arranged corresponding to the intersections of word line WL1R and bit lines BL1R and BL2R, respectively. Memory cells MC1,2R and MC2,2R are arranged corresponding to the intersections of word line WL2R and complementary bit lines /BL1R and /BL2R. Each memory cell MC comprises a construction of dynamic memory cell of one-transistor/one-capacitor type.

A precharging circuit 2d is provided for bit line pair BL1R and /BL1R, and a precharging circuit 2e is provided for bit line pair BL2R and /BL2R. Precharging circuits 2d and 2e are responsive to precharge instructing signal φER to precharge and equalize the corresponding bit line pairs to predetermined potential (VH). Block selecting gate CSG3 is provided for bit lines pair BL1R and /BL1R. Block selecting gate CSG3 includes n-channel MOS transistors 136 and 135, which are responsive to block selecting signal φR to become conductive and connect bit lines BL1R and /BL1R to nodes NDb and NDa of sense IO gate 121b shown in FIG. 20.

For bit line pair BL2R and /BL2R, there is provided block selecting gate CSG4. Block selecting gate CSG4 includes n-channel MOS transistors 139 and 140 which are responsive to block selecting signal φR to become conductive and connect bit lines BL2R and /BL2R to sense IO gate 121c. Precharge instructing signal φER is formed from block selecting signal φR and precharge instructing signal φE. When block 3R is selected, precharge instructing signal φER goes to "L", and precharging circuits 2d and 2e complete precharging and equalizing operation. When memory array block 3R is in the nonselected state, precharge instructing signal φER is "H", and precharging circuits 2d and 2e continue the precharging operation.

Figure 23:
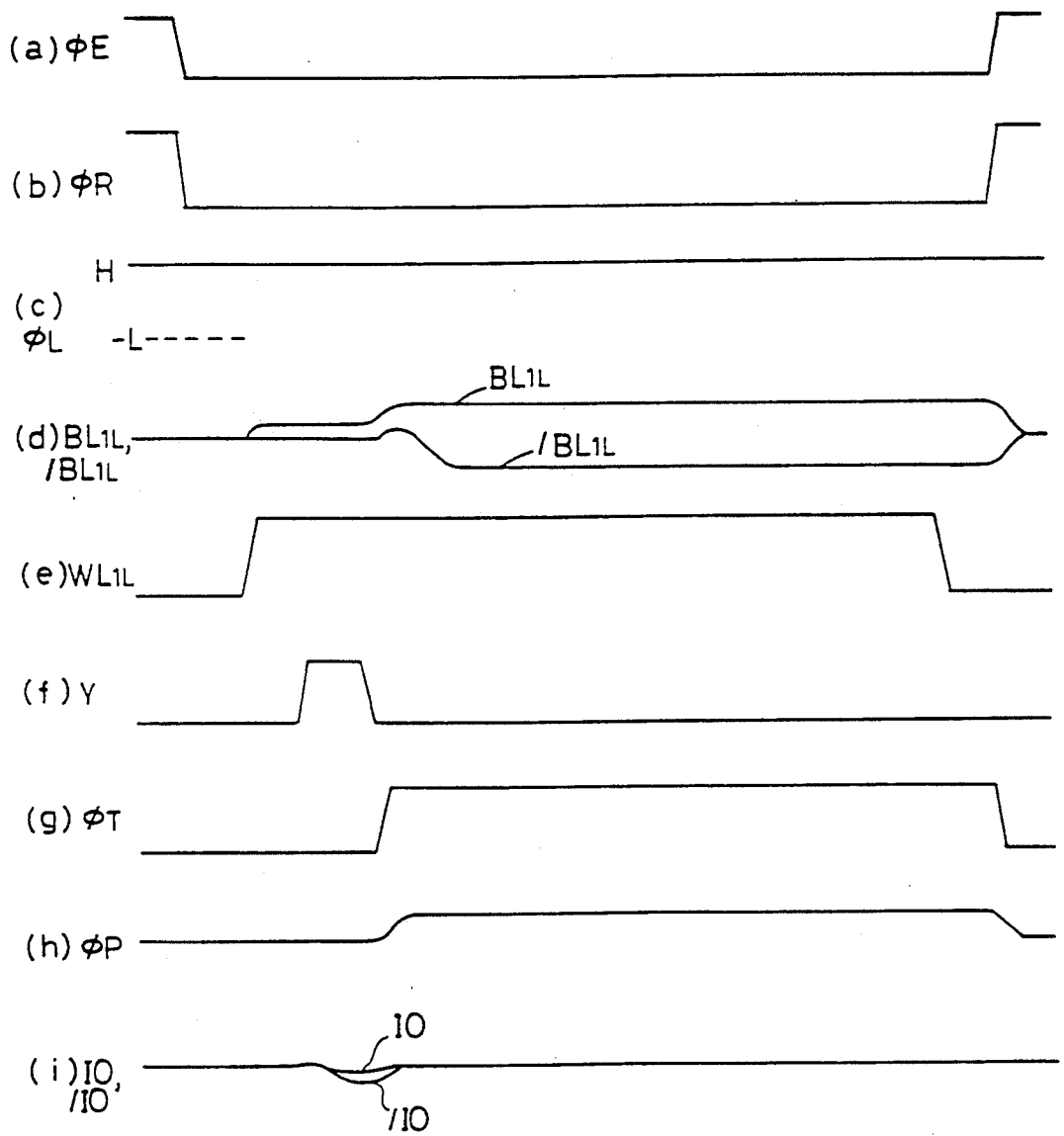
FIG. 23 is a signal waveform diagram showing an operation of the device shown in FIGS. 19 through 22.

Sense IO gates 121a, 121b and 121c have the same construction with each other. Block selecting signals φR and φL are formed based on, e.g., the most significant bit of a row address signal. Now, description will be made with respect to the operation for reading the data of "H" stored in memory cell MC1,1L included in memory cell array block 3, with reference to FIG. 23.

Precharge/equalize signal φE goes to "L", and a memory cycle starts. Upon application of a row address signal, the most significant bit of the row address signal is assumed to select memory array block 3L. Then, block selecting signal φR goes to "L", and memory cell array block 3R is electrically separated from sense IO gates 121b and 121c. The precharged state is maintained in memory array block 3R.

Meanwhile, in memory cell array block 3L, block selecting signal φL is maintained in the state of "H", and each bit line pair in memory array block 3L is maintained to be connected to sense IO gates 121a and 121b.

Then, the potential of word line WL1L is raised to "H" by an output of the row decoder. Thereby, the data stored in memory cells MC1,1L and MC2,1L are read to bit lines BL1L and BL2L, respectively. The potential of bit line BL1L slightly increases. Simultaneously with or immediately after the increase of the potential of word line WL1L, column selecting signal Y1 is raised to "H". The separation control signal φT is in the state of "L". Latch nodes LSa and LSb are connected to internal data transmitting lines /IO and IO (IOa and IOb), respectively.

Node NDb receives the potential of bit line BL1L. Node NDa has the same potential as complementary bit line /BL1L. Thereby, the conductivity of transistor 131 becomes higher than that of transistor 132. Consequently, the potential of internal data transmitting line IO becomes higher than the potential of internal data transmitting line /IO. Differential amplifier (see, e.g., FIG. 3) connected to these internal data transmitting lines IO and /IO (IOa and IOb) detects that the information which has been written in memory cell MC1,1L is "H". In this manner, the data of "H" is read.

Then, the column select signal Y1 turns to "L" to isolate the bit lines BL1L and /BL1L from the lines IO and /IO. After the falling of the column select signal Y1, the isolation control signal φT and P sense amplifier activating signal φP rise to "H". As a result, P sense amplifier PSA and the cross couple type n sense amplifier (transistors 131, 132, 133 and 134) are activated to differentially amplify the potentials on the bit lines BL1L and /BL1L. Data of "H" potential is rewritten into the memory cell MC1, 1L for restoring the read out data.

In a case that selected memory cell MC1,1L has stored the data of "L", the reading operation is carried out in a similar manner and "L" data is read out at a high speed. Also in the operation for writing the data in memory cell MC1,1L, writing of the data in the selected memory cell included in the selected memory array block is carried out in a manner similar to those previously described with reference to FIGS. 9, 14 and 17.

According to the construction of this shared sense IO gate of the alternate arrangement type, a line test circuit may be arranged between selecting circuits MX1 and MX2, and sense IO gates 121a, 121b and 121c in the construction shown in FIG. 19, so that the construction for conducting the test of the memory cells in one row in a memory array block can be obtained. In this case, it can be easily understood that the data having various data patterns can be written and read in one memory array block. Differential amplifiers for outputting the data may be provided in each of internal data transmitting line pairs IOa, IOb and IOc.

Figure 24:
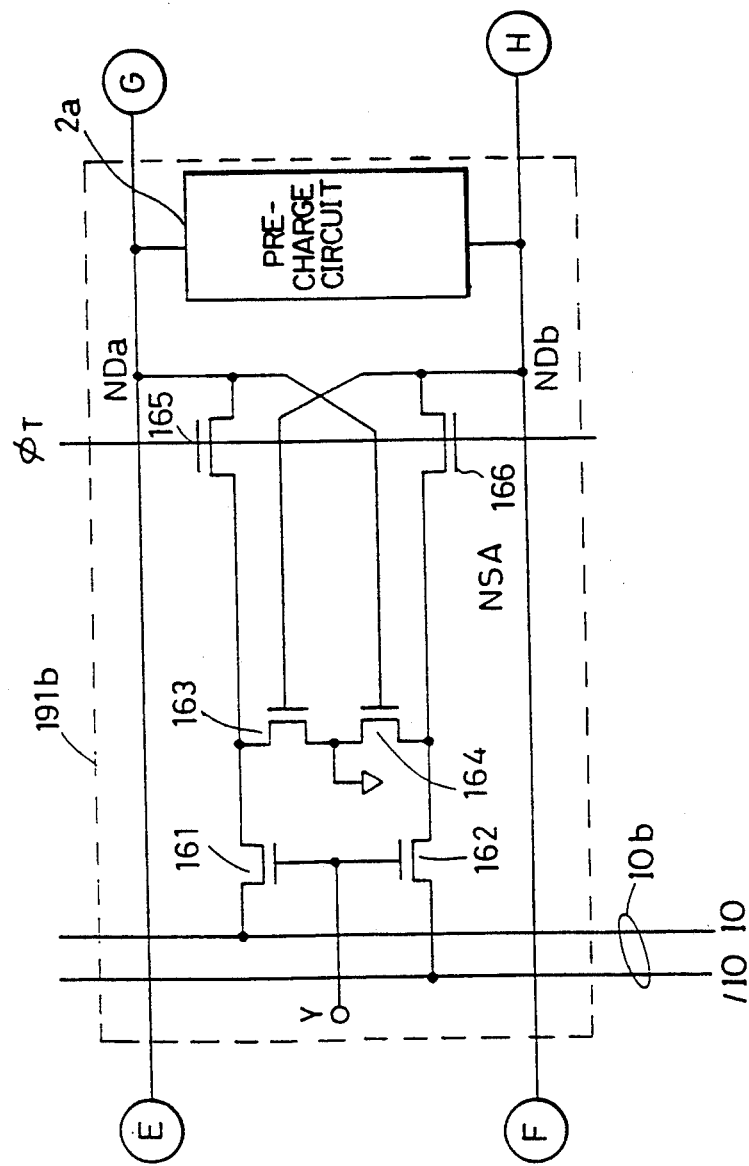
FIG. 24 shows a construction of a shared sense part in a modification of a semiconductor memory device of the shared sense amplifier configuration according to the invention.
Figure 25:
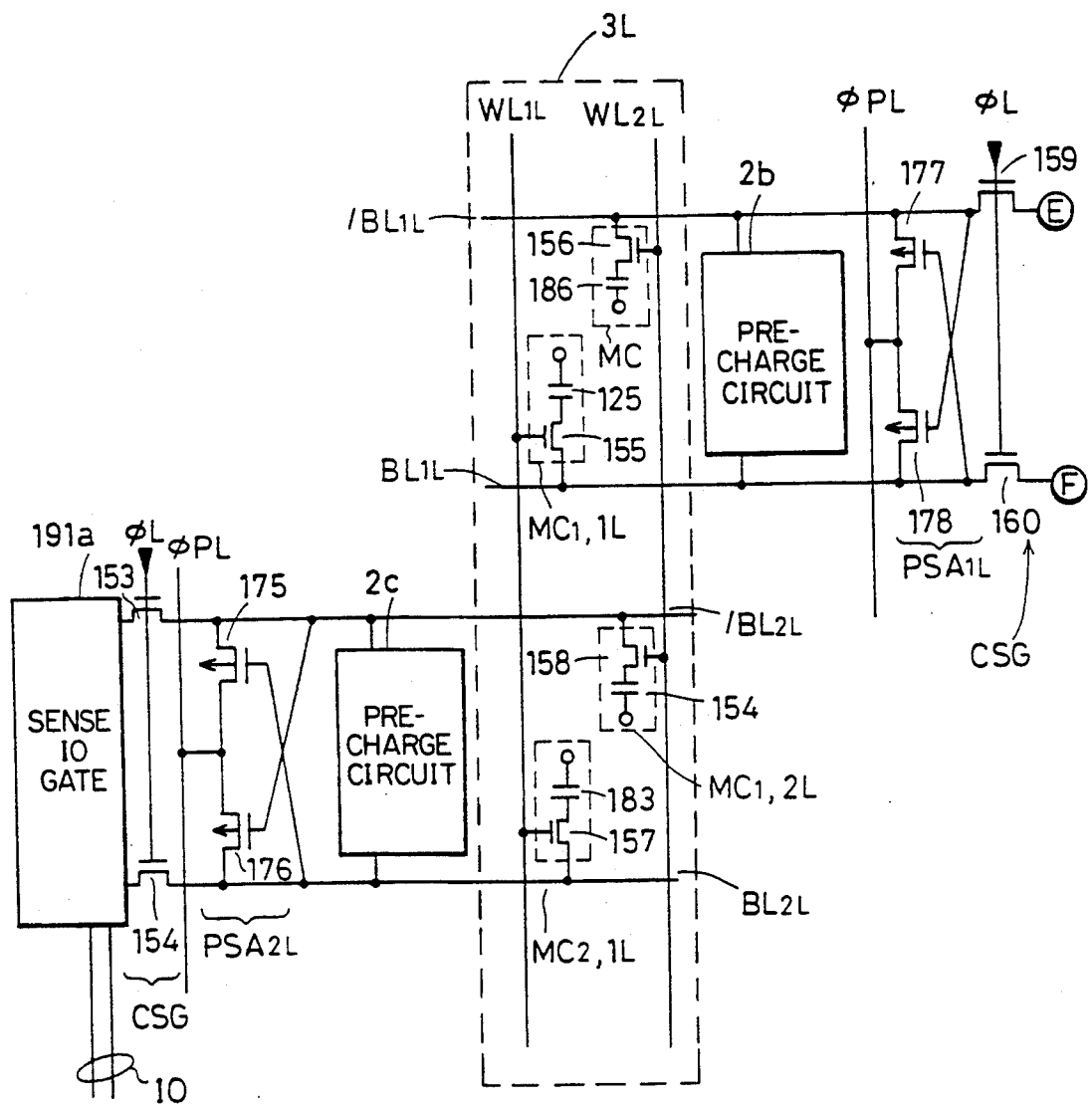
FIG. 25 shows a specific construction of the left memory array part in the modification of a semiconductor memory device of a shared sense amplifier configuration according to the invention.
Figure 26:
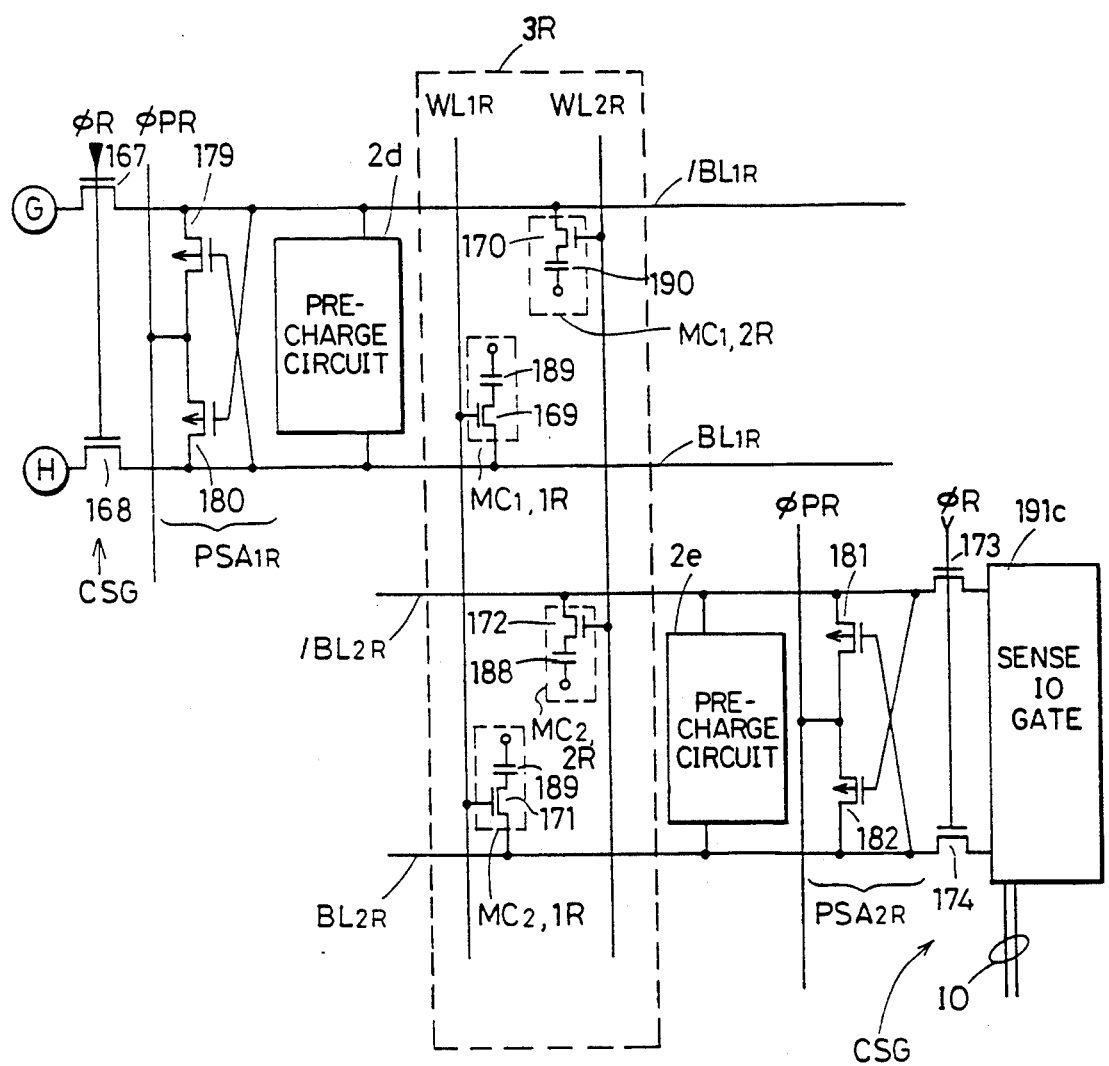
FIG. 26 shows a construction of the right memory array part in the modification of the semiconductor memory device of a shared sense amplifier configuration according to the invention.

FIGS. 24 through 26 show constructions of a main part of a semiconductor memory device according to further another embodiment of the invention. Constructions in FIGS. 24 through 26 correspond to those in FIGS. 20 through 22.

Referring to FIG. 24, sense IO gate 191b has a construction similar to that of the sense IO gate shown in FIG. 20, except that P-type sense amplifier PSA is not provided. Thus, sense IO gate 191b includes only amplifier circuit NSA, which can operate as N-type sense amplifier and also can operate as the read gate, and precharging circuit 2a.

FIG. 25 shows a construction corresponding to memory array block 3L, in which the nodes E and F are connected to the nodes E and F in FIG. 24, respectively. In the construction shown in FIG. 25, the arrangement that the precharging circuit and the P-type sense amplifier are provided for each bit line pair is different from the construction shown in FIG. 21. More specifically, precharging circuit 2b and P-type sense amplifier PSA1L are provided for bit line pair BL1L and BL1L, and a precharging circuit 2c and a P-type sense amplifier PSA2L are provided for bit lines BL2L and /BL2L.

Sense IO gate 191a has the same construction as gate 191b shown in FIG. 24.

FIG. 26 shows a construction for memory cell array block 3R. The nodes G and H in FIG. 26 are connected to the nodes G and H in FIG. 24. Also in the construction shown in FIG. 26, the precharging circuit and the P-type sense amplifier are provided for each bit line pair in memory array block 3R, similarly to the construction shown in FIG. 25. A precharging circuit 2d and a P-type sense amplifier PSA1R are provided for bit line pair BL1R and /BL1R, and a precharging circuit 2e and a P-type sense amplifier PSA2R are provided for bit line pair BL2R and /BL2R. Sense IO gate 191c has the same construction as sense IO gate 191b shown in FIG. 24.

In order to write a data of a full "H" level (i.e., the level of supply voltage Vcc) in a memory cell MC, it is necessary to sufficiently charge the bit line (BL or /BL) connecting to a selected memory cell MC to the level of the supply voltage Vcc. The charging of the bit line to "H" level is carried out by the P-type sense amplifier.

In the construction shown in FIGS. 20 through 22, "H" level detected and amplified by P-type sense amplifier PSA is transmitted through block selecting gate CSG to the corresponding bit line. In order to transmit the potential at the level of supply voltage Vcc to the corresponding bit line, it is necessary to boost up block selecting signal φR or φL to the level of Vcc+Vth, wherein Vth is a threshold voltage of the MOS transistor forming the block selecting gate.

In a highly integrated semiconductor memory device having a large storage capacity, transistors have smaller sizes, so that smaller voltages applied thereto are preferred in view of breakdown characteristics. Further, in order to achieve a signal of the increased level of Vcc+Vth, a boosting circuit is generally required. However, usage of such boosting circuit is not preferable, in view of the reduction of the occupied chip area and power consumption.

In the construction in FIGS. 24 through 26, P-type sense amplifier is provided for each bit line pair. This ensures the raising of the potential of the bit line to the level of the supply voltage Vcc without a signal loss at the block selecting gate.

The semiconductor memory device shown in FIGS. 24 through 26 operates in a manner similar to the operation described previously with reference to FIGS. 20 through 22, except that P-type sense amplifiers operate only in a selected memory array block.

Figure 27:
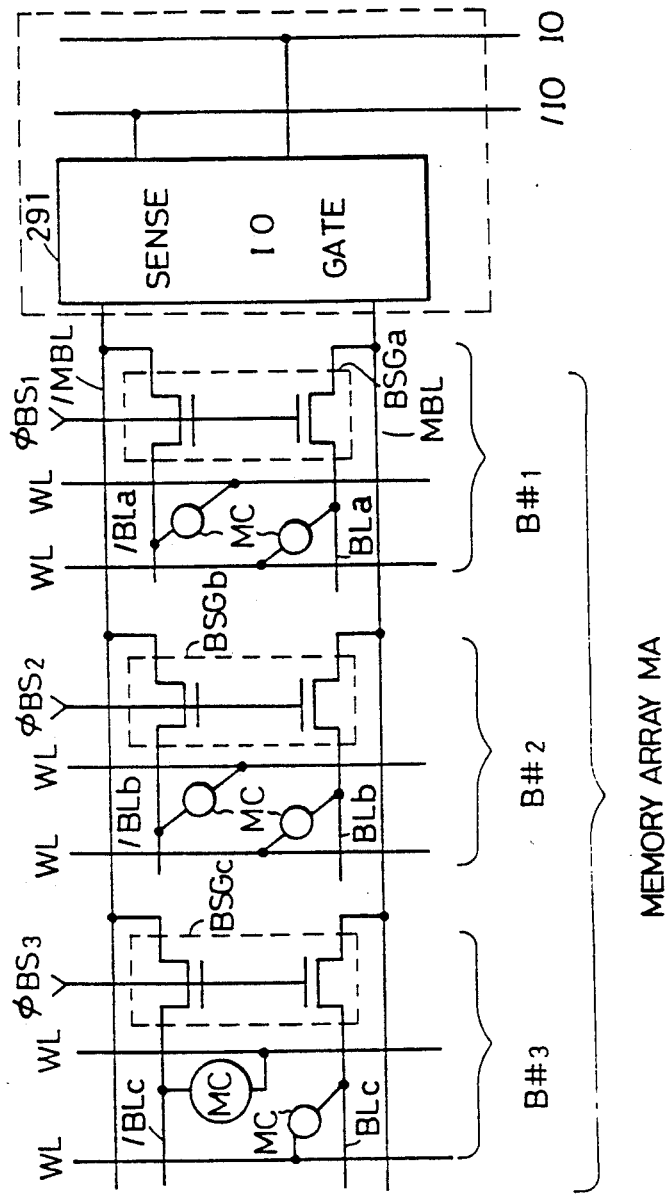
FIG. 27 shows a construction of a main part of a semiconductor memory device according to further another embodiment of the invention.
Figure 28:
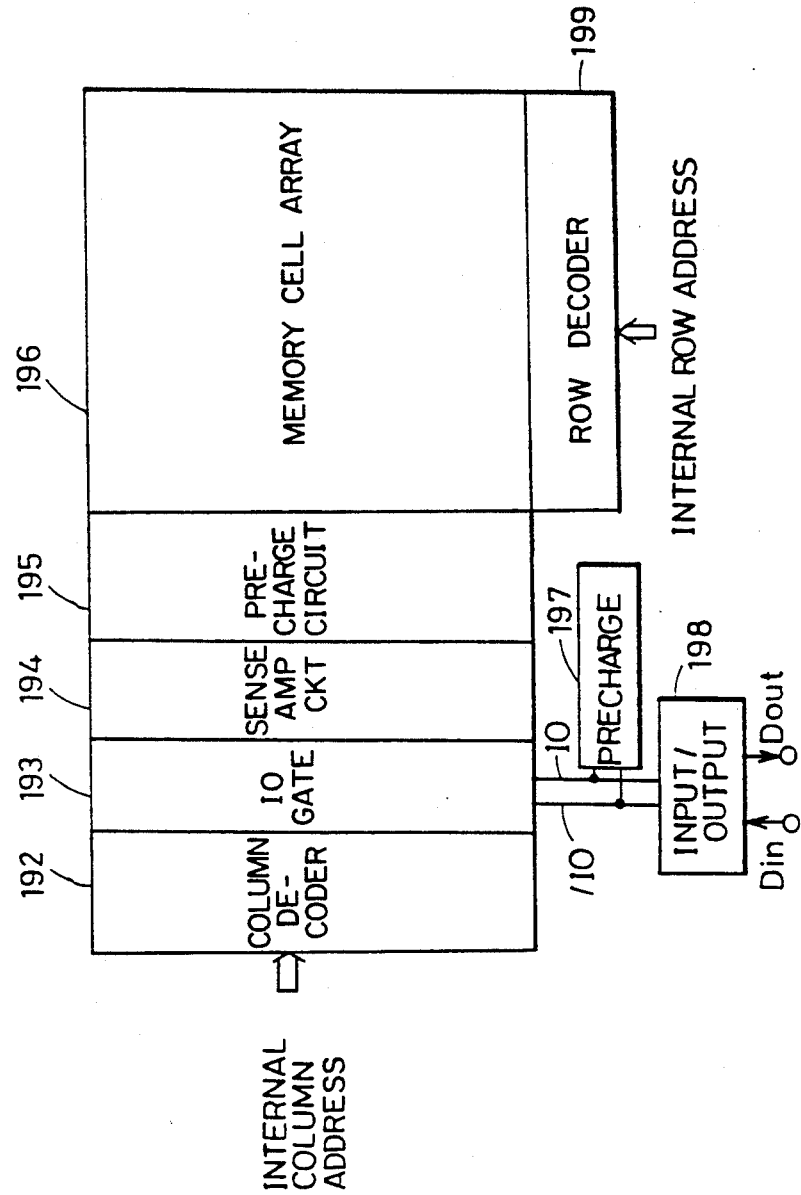
FIG. 28 is a block diagram schematically showing a whole construction of a conventional semiconductor memory device.
Figure 29:
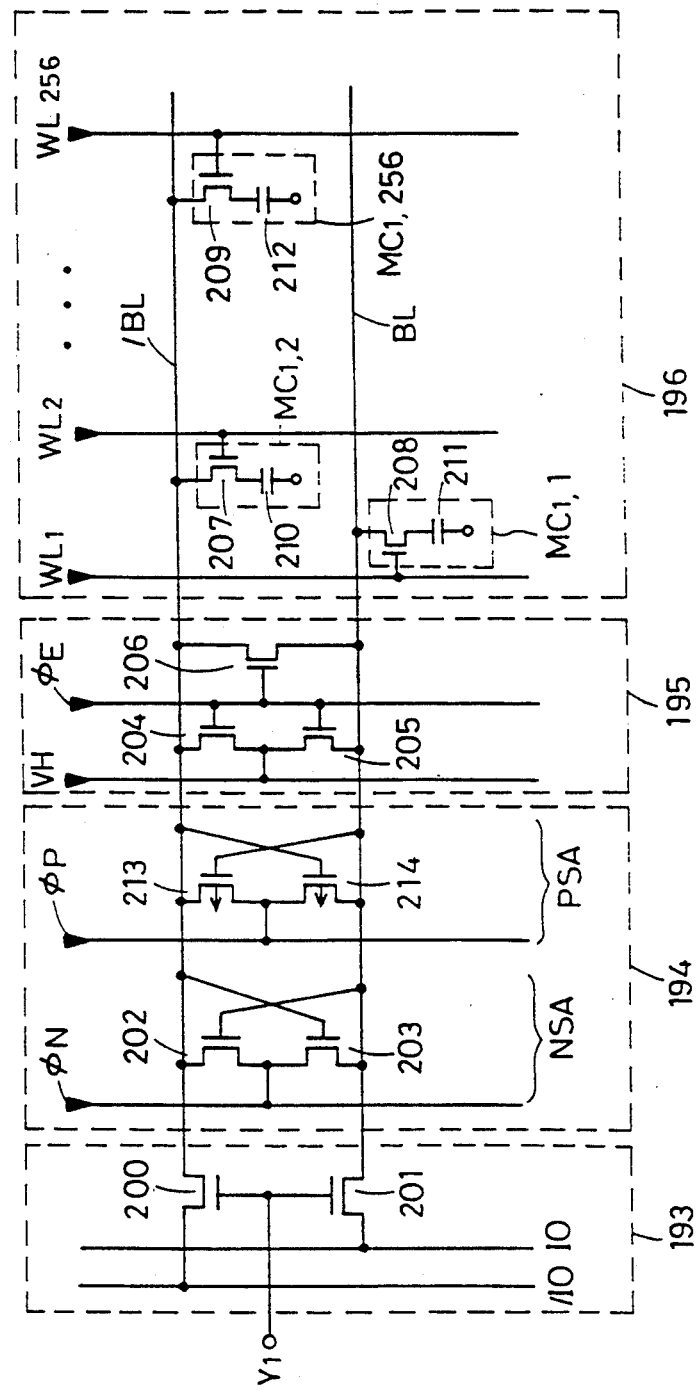
FIG. 29 shows a construction of a main part of the semiconductor memory device shown in FIG. 28.
Figure 30:
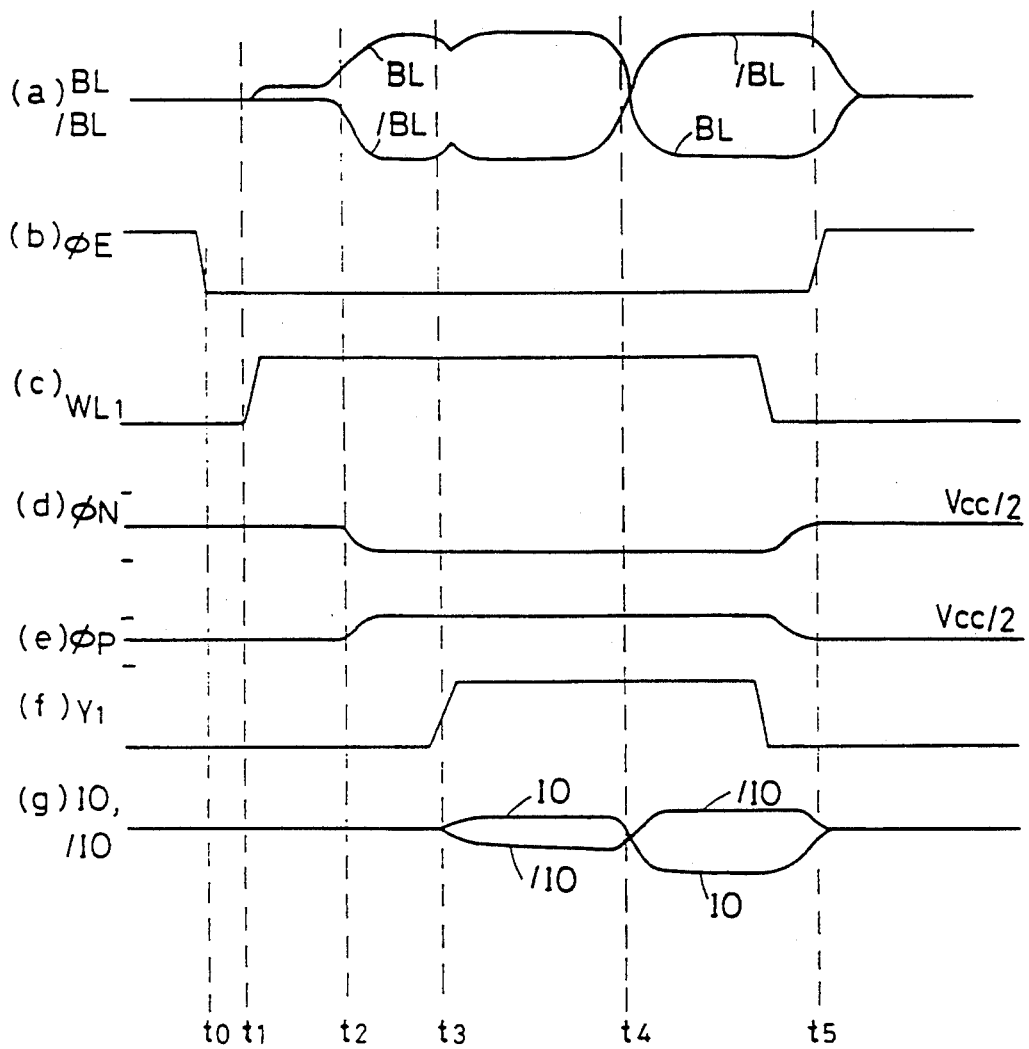
FIG. 30 is a signal waveform diagram showing an operation of the conventional semiconductor memory device.
Figure 31:
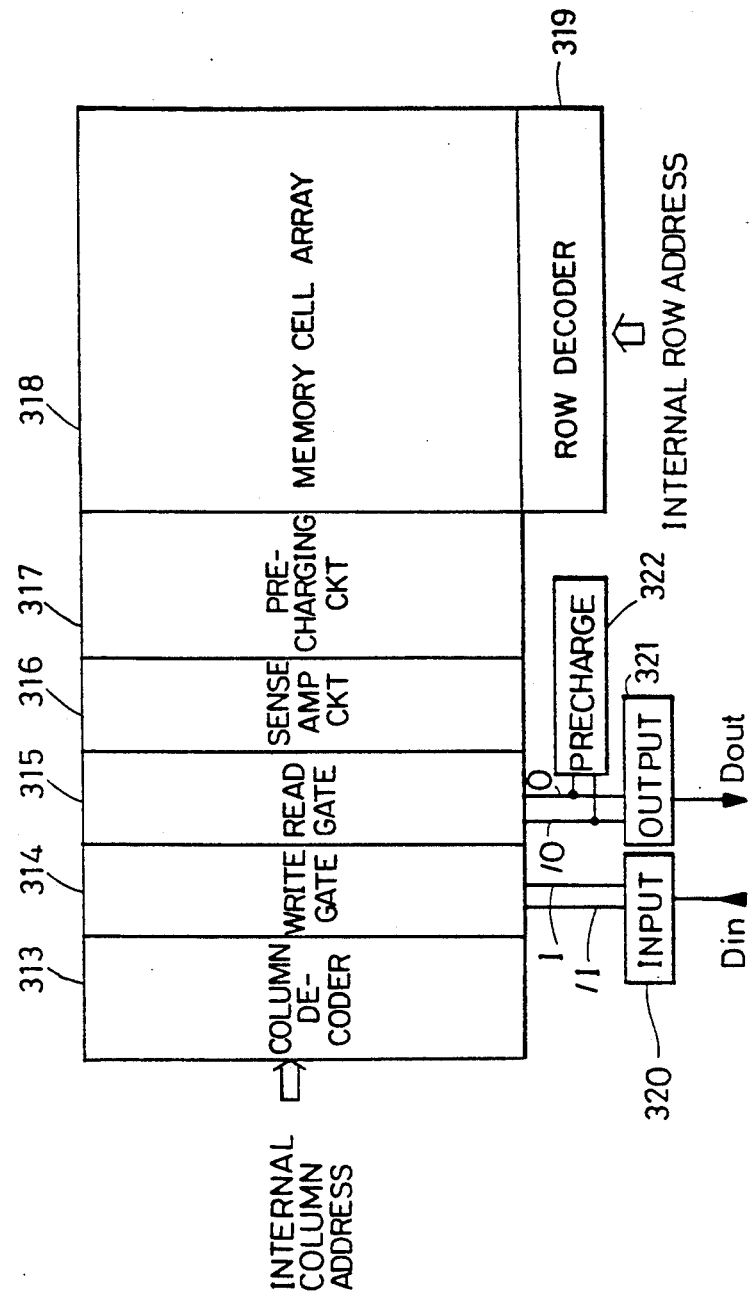
FIG. 31 shows another example of a construction of a conventional semiconductor memory device.
Figure 32:
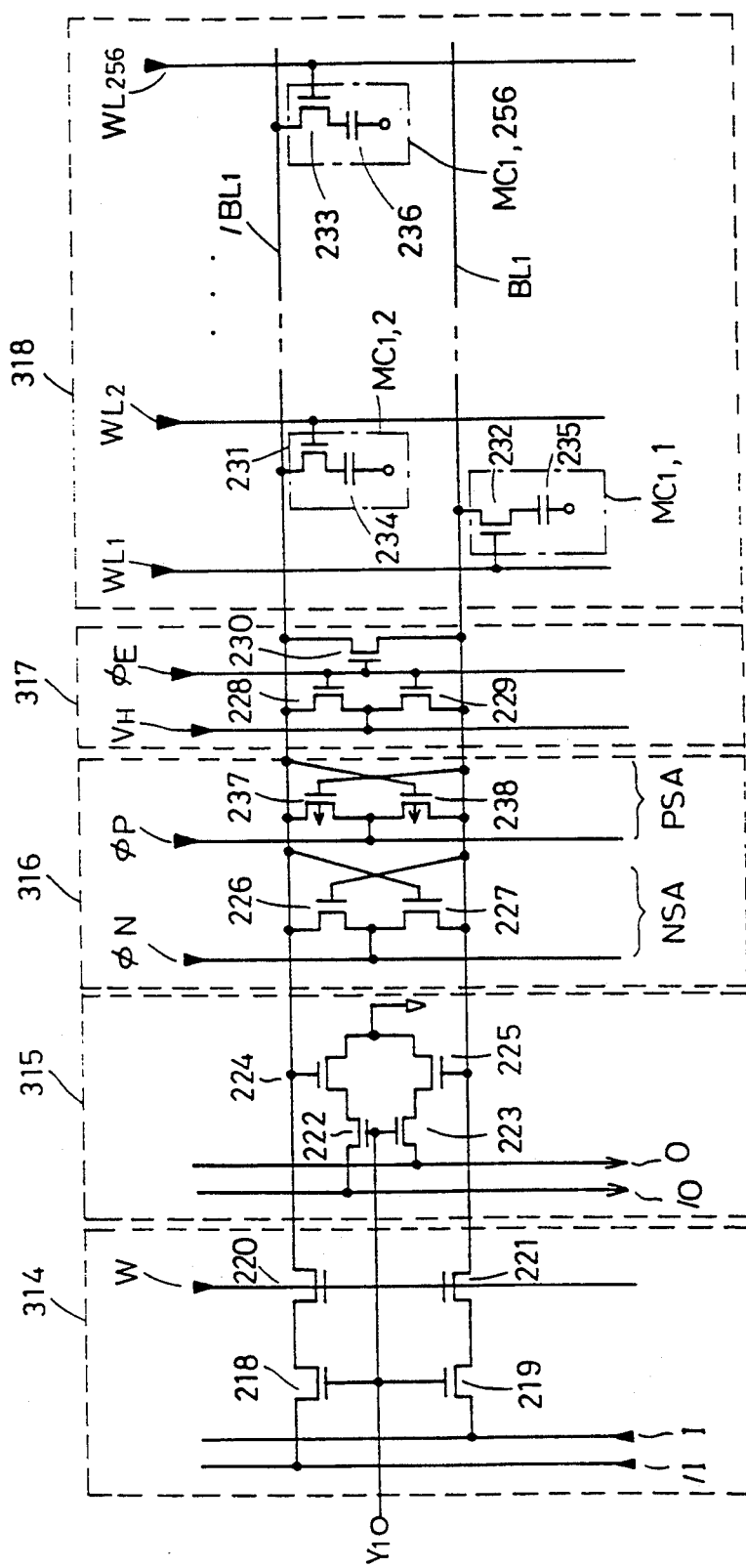
FIG. 32 shows a construction of a main part of the semiconductor memory device shown in FIG. 31.
Figure 33:
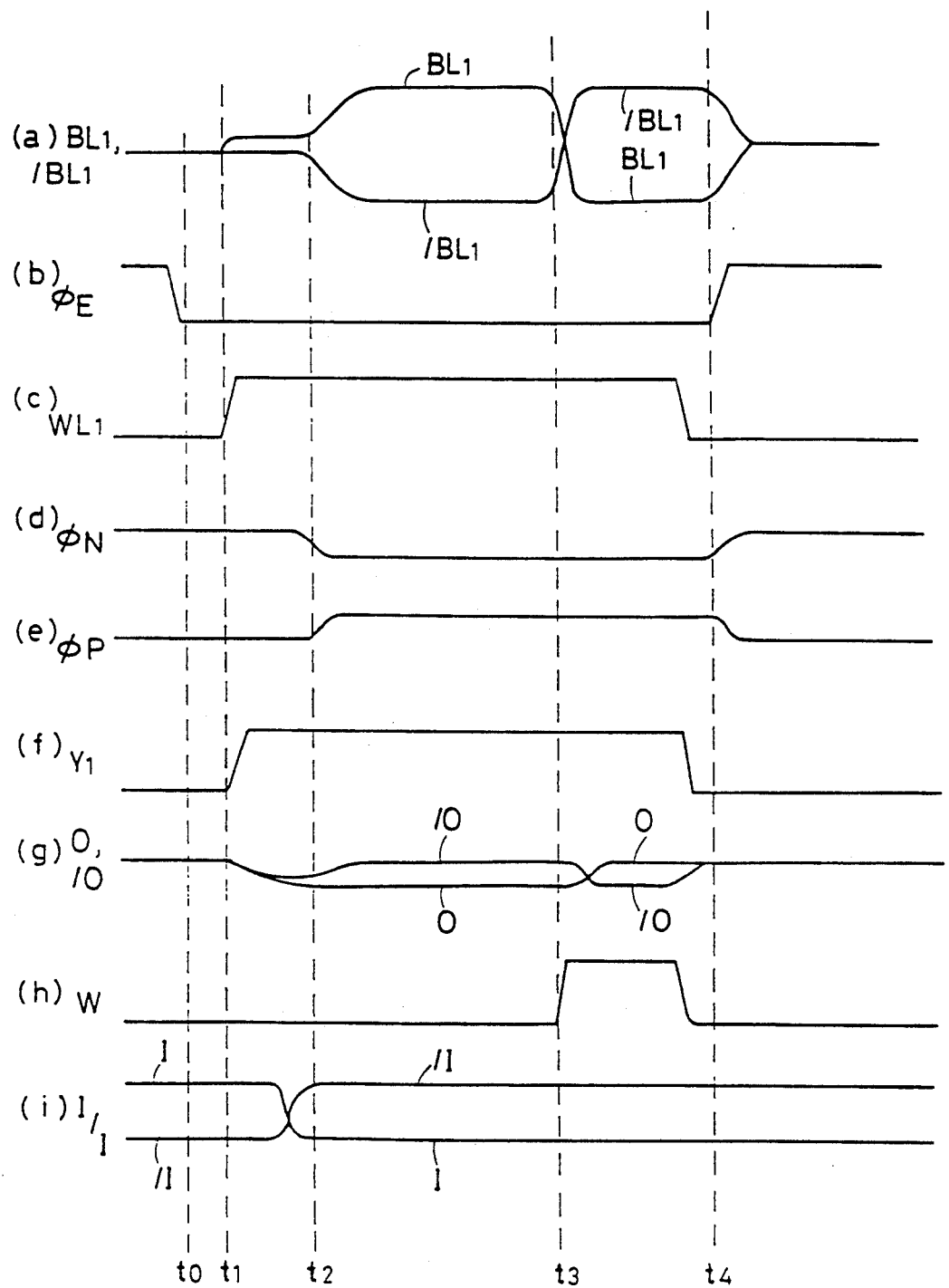
FIG. 33 is a signal waveform diagram showing an operation of the semiconductor memory device shown in FIGS. 31 and 32.

FIG. 27 shows a construction of a semiconductor memory device according to yet another embodiment of the invention. FIG. 27 shows only a circuit portion related to one pair of bit lines. In FIG. 27, memory cell array MA includes three memory blocks B#1, B#2 and B#3. The number of memory blocks included in memory cell array MA can be arbitrary. Memory block B#1 includes a pair of bit line BLa and /BLa, memory block B#2 includes a pair of bit line BLb and /BLb, and memory block B#3 includes a pair of bit lines BLc and /BLc.

Semiconductor memory device shown in FIG. 27 also includes a pair of main bit lines MBL and /MBL provided commonly to memory blocks B#1-B#3, and a sense IO gate 291 provided for main bit line pair MBL and /MBL. Bit line pairs BLa and /BLa, BLb and /BLb, and BLc and /BLc of memory blocks B#1-B#3 are connected through block selecting gates BSGa, BSGb and BSGc to main bit line pair MBL and /MBL.

Block selecting gates BSGa, BSGb and BSGc become conductive in response to block selecting signals φBS1, φBS2, and φBS3. Block selecting signals φBS1-φBS3 are generated by decoding, e.g., most or least significant two bits of a row address signal. Sense IO gate 291 has a construction similar to that shown in FIG. 2.

As the number of memory cells connected to one bit line pair (BL or /BL) increases, a stray capacitance related to one bit line increases, which provides an obstacle against a high-speed operation. In order to avoid such an obstacle, the following arrangement is taken. Bit lines may be divided into a plurality of blocks, and the bit lines of only one block are connected to the main bit lines. In this construction, the number of memory cells connected to the main bit lines MBL and /MBL decreases, so that a parasitic capacitance related to the main bit line (MBL or /MBL) can be reduced, which enables a high-speed operation.

The bit line hierarchical structure thus constructed and shown in FIG. 27 provides the semiconductor memory device having a further increased operation speed. The operation of the semiconductor memory device of the bit line hierarchical structure is similar to that of a partial activation type semiconductor memory device having a plurality of memory cell blocks.

The bit line hierarchical structure shown in FIG. 27 may be used in combination with the shared sense amplifier construction shown in FIGS. 20 through 26.

In the sense IO gate, the P-type sense amplifier may be used as the read gate in place of N-type amplifier circuit.

The technical advantages of the invention can be summarized as follows.

(1) By the provision of the separating transistor, the sense amplifier can be used also as the read gate. Therefore, a semiconductor memory device having a high operation speed can be implemented without increasing the chip area.

(2) The sense amplifier serves also as the read gate. Further, in the test mode, data of a plurality of memory cells are read to the internal data transmitting lines precharged to the predetermined potential, and, it is determined whether or not these memory cells include a defective memory cell in accordance with the potentials of the internal data transmitting lines. Therefore, the semiconductor memory device with a reduced test time can be implemented without increasing the chip area.

Although the present invention has been described and illustrated in detail, it is clearly understood that the same is by way of illustration and example only and is not to be taken by way of limitation, the spirit and scope of the present invention being limited only by the terms of the appended claims.

What is claimed is:

1. A semiconductor memory device, comprising:
   a memory cell array including a plurality of memory cells arranged in rows and columns;
   a plurality of pairs of bit lines provided corresponding to said columns of said array for having memory cells on a corresponding column coupled thereto;
   a plurality of first sense amplifier means provided for each respective pair of bit lines and for sensing and amplifying a potential difference between an associated pair of bit lines, each said first sense amplifier means including a sensing node for sensing a potential difference between the associated pair of bit lines and an output node for supplying an output indicative of thus sensed potential difference;
   data transfer bus for transferring data;
   a plurality of column select gates responsive to a column select signal for connecting said output node of the first sense amplifier means provided corresponding to a selected pair of bit lines designated by said column select signal to said data transfer bus; and
   operation control means responsive to an isolation control signal for disabling an amplification operation of each said first sense amplifier means while enabling a sensing operation of each said sense amplifier means.

2. A semiconductor memory device according to claim 1, wherein said operation control means includes a plurality of isolation elements, one provided between the sensing node and the output of each said sense amplifier means, for selectively isolating the associated sensing node from the associated output node in response to said isolation control signal.

3. A semiconductor memory device according to claim 1, wherein said sense amplifier means includes transistors having their gates and their one-conduction terminals cross-coupled, said their gates providing said sensing node and said one-conduction terminals providing said output node.

4. A semiconductor memory device according to claim 1, further including a plurality of second sense amplifier means provided corresponding to said plurality of pairs of bit lines and for sensing and amplifying a potential difference between an associated pair of bit lines, and wherein said operation control means enables the amplification operation of said first sense amplifier means after said second sense amplifier means are enabled for the sensing and amplifying operation.

5. A semiconductor memory device according to claim 1, wherein said operation control means includes means for enabling a slow speed amplification operation of each said first sense amplifier means.

6. A semiconductor memory device according to claim 1, further comprising means for disabling both the sensing and amplification operation of said first sense amplifier means and enabling a slow amplification and sensing operation of said first sense amplifier means.

7. A semiconductor memory device according to claim 1, further comprising a load means for precharging said data transfer bus at a predetermined potential and supplying a current flow to said data transfer bus in a mode of operation other than in a data writing mode of operation on which data is written into a selected memory cell.

8. A semiconductor memory device according to claim 7, wherein
   said data transfer bus includes a pair of data bus lines, and wherein
   said load means includes current supply means for providing the same current flow to said pair of data bus lines.

9. A semiconductor memory device according to claim 7, wherein said data transfer bus includes a pair of data lines, and wherein said load means includes a first transistor element including one conduction terminal connected to one of said pair of data bus lines and a control gate connected to the other of said pair of data bus lines, a second transistor element including one conduction terminal connected to the other of said pair of data bus lines, and a control gate connected to said one of said pair of data bus lines, a third transistor element provided in parallel with said first transistor element and including one conduction terminal and a control gate each connected to said one of said pair of data bus lines, and a fourth transistor element provided in parallel with said second transistor element and including one conduction terminal and a control gate each connected to said the other of said pair of data bus lines, and a fifth transistor element for connecting said first, second, third and fourth transistor elements to a first supply in response to a mode instructing signal indicating a mode other than data writing operation.

10. A semiconductor memory device according to claim 7, wherein
    said load means is disabled in said test mode of operation and a data write mode of operation.

11. A semiconductor memory device according to claim 1, further comprising:
    column selection control means for enabling all said plurality of column select gates to connect all said output nodes to said data transfer bus in response to a test mode indicating signal for simultaneous transmission of data of memory cells on a selected row;
    data setting means for precharging said data transfer bus to a potential level corresponding to a data which all the memory cells on the selected row are expected to store; and
    testing means responsive to a potential level on said data transfer bus and the test mode indicating signal for testing whether a defective memory cell is included in the memory cells on the selected row.

12. A semiconductor memory device according to claim 11, wherein
    said load means is disabled in said test mode of operation and a data write mode of operation.

13. A semiconductor memory device according to claim 1, wherein said memory cell array includes a plurality of groups of columns, and said data transfer bus includes a plurality of data lines provided corresponding to each respective group of columns, and wherein said memory device further includes a data bus selecting means responsive to a column group designating signal for selecting a corresponding data line out of said plurality of data lines, and input-/output means for receiving and supplying internal data from and to said data bus selecting means.

14. A semiconductor memory device according to claim 13, further comprising a test data input means responsive to a test mode indicating signal for generating test data onto said plurality of data lines.

15. A semiconductor memory device according to claim 14, further including means for disabling said data line selecting means to isolate each said data line from said input/output means in a test mode of operation.

16. A semiconductor memory device according to claim 13, wherein each said column line includes a pair of bit lines transmitting data complementary to each other, and each said data line includes a pair of signal lines transferring data complementary with each other, and wherein said semiconductor memory device further includes a data setting means responsive to a test mode indicating signal for setting said bus lines to a potential level corresponding to data which in turn is expected to be read out from a selected memory cell, control means responsive to a test mode instructing signal for enabling said column select means so as to select all the columns in said memory cell array intersecting a selected row, and a testing means receiving signals on said bus lines and in response to the test mode indicating signal for detecting whether a defective memory cell is included in the selected row.

17. A semiconductor memory device according to claim 16, wherein said testing means includes a plurality of gate means provided corresponding to each respective pair of signal lines for detecting the coincidence and noncoincidence of signals in logic on an associated pair of signal lines, and a detecting gate responsive to outputs of said plurality of gate means for generating an error signal indicating the existence of a defective memory cell when a gate means of said plurality of gate means indicates coincidence of the signals in logic.

18. A semiconductor memory device according to claim 1, wherein said memory cell array includes a plurality of blocks of rows and wherein said memory device further includes a plurality of column connecting means responsive to a row block designating signal for connecting an associated column in a designated block to the detection nodes of said first sense amplifier means.

19. A semiconductor memory device according to claim 18, wherein said plurality of connection means are arranged alternately on both ends of the column lines in a block of rows, so that alternate first sense amplifier means of said plurality of first sense amplifier means are shared between adjacent blocks.

20. A semiconductor memory device according to claim 19, further including a plurality of second sense amplifier means provided corresponding to each respective first sense amplifier means and between an associated connecting means and the detection node of a corresponding first sense amplifier means for detecting and amplifying a signal potential of the associated column line, so that alternate second sense amplifier means of said plurality of second sense amplifier means are shared between adjacent blocks of rows.

21. A semiconductor memory device according to claim 19, further including a plurality of second sense amplifier means provided for each respective column line in each said block of rows.

22. A semiconductor memory device according to claim 1, wherein each said column line includes a plurality of sub column lines each coupling a part of memory cells on a corresponding column, and a main column line connected to the detection node of an associated first sense amplifier means, and wherein said semiconductor memory device further includes a plurality of connection means responsive to a sub column group designating signal for connecting a designated sub column line to an associated main column line.

23. A semiconductor memory device, comprising:

a memory cell array including a plurality of memory cells arranged in rows and columns;

a plurality of pairs of bit lines provided corresponding to said columns of said array for having memory cells on a corresponding column coupled thereto;

data transfer bus for transferring data;

shared circuit means between respective pairs of bit lines and said data transfer bus for sensing and amplifying a potential different between an associated pair of bit lines;

a plurality of column select gates responsive to a column select signal for connecting an output of shared circuit means provided corresponding to a selected pair of bit lines designated by said column select signal to said data transfer bus; and control means for controlling said shared circuit means selectively for amplification and sensing operation thereof, wherein, in the amplification operation thereof a potential difference between an associated pair of bit lines is amplified with a signal on the output fedback to the bit lines, and in the sensing operation thereof, a signal on the associated pair of bit lines is supplied to the output with the amplification operation thereof inhibited.

24. A semiconductor memory device, comprising:

a memory cell array including a plurality of memory cells arranged in rows and columns;

a plurality of pairs of bit lines provided corresponding to said columns of said array for having memory cells on a corresponding column coupled thereto;

a plurality of first sense amplifier means provided for said plurality of pairs of bit lines and for sensing and amplifying a potential difference on an associated pair of bit lines;

a plurality of second sense amplifier means provided corresponding to respective pairs of bit lines and for selectively sensing and amplifying a potential difference between an associated pair of bit lines and supplying an output indicative of a thus sensed potential difference;

data transfer bus for transferring data; and a plurality of column select gates responsive to a column select signal for connecting an output of a second sense amplifier means provided corresponding to a select pair of bit lines designated by said column select signal to said data transfer bus; and circuit means responsive to a control signal for reconfiguring each said second sense amplifier means to disable amplification operation thereof and enable sensing operation thereof.

25. A semiconductor memory device, comprising:

a plurality of memory cells arranged in rows and columns;

a plurality of pairs of bit lines arranged in columns, each said pair of bit lines having connected thereto memory cells arranged in a corresponding column;

a plurality of data transfer means arranged in columns, each data transfer means having a first connecting node, a second connecting node, a potential node, a first controlling node connected to one bit line of a corresponding pair of bit lines, and a second controlling node connected to another bit line of the corresponding pair of bit lines;

each said data transfer means including: (a) a first transistor connected between the first connecting node and the first controlling node and having a control electrode receiving a control signal, (b) a second transistor connected between said second connecting node and said second controlling node and having a control electrode receiving said control signal, (c) a third transistor connected between said first connecting node and said potential node, and having a control electrode connected to said second controlling node, and (d) a fourth transistor connected between said second connecting node and said potential node, and having a control electrode connected to said first controlling node;

a pair of data transfer lines for transferring data;

a plurality of data transfer gate means arranged in columns each said data transfer gate means having (a) a first transfer transistor connected between one transfer data line of said pair of transfer data lines and the first connecting node of a corresponding data transfer means and having a control electrode receiving a column select signal, and (b) a second transfer transistor connected between another data transfer line of said pair of data transfer lines and the second connecting node of the corresponding data transfer means and having a control electrode receiving said column select signal.

26. A semiconductor memory device according to claim 25, wherein said third and fourth transistors each comprise an n channel insulated gate type field effect transistor, and said potential node is coupled to receive a ground potential.

27. The semiconductor memory device according to claim 26, further comprising a plurality of sense amplifier means provided corresponding to said plurality of pairs of bit lines, each said sense amplifier means including (a) a first p channel insulated gate type field effect transistor having a control gate connected to one bit line of a corresponding pair of bit lines, one conduction terminal connected to another bit line of the corresponding pair of bit lines, and another conduction terminal connected to receive a sense amplifier drive signal, and (b) a second p channel insulated gate type field effect transistor having one conduction terminal connected to said one bit line, a control gate connected to said another bit line, and another conduction terminal connected to receive said sense amplifier drive signal.

28. A semiconductor memory device according to claim 25, wherein said third and fourth transistors each comprise an n channel insulated gate type transistor, and said potential node is coupled to receive a sense amplifier activating signal whose falling rate is controlled to be at a first rate to enhance the sensitivity of a sense amplifier formed by said third and fourth transistors when said control signal turns on said first and second transistors.

29. A semiconductor memory device according to claim 25, further comprising means for generating said control signal at a first level to turn off said first and second transistors when said column select signal is generated in a data reading operation.

30. A semiconductor memory device according to claim 25, further comprising:

writing means for transferring and holding an expect data onto said pair of data transfer lines in response to a test data writing instructing signal, said expect data indicating data expected to be read out from selected memory cells;

means for generating column select signals to turn on all the data transfer gate means to couple the first and second connecting node to said pair of data transfer lines;

detecting means for detecting coincidence and non-coincidence between logic levels of potentials on said pair of data transfer lines in response to a test mode instructing signal; and means responsive to said detecting means for generating a signal indicating whether there is a defective memory cell in the selected memory cells.

31. A method of testing a semiconductor memory device including a plurality of memory cells arranged in rows and columns, comprising the steps of:

setting a data transfer bus to a potential level corresponding to data which in turn is expected to be read out from a selected memory cell;

selecting a row of memory cells of said plurality of memory cells;

reading out data of memory cells of thus selected row. simultaneously onto said data transfer bus; and detecting whether a defective memory cell is included in the memory cells of said thus selected row in response to the signal potential on said data transfer bus.

32. A method according to claim 31, further including the steps of transferring a test data onto said data transfer bus;

selecting a row of memory cells in said plurality of memory cells in said plurality of memory cells; and simultaneously writing said test data into the memory cells on said thus selected row.

33. A method according to claim 32, wherein said semiconductor memory device includes a plurality of pairs of bit lines corresponding to each respective column, and a plurality of sense amplifiers provided for said plurality of pairs of bit lines and each including transistor elements having their respective gates and their respective one conduction terminals cross-coupled and wherein said step of reading out include the step of connecting another conduction terminals of said transistor elements to a first supply potential while isolating one conduction terminal from the gate in each said transistor element, and connecting said one conduction terminal of each said transistor element to said data transfer bus.

* * * * *